US 6,515,218 B1

(12) United States Patent
Shimizu et al.

(10) Patent No.: US 6,515,218 B1
(45) Date of Patent: Feb. 4, 2003

(54) PHOTOVOLTAIC ELEMENT, PROCESS FOR THE PRODUCTION THEREOF, METHOD FOR REMOVING A COVER PORTION OF A COVERED WIRE, AND METHOD FOR JOINING A COVERED WIRE AND A CONDUCTOR

(75) Inventors: Koichi Shimizu, Kyotanabe (JP); Tsutomu Murakami, Nara (JP); Takehito Yoshino, Hiratsuka (JP); Koji Tsuzuki, Ikoma (JP); Yoshifumi Takeyama, Kyoto-fu (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/717,238

(22) Filed: Nov. 22, 2000

(30) Foreign Application Priority Data

Nov. 22, 1999 (JP) .............................. 11-331212
Jun. 1, 2000 (JP) ...................................... 2000-163907
Nov. 20, 2000 (JP) ...................................... 2000-353416

(51) Int. Cl.[7] ...................... H01L 31/05; B23K 26/20
(52) U.S. Cl. .................. 136/256; 136/244; 438/98;
438/56; 438/64; 438/66; 219/121.63; 219/121.64;
219/121.68; 219/121.69
(58) Field of Search ............................... 136/244, 256;
438/98, 56, 64, 66; 219/121.63, 121.64,
121.68, 121.69

(56) References Cited

U.S. PATENT DOCUMENTS 4,697,061 A * 9/1987 Spater et al. ........... 219/121.64
4,761,535 A * 8/1988 Lawson .................. 219/121.68
5,759,291 A * 6/1998 Ichinose et al. ............ 136/256
5,942,048 A 8/1999 Fujisaki et al. ............ 136/256
6,008,451 A * 12/1999 Ichinose et al. ............ 136/256
6,051,778 A 4/2000 Ichinose et al. ............ 136/256
6,184,457 B1 * 2/2001 Tsuzuki et al. ............ 136/256
6,316,832 B1 * 11/2001 Tsuzuki et al. ............ 257/747

FOREIGN PATENT DOCUMENTS

| JP | 7-7825 A | * | 1/1995 |
| JP | 9-36395 | | 2/1997 |
| JP | 9-174263 | | 7/1997 |
| JP | 9-174263 A | * | 7/1997 |
| JP | 11-186572 A | * | 7/1999 |

* cited by examiner

Primary Examiner—Alan Diamond
(74) Attorney, Agent, or Firm—Fitzpatrick, Cella, Harper & Scinto

(57) ABSTRACT

A photovoltaic element having a wire disposed on a surface of the photovoltaic element for outputting a power generated by the photovoltaic element, and an electrode electrically joined with the wire while forming a joining portion, wherein the joining portion of the wire and the electrode has at least a first joining portion and a second joining portion which is adjacent to the first joining portion, and the second joining portion has an elasticity which is greater than that of the first joining portion. A process for the production of the photovoltaic element. A method for forming an electrical continuity between a covered wire and a conductor, including a method of removing a cover portion of the covered wire and a method of joining the covered wire with the conductor.

32 Claims, 19 Drawing Sheets

F I G. 4(a)
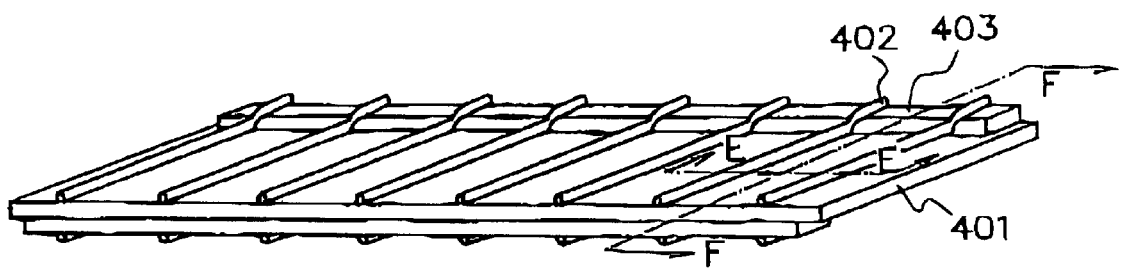
F I G. 4(b)
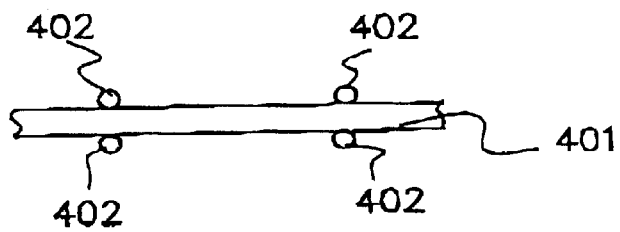
F I G. 4(c)
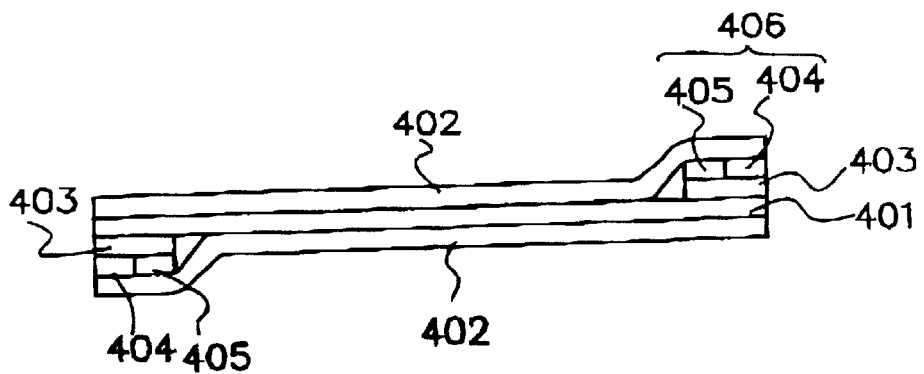

F I G. 11
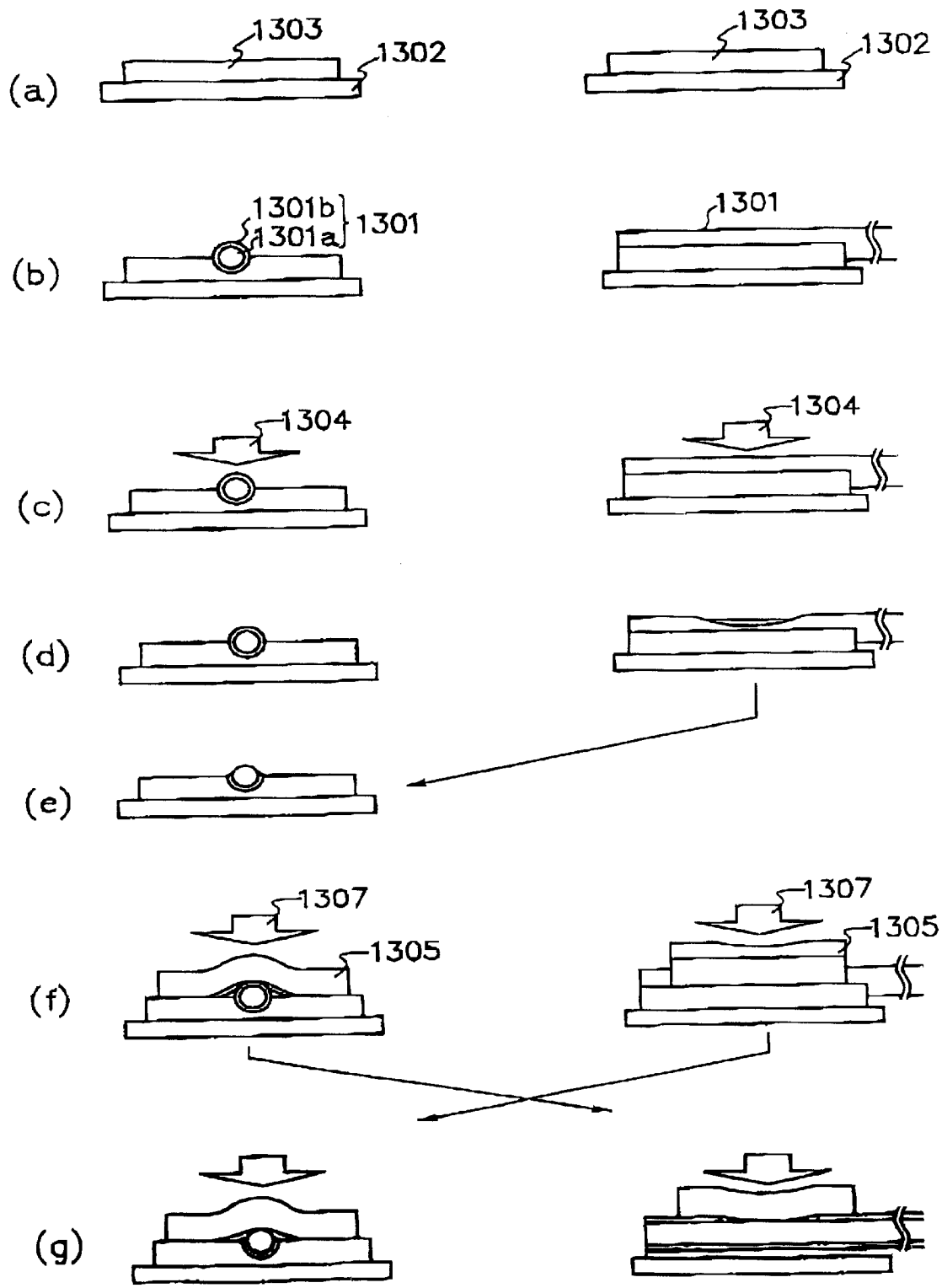

PHOTOVOLTAIC ELEMENT, PROCESS FOR THE PRODUCTION THEREOF, METHOD FOR REMOVING A COVER PORTION OF A COVERED WIRE, AND METHOD FOR JOINING A COVERED WIRE AND A CONDUCTOR

BACKGROUND OF THE INVENTION

1. Field of the Invention

The present invention relates to a photovoltaic element including a solar cell, a process for producing said photovoltaic element, a method for removing a cover portion of a covered wire, and a method for joining a covered wire and a conductor. More particularly, the present invention relates to a photovoltaic element having an improved electrode structure, and a process for producing said photovoltaic element.

2. Related Background Art

In recent years, public attention has been focusing on a sunlight power generation system. Along with this, there is an increased demand for providing a large area photovoltaic element at a reasonable cost which enables one to establish a desirable sunlight power generation system at a reasonable cost. In general, a photovoltaic element has a photovoltaic layer (comprising a photoelectric conversion semiconductor layer), and in the photovoltaic element, the resistivity of a charge in the photovoltaic layer against its migration in an elemental face direction is large. Because of this, in the case of a large area photovoltaic element, in order to diminish a joule loss due to the migration of the charge in the elemental face direction, an electrode comprising a metal (this electrode will be hereinafter referred to as metal electrode) which has high conductivity is provided on the surface of the photovoltaic element.

In the case where the metal electrode is provided on the side where light is impinged, because the metal electrode is generally opaque, it is formed such that it does not shut out incident light as much as possible. On the other hand, in the case where the metal electrode is provided on the side where no light is impinged, it may be formed on the entire surface involved but in view of reducing the cost, it is often formed at a minimum necessary portion thereof.

Now, for instance as shown in FIGS. 7(a) and 7(b) it is known that an electrode 700 is formed in a comb-shaped form on a light incident side face or a back side face of a photovoltaic element (not shown). FIG. 7(a) is a schematic plan view of said electrode, and FIG. 7(b) is a schematic cross-sectional view taken along the line H–H' in FIG. 7(a).

In the case where the electrode 700 is formed on the light incident side face, when the electrode 700 comprises a comb-shaped electrode comprising a plurality of wire electrodes being arranged at a prescribed equal interval as shown in FIG. 7(a), it is possible to effectively collect charges while restraining the joule loss. In the case where the electrode is formed on the back side face, it can be formed at a low cost because it can be formed using an electrode-forming material in a small amount. However, the formation of such electrode is generally conducted by a method wherein an electrically conductive resin material 702 is screen-printed on the surface of the photovoltaic element, followed by subjecting to sintering treatment, and a solder paste 701 is screen-printed thereon, followed by subjecting to reflow soldering. However, in this method, it is difficult to thicken the thickness of the electrode, and therefore, in the case where the photovoltaic element involved is of a larger area, it is difficult to attain an effect of sufficiently diminishing the joule loss.

In order to improve this situation, Japanese Unexamined Patent Publication No. 36395/1997 discloses a configuration for a comb-shaped electrode as shown in FIGS. 8(a) and 8(b) in that a core wire 801 whose thickness being capable of being thinned and an electrode 802 are used. FIG. 8(a) is a schematic plan view of said comb-shaped electrode, and FIG. 8(b) is a schematic cross-sectional view taken along the line I–I' in FIG. 8(a). Particularly, the comb-shaped electrode shown in FIGS. 8(a) and 8(b) comprises a covered wire comprising a metal core wire 801 covered by an electrically conductive resin material 803 which is bonded onto the surface of a photovoltaic element (not shown) by way of thermocompression bonding. And in said publication, there is described that the covered wire is joined with an electrode 802 through a metal layer comprising a solder or the like or an electrically conductive resin material.

Incidentally, for the conventional comb-shaped electrode in which the core wire and the electrode having such configuration as above described, it is difficult to make the comb-shaped electrode to have a sufficient resistance to stress. For instance, in the case where the core wire is joined with the electrode only through a metal layer by way soldering, although the joining may be conducted in a low resistance state, the joined portion is poor in flexibility and therefore, there is a problem in that the stress added to the core wire is converged to the joint of the joining portion of the core wire, where the core wire is liable to readily fracture at the joint thereof. In the case of a solar cell module in which such photovoltaic element is used, there is a tendency in that the above situation lead to entailing such problems as will be described in the following. That is, due to the stress remained at the core wire and a load applied onto the solar cell module by virtue of wind or snow, the solar cell module is flexed, where stress is eventually applied to the core wire and further stress is applied to the core wire when the temperature of the photovoltaic element is changed and as a result, the core wire is ruptured at the joint of thereof, resulting in a decrease in the energy conversion efficiency (the photoelectric conversion efficiency) of the solar cell module.

Separately, in the case where the core wire is joined with the electrode only through the electrically conductive resin material which comprises a composition comprising electrically conductive fine particles dispersed in a given resin, a current flow passage comprising said electrically conductive fine particles is formed between the core wire and the electrode, where gaps among the electrically conductive fine particles are filled with the resin to retain the current flow passage. In this case, it is also difficult to make the comb-shaped electrode to have a sufficient resistance to stress. That is, when it is intended to increase the current flow passage so as to lower the resistance, it is necessary to increase the content ratio of the electrically conductive fine particles in the electrically conductive resin material. In this case, the content ratio of the resin which serves to retain the current flow passage is decreased and as a result, the flexibility of the joining portion is diminished, where a sufficient resistance to stress cannot be attained. Therefore, there is also a tendency in that such problems as above described are entailed.

In the following, description will be made of a covered wire.

The covered wire means a composite comprising a core wire covered by a coating material. There are known various covered wires such configured, which are used in various fields. For instance there are known covered wires whose core wire comprising a wire for transmitting light such as an optical fiber which are used in the field of optical instrument; covered wires whose core wire comprising a wire for transmitting heat which are used in the field of refrigeration and also in the field of temperature measurement; and covered wires whose core wire comprising a wire for transmitting electromagnetic field which are used in the field of electronics. Particularly, in the field of solar cells, it is a common technique that a covered wire comprising an electrically conductive core wire covered by an electrically conductive resin material is disposed on the surface of photovoltaic element in order to collect power generated by the photovoltaic element.

The cover of the covered wire is generally used for the purpose of preventing a thing to be transmitted by the core wire from leaking to the outside or for the purpose of releasing said thing while adjusting the quantity thereof. However, there is a case in that the covered wire is preferred to be made such that it has an exposed portion with no coat. As such case, there can be mentioned, for example, a case in that a covered wire whose core wire comprising an optical fiber is made to have an exposed portion with no coat so that light leaked through said exposed portion can be received by a detector, and a case in that a covered wire whose core wire comprising a copper wire is made to have an exposed portion with no coat and said exposed portion is used as a switch of making ON or OFF by attaching a connector to or detaching said connector from said exposed portion.

The formation of a covered wire having such exposed portion can be conducted by a method of forming a covering coat on a given core wire except for a prescribed portion of said core wire. However, said covered wire can be readily formed by a method of forming a covering coat over the entire surface of a given core wire and removing a prescribed portion of the covering coat on the core wire by radiating energy beam such as laser beam to establish an exposed portion at said covered wire.

Japanese Unexamined Patent Publication No. 7825/1995 (hereinafter referred to as document 1) disclose a technique in that a covered wire comprising a gold wire or a gold-plated wire as a core wire covered by a covering material comprising an insulating resin material is extended in the air and excimer laser beam is radiated to a prescribed portion of the covered wire to remove the corresponding portion of the cover of the covered wire to make the covered wire have an exposed wire potion.

Japanese Unexamined Patent Publication No. 174263/1997 (hereinafter referred to as document 2) discloses a technique in that YAG laser beam is radiated to a prescribed portion of a covered wire whose cover comprising an insulating material which is wound on a terminal to remove the corresponding portion of the cover of the covered wire to make the covered wire have an wire exposed portion.

Incidentally, there are known various structures comprising a covered wire having a portion with no cover (an exposed wire portion) and a separate component (capable of transmitting a thing which is transmitted by the core wire of the covered wire) joined with said exposed wire portion of the covered wire, which are used in various fields. Particularly, in the field of electronics, a covered wire comprising a core wire covered by a given covering material has been widely used. And it is a common technique that a prescribed portion of the cover of the covered wire is removed to make the covered wire have an exposed wire portion, and said exposed wire portion of the covered wire is joined with another electrode. In this case, the thing which is transmitted from the core wire to said another electrode is electricity. For instance, in document 1, there is described that the exposed wire portion of the covered wire is connected to other electronics component by way of wire-bonding. In document 2, there is described that a solder is supplied to the exposed wire portion of the covered wire to join the covered wire with the terminal.

In the prior art, there are such shortcomings as will be described below, in terms of insufficiency in removal of the cover of a covered wire.

In the technique described in document 1, the covered wire is extended in the air and excimer laser beam is radiated to a prescribed portion of the covered wire as previously described. In this case, there is a tendency in that freedom occurs at the position of the covered wire, where when the laser beam is radiated, an action for the covered wire to escape from the layer exerts. This situation makes it difficult to sufficiently remove a prescribed portion of the cover of the covered wire. In the technique described in document 2, YAG laser beam is radiated to a prescribed portion of the covered wire would on the terminal as previously described. In this case, there is a tendency in that the covered wire absorbs energy of the laser beam to thermally expand, where the covered wire wound on the terminal is loosened to occur freedom at the position of the covered wire and when the laser beam is radiated, an action for the covered wire to escape from the layer exerts. This situation makes it difficult to sufficiently remove a prescribed portion of the cover of the covered wire.

In addition according to such technique in the prior art, it is difficult to readily join the cover-removed core wire portion (the exposed core wire portion) of the covered wire with the conductor (the electrode) so that the joining between the two members is sufficient in terms of the reliability.

Now, in order to attain highly reliable joining between given two different members by a joining manner by means of brazing using a solder or the like, a joining manner using an adhesive such as an electrically conductive paste, a joining manner by means of welding, or a joining manner by means of ultrasonic bonding, it is required that the two members are brought to adequately come closer to each other.

In the technique described in document 1, it is difficult that the cover-removed portion of the covered wire is made to be in contact with other electronics component. When the laser beam is radiated to the covered wire simply from one direction, a face of the covered wire which is opposed to the face thereof to which the laser beam is radiated is shaded from the radiation of the laser beam, where the covering material of said face tends to remain without being removed, and thus, cover removal is substantially performed only for the face to which the laser beam is radiated. In this connection, in order to contact the cover-removed portion of the covered wire with the electronics component, it is necessary to adopt a covered wire-handling mechanism that the face of the exposed core wire which is provided as a result of a portion of the cover situated at said face being removed by the radiation of the laser bean can be precisely contacted with the electronics component. However, the covered wire is in a fine line form in many cases and is, therefore, liable to readily twist or bend. In addition, the cover-removed portion of the covered wire is of a tiny area. Because of this, such handling mechanism is difficult to be realized. In this respect, in document 1, there is adopted a mechanism that without simply radiating the laser beam to the covered wire, cover removal is conducted for all around the covered wire. Particularly, there is adopted a mechanism that using a concave mirror, the laser beam is radiated also to the face of the covered wire which is opposed to the face thereof to which the laser beam is directly radiated. However, for this mechanism, there is a shortcoming in that when the concave mirror has staining or the like, the laser beam-radiating processing becomes unstable, there sufficient cover removal cannot be performed as desired.

In the technique described in document 2, because the covered wire is wound on the electronics component with which the covered wire is joined, it is difficult to irradiate the laser beam to a face of the covered wire which is faced to the electronics component as desired and therefore, it is difficult to sufficiently remove a portion of the cover situated at said face. In this connection, the cover of the covered wire is partially present between the cover-removed portion (the exposed core wire potion) and the electronics component, where a residual portion of the cover is present such that it is sandwiched between the two member to be joined with each other, and because of this, the two members cannot be sufficiently connected with each other. In this connection, in the case of the joining method wherein an adhesive such as a solder or an electrically conductive paste is made to present between the exposed core wire portion of the covered wire and the electronics component, it is necessary to form a conduction path by the solder or the electrically conductive paste so as to detour the residue of the cover present between the exposed core wire and the electronics component. The joining thus established is liable to be poor in terms of the reliability. Besides, in the case where the joining method of directly joining the exposed core wire portion of the covered wire with the electronics component by way of welding or ultrasonic bonding is adopted, the joining between the two members cannot be performed as desired because the residue of the cover is present between the two members.

SUMMARY OF THE INVENTION

In view of the foregoing situation in the prior art, the present invention makes it a first object to provide a photovoltaic element having an highly reliable electrode comprising a covered wire having a core wire which makes it possible to desirably maintain a good energy conversion efficiency (photoelectric conversion efficiency) of a solar cell module formed using said photovoltaic element, and a process for producing said photovoltaic element.

A typical embodiment of the photovoltaic element provided according to the present invention comprises a photovoltaic element, a core wire disposed on the surface of said photovoltaic element for outputting a power generated by said photovoltaic element, and an electrode electrically joined with said core wire while forming a joining portion, wherein said joining portion of said core wire and said electrode has at least a first joining portion and a second joining portion which is adjacent to said first joining portion, and said second joining portion has an elasticity which is greater than that of said first joining portion.

The process according to the present invention includes the following two embodiments.

A first embodiment is a process for producing a photovoltaic element comprising a photovoltaic element, a wire disposed on the surface of said photovoltaic element for outputting a power generated by said photovoltaic element, and an electrode electrically joined with said wire, wherein at least two different joining portions having a different elasticity are formed between said wire and said electrode.

A second embodiment is a process for producing a photovoltaic element comprising a photovoltaic element, a covered wire whose core comprising a wire disposed on the surface of said photovoltaic element for outputting a power generated by said photovoltaic element, and an electrode electrically joined with said wire of said covered wire, said process comprising the steps of (a) removing part of the cover of said covered wire to form a cover-free portion at said covered wire, (b) fixing said covered wire on the surface of said photovoltaic element, and (c) joining said wire of said covered wire and said electrode each other at a position (i) of said cover-free portion of said covered wire and at a desired position (i) of the remaining portion of said covered wire.

Of the two jointing portions formed between the covered wire and the electrode, it is preferred to make such that the joining portion formed at the position (ii) has an elasticity which is greater than that of the joining portion formed at the position (i). Further, it is preferred that the wire is covered by a covering material comprising an electrically conductive resin material, the wire and the surface of the photovoltaic element are electrically connected through said electrically conductive resin material, and a portion of said electrically conductive resin material which is situated between the wire and the electrode functions as the foregoing second joining portion. It is also preferred that prior to conducting the step (a) of removing part of the cover of the covered wire, the step (b) of fixing the covered wire on the surface of the photovoltaic element is conducted. Further, it is preferred that the step of removing part of the cover of the covered wire is conducted by means of radiation of laser beam.

In addition, it is also preferred that the foregoing first joining portion comprises a metal and the foregoing second joining portion comprises an electrically conductive resin material.

The present invention makes it a second object to attain the followings.

(1) An adequate cover-removing method which can be desirably adopted in a process of removing a cover portion of a covered wire having a core wire by radiation of energy beam, said method being capable of performing cover removal of the covered wire while preventing the covered wire from being positionally deviated.

(2) An adequate cover-removing method which can be desirably adopted in a process of removing a cover portion of a covered wire having a core wire by radiation of energy beam and joining a conductor (an electrode) with the cover-removed portion of said covered wire, said method being capable of readily and surely contacting the core wire of the covered wire with the conductor (the electrode).

The cover-removing method according to the present invention includes the following embodiments.

A first embodiment is a cover-removing method comprising the steps of fixing at least part of a covered wire having a core wire onto a substrate though a fixing member and radiating energy beam to at least part of said fixed covered wire to remove a desired cover portion of the covered wire.

A second embodiment is a cover-removing method comprising the steps of fixing at least part of a covered wire having a core wire onto a substrate though a fixing member, radiating energy beam to at least part of said fixed covered wire to remove a desired cover portion of the covered wire, and joining a conductor (an electrode) with said cover-removed portion of the covered wire and also with a cover portion of the covered wire which is adjacent to said cover-removed portion.

It is preferred for the fixing member to comprise an adhesive material or a double-coated adhesive tape. It is preferred that the fixing member has an energy absorption factor against the energy beam which has a ratio of 0.0001 to 0.9999 versus that of the cover of the covered wire.

It is possible that the substrate comprises a photovoltaic element, the covered wire comprises a collecting electrode of said photovoltaic element, and the conductor comprises a bus bar electrode.

BRIEF DESCRIPTION OF THE DRAWINGS

FIG. 4(a) is a schematic slant view illustrating the structure of an example of a photovoltaic element of the present invention.

FIG. 4(b) is a schematic cross-sectional view, taken along the line E–E' in FIG. 4(a).

FIG. 4(c) is a schematic cross-sectional view, taken along the line F–F' in FIG. 4(a).

FIG. 5(a) is a schematic view showing a state in that a stress is effected in a direction of pressing or pulling in parallel to a wire, and FIG. 5(b) is a schematic view showing a state in that a stress is effected in a direction perpendicular to a wire.

FIG. 11 is a schematic view for explaining another method comprising a cover-removing a step of removing a cover portion of a covered wire and a step of joining said covered wire and a conductor (an electrode) in the present invention.

DERAILED DESCRIPTION OF THE INVENTION AND PREFERRED EMBODIMENTS

Figure 1A:
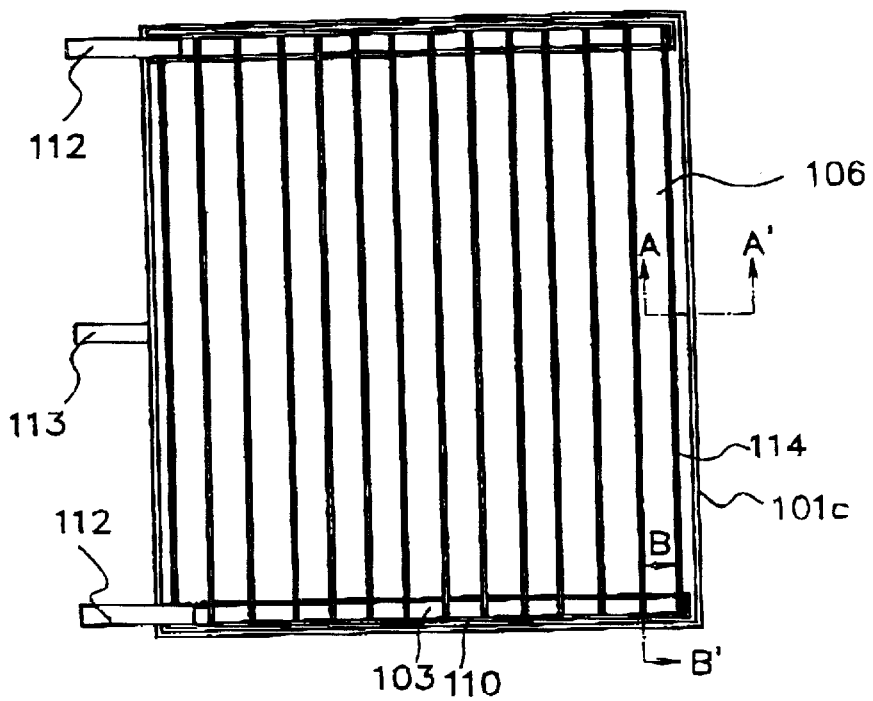
FIG. 1(a) is a schematic top view of an example of a photovoltaic element of the present invention.

The present invention is to solve the foregoing problems found in the prior art and to attain the above described objects.

The present invention includes a first aspect and a second aspect which will be described below.

The first aspect of the present invention is to provides an improved photovoltaic element and a process for producing said photovoltaic element.

A typical embodiment of the photovoltaic element in the first aspect of the present invention comprises a photovoltaic element, a wire disposed on the surface of said photovoltaic element for outputting a power generated by said photovoltaic element, and an electrode electrically joined with said wire while forming a joining portion, wherein said joining portion of said wire and said electrode has at least a first joining portion and a second joining portion which is adjacent to said first joining portion, and said second joining portion has an elasticity which is greater than that of said first joining portion.

The process in the first aspect of the present invention includes the following two embodiments.

A first embodiment is a process for producing a photovoltaic element comprising a photovoltaic element, a wire disposed on the surface of said photovoltaic element for outputting a power generated by said photovoltaic element, and an electrode electrically joined with said wire, wherein at least two different joining portions having a different elasticity are formed between said wire and said electrode.

A second embodiment is a process for producing a photovoltaic element comprising a photovoltaic element, a covered wire whose core comprising a wire (this wire will be referred to as core wire) disposed on the surface of said photovoltaic element for outputting a power generated by said photovoltaic element, and an electrode electrically joined with said core wire of said covered wire, said process comprising the steps of (a) removing part of the cover of said covered wire to form a cover-free portion at said covered wire, (b) fixing said covered wire on the surface of said photovoltaic element, and (c) joining said core wire of sad covered wire and said electrode with each other at a position (i) of said cover-free portion of said covered wire and at a desired position (ii) of the remaining portion of said covered wire.

The second aspect of the present invention is to provide a method for forming an electrical continuity between a covered wire and a conductor, including a method of removing a cover portion of said covered wire and a method of joining said covered wire with said conductor.

The second aspect of the present invention includes the following two embodiments.

A first embodiment comprises the steps of fixing at least part of a covered wire having a core wire onto a substrate though a fixing member and radiating energy beam to at least part of said fixed covered wire to remove a desired cover portion of the covered wire.

A second embodiment comprises the steps of fixing at least part of a covered wire having a core wire onto a substrate though a fixing member, radiating energy beam to at least part of said fixed covered wire to remove a desired cover portion of the covered wire, and joining a conductor (an electrode) with said cover-removed portion of the covered wire and also with a cover portion of the covered wire which is adjacent to said cover-removed portion.

In the following, the present invention will be detailed.

FIRST ASPECT

A photovoltaic element and a process for producing said photovoltaic element in the present invention will be embodied by illustrating preferred embodiments. It should be understood that the present invention is not restricted by these embodiments.

FIG. 4(a) is a schematic slant view illustrating the structure of an example of a photovoltaic element of the present invention. FIG. 4(b) is a schematic cross-sectional view, taken along the line E–E' in FIG. 4(a)–FIG. 4(c) is a schematic cross-sectional view, taken along the line F–F' in FIG. 4(a).

The photovoltaic element shown in FIGS. 4(a) to 4(c) comprises at least a photovoltaic element 401, a wire 402, an electrode 403, an electrically joining portion 404 (a first joining portion) of the wire 402 ad the electrode 403, and a reinforcing portion 405 (a second joining portion in which the wire 402 and the electrode 403 which are situated while being adjacent to the joining portion 404 are joined through, for instance, an electrically conductive resin material.

In the following, description will be made of each of the components show in FIGS. 4(a) to 4(c).
PHOTOVOLTAIC ELEMENT 401

There is no particular limitation for the photovoltaic element 401 used in the present invention. The photovoltaic element 401 comprises at least a photovoltaic layer (a photoelectric conversion layer). However, if required, the photovoltaic layer may be formed on a retaining substrate. The photovoltaic layer may comprise a silicon semiconductor material, a compound semiconductor material, or the like. The silicon semiconductor material can include a single-crystalline silicon semiconductor material, a polycrystalline silicon semiconductor material, an amorphous silicon semiconductor material, and a microcrystalline semiconductor material. The photovoltaic layer may have an appropriate semiconductor junction structure. Such semiconductor junction structure can include, for example a p-n junction structure, a p-i-n junction structure, a Schottky type junction structure, and the like.

In the case where the photovoltaic layer comprises a thin semiconductor film, the photovoltaic layer may be formed on a retaining substrate. The substrate may comprise, for example, a glass plate in the case where the substrate is provided on the light receiving face side. In the case where the substrate is provided on the non-light receiving face side, the substrate may comprise, for example, a metal substrate.

If necessary, under the photovoltaic layer, it is possible to provide a back reflector capable of reflecting light which passes through the photovoltaic layer. The back reflector may comprise, for example, a two-layered structure comprising a zinc oxide layer formed on a metal layer comprising Al or Ag which has a high light reflectance. Further, not only the photovoltaic layer but also the back reflector may have a surface treated so as to have irregularities.

In ay case, upon producing the photovoltaic element or upon producing a solar cell module comprising the photovoltaic element, a certain stress is unavoidably applied to the wire provided on the photovoltaic element. Besides, in the case where said solar cell module is installed under external environment, when the solar cell module is bent due to wind or snow, a certain stress is also applied to the wire provided on the photovoltaic element. The present invention is aimed at improving the resistance against such stress applied to the wire on the photovoltaic element. Thus, the more the photovoltaic layer has flexibility or the more the area of the photovoltaic layer is, the more the effects of the present become significant.
WIRE 402

There is no particular limitation for the wire 402. The wire 402 is used for collecting and transmitting a power generated by the photovoltaic layer of the photovoltaic element 401 to the electrode 403.

The wire 402 is preferred to comprise, for example, a metal fine line.

The wire 402 may be constituted by a metallic material principally comprising a metal such as Cu, Al, Au, Pt, Ag, Pb, Sn, Fe. Ni, Co, Zn, Ti, Mo, W, or Bi.

In order to prevent a power loss, it is preferred for the wire to be constituted by a metallic material whose electric resistance is low, which comprises a metal selected from a group consisting of Cu, Au, Ag, Pb, and Sn.

The wire 402 may be designed to have a layered structure comprising a plurality of metallic material layers comprising any of the above-mentioned metallic materials which are stacked.

The wire 402 may be of a cross section in a round form, an oval form, a triangle form, a square form, or other polygonal form. However, it is preferred for the cross-sectional area and the cross-sectional form of the wire 402 to be determined so that the sum of the joule loss in the wire 402 and the loss in the quantity of incident light obstructed from being impinged into the photovoltaic layer of the photovoltaic element 401 by the wire 402 is minimized. In general, the wire 402 is preferred to be made such that the cross-sectional area has a magnitude of $(80 \text{ to } 20000) \times 10^{-12}$ m$^2$ and the aspect ratio of a value of the cross-sectional area in a direction toward the photovoltaic element face and a value thereof in a normal line direction is approximate to 1.

In the present invention, the metallic material constituting the wire 402 is particularly preferred to be high in terms of the resistance to stress. Such metallic material can include Cu, Au, Ag, Pb, and Sn which have high tenacity. Of these metals, Cu is the most appropriate because it has high tenacity, is inexpensive, and is high in protection against corrosion.

In order to increase the tenacity of the wire, it is effective to conduct a thermal annealing treatment.

For the cross-sectional form of the wire 402, a round form is the most appropriate because it distinguishably excels in the resistance to stress.

Further, the wire 402 is preferred to comprise a metal fine line comprising any of the foregoing metallic materials which has a surface applied with a chemical treatment so as to exhibit an improved adhesion in a connection process of forming an electrical connection portion which will be later described and also with an anti-oxidation treatment, an anticorrosive treatment or a plating treatment so as to have an improved corrosion resistance. Specifically, in order to make the metal fine line as the wire 402 have such treated surface, a metal oxide layer is formed on the surface of the metal fine line by way of electroplating or hot dipping of a metal such as Ag, Au, Sn, Pb, or Ni or by way of electro-deposition or sputtering of a metal such as In, Sn, or Ti. Besides, it is possible to adopt a cladding treatment of thermally compressing a metal such as Ag on the surface of the metal fine line.

In the present invention, to join the wire 402 with the surface of the photovoltaic element 401 is conducted through an electrically conductive resin material. As the electrically conductive resin material, these can be mentioned electrically conductive resin materials comprising metal fine particles dispersed in a resin. In the case where the photovoltaic element 401 comprises a photovoltaic element having a large area thin film photovoltaic layer, an electrically conductive resin material comprising fine particles of a carbon or fine particles of a metal oxide such as indium-tin oxide, tin oxide or titanium oxide dispersed in a resin is desirably used.

In the case where the wire 402 is joined with the photovoltaic layer of the photovoltaic element 401, it is difficult for the photovoltaic layer to be uniformly formed over a large area. A main reason for this is due to the fact that in many cases, a photovoltaic element produced has a effective potion in that the positive electrode and the negative electrode are short-circuited. In this connection, it is effective to intervene an electrically conductive resin material having an adequately low resistivity so that it does not directly contacts with such short-circuited defective portion, in order to prevent the characteristics of the photovoltaic element from being deteriorated.

Incidentally, it is a common technique that a transparent electrically conductive layer comprising ITO or the like is provided on the light receiving face side of the photovoltaic layer of the photovoltaic element. In this case, the wire 402 is bonded to the transparent electrically conductive layer on the photovoltaic layer through the electrically conductive resin material. It is a matter of course that the present invention can be applied also in the case where the wire 402 is bonded to the transparent electrically conductive layer on the photovoltaic layer in this way. This situation will be late described in more detail.

ELECTRODE 403

There is no particular limitation for the electrode 403.

The electrode 403 is used for collecting the power transmitted by the wire 402 and outputting the power outside the photovoltaic element 401.

The electrode 403 may be constituted by a metallic material principally comprising a metal such as Cu, Al, Au, Ag, Pb, Sn, Fe, Ni, Co, Zn, Ti, Mo, W, or Bi. In order to prevent a power loss, it is preferred for the electrode to be constituted by a metallic material whose electric resistance is low, which comprises a metal selected from a group consisting of Cu, Au, Ag, Pb, and Sn.

The electrode 403 may be designed to have a layered structure comprising a plurality of metallic material layers comprising any of the above-mentioned metallic materials which are stacked.

The electrode 403 may be of a cross section in a round form, an oval form, a triangle form, a square form, or other polygonal form. However, for the thickness, width and form of the cross section of the electrode 403, they are preferred to be determined so that the joule loss due to an electric current flown in the electrode is sufficiently minimized in comparison with the power generation quantity of the photovoltaic element 401. However, in general, a metal foil having a thickness of 10 to 500 $\mu$m and a width of 1 to 30 mm is used as the electrode 403.

JOINING STRUCTURE AND JOINING METHOD OF THE WIRE AND THE ELECTRODE

As shown in FIGS. 4(a) to 4(c), the joining structure of the wire and the electrode in the present invention is featured in that the wire 402 ad the electrode 403 are joined by at least two different joining portions 404 and 405.

Particularly, as shown in FIG. 4(c), the wire 402 and the electrode 403 are by a first joining portion 404 and a second joining portion 405 which is adjacent to the first joining portion. It is preferred to make such that the second joining portion 405 has an elasticity which is greater than that of the first joining portion 404. It is also proffered to make such that the first joining portion 404 has an electric resistance which is smaller than that of the second joining portion 405. And it is possible to make such that the composition of the first joining portion 404 and that of the second joining portion 405 differ one from the other.

By adopting such constitution as described in the above, the second joining portion 405 which is adjacent to the first joining portion 404 can reinforce the first joining portion 404. For instance, even when external stress is applied to the joining portion 406 [see, FIG. 4(c)], the second joining portion having a relatively higher elasticity absorbs the stress to protect the first joining portion having a relatively smaller electric resistance. That is, in the joining portion 406, a high electrical conductivity is ensured while improving the durability of the joining portion 406.

The constituent material of the first joining portion and that of the second joining portion are adequately selected so that the second joining portion has an elasticity which is greater than that of the first joining portion. Such material constituting each of the first joining portion ad the second joining portion can include, for example, metallic materials containing Sn, Pb, Ag, Ni, Zn, or Cu: resins; and electrically conductive pastes (electrically conductive resin materials) comprising an electrically conductive resin dispersed in a binder resin.

Specifically, for instance, as the constituent material of the first joining portion, when an appropriate material whose electric resistance being relatively lower is selectively used, it is possible to make the first joining portion have an adequate strength while the power loss in the joining portion being diminished. In a most preferred embodiment, a metallic material such as Ag or a solder is used as the constituent material of the first joining portion, and an electrically conductive paste is used as the constituent material of the second joining portion. Separately, it is possible for the first joining portion to be formed by way of welding the wire 402 and the electrode 403.

For the formation of such joining structure as above described in the care where the metal layer comprises a metal having a low melting point such as Sn, Pb or the like, there can be adopted a manner of flowing a metallic liquid obtained by heating said metal to liquefy between the wire and the electrode. The formation of such joining structure as above described through a metal layer comprising a metal having a relatively high melting point such us Ag, Au, Ni, Zn, Cu or the like can be conducted by, for instance, a manner of forming a metal layer comprising said metal on the face involved of at least the wire or the electrode by means of plating or electro-deposition, contacting the metal layer-bearing face of the wire or the electrode with the corresponding face of the remainder, and supplying are prescribed pressure or a prescribed heat onto the resultant. In the last step in this case, there can be adopted a fusing manner of flowing a prescribed electric current to the face-to-face contacted portion to generate heat in the contacted portion.

METALLIC MATERIAL

Specific preferable examples of the metallic material which can be used as the constituent material of the joining portion are Sn, Pb, Ag, Au, Ni, Zn, and Cu.

ELECTRICALLY CONDUCTIVE PASTE

As the electrically conductive paste which can be used as the constituent material of the joining portion, there can be mentioned paste-like products obtained by dispersing electrically conductive fine particles of a metal such as Ag, Au, or Cu dispersed in a binder resin; paste-like products obtained by dispersing electrically conductive fine particles of a metal oxide such as indium-tin oxide, tin oxide, or titanium oxide in a binder resin; and paste-like products obtained by dispersing electrically conductive fine particles of an electrically conductive non-metallic material such as carbon or the like in a binder resin.

In the case of forming the foregoing joining structure using any of these paste-like products, it is possible to adopt a manner in that the paste-like product is applied on the face involved of at least the wire or the electrode to form a coat thereon, the coat-bearing face of the wire or the electrode is contacted with the corresponding face of the remainder, and a prescribed pressure or a prescribed heat is supplied onto the resultant.

As previously described, it is preferred to make the joining portion of the wire and the electrode such that the electric resistance thereof is decreased as smaller as possible so as to diminish the joule loss due to the electric current flown in the joining portion. In this respect, when the structure of the joining portion is formed using the electrically conductive paste, the volume ratio of the electrically conductive fine particles in the electrically conductive paste is preferred to be in a range of 50% to 90%.

As the electrically conductive fine particles contained in the electrically conductive paste, it is more preferred to use carbon fine particles rather than to use metal oxide fine particles because the electric conductivity of the former is higher than that of the latter. And it is more preferred to use metal fine particles rather than to use the carbon fine particles because the electric conductivity of the former is higher than that of the latter. And to use the metal fine particles is more advantageous. That is, in the case of using the metal fine particles, it is possible to decrease the volume ratio thereof in the electrically conductive paste to an extent which is smaller than that in the case of using other electrically conductive fine particles, and because of this, it is possible to make the electrically conductive paste have a desirable elasticity and a desirable viscoelasticity, where there is provided an effect to attain an improved resistance to stress.

The foregoing binder resin used in the electrically conductive paste may be a thermosetting resin or a thermoplastic resin. Such resin can include, for example, epoxy resin, urethane resin, butyral resin, melamine resin, alkyd resin, polyester resin, polyimide resin, fluororesin, silicone resin, and phenoxy resin.

Now, in the joining through the electrically conductive fine particles, there is merely formed electrical joining by virtue of mechanical contact all between the wire and the electrically conductive fine particles, between one electrically conductive fine particle and the other electrically conductive fine particle, and between electrically conductive fine particles and the electrode, where the form thereof is retained by the binder resin. In this connection, for instance in the case of using given metal fine particles, when the binder resin comprises a resin having a high moisture tsansmissivity, the surfaces of the metal fine particles are oxidized, and as a result, the resistance of the entire joining portion is increased. In order to prevent occurrence of such situation, it is preferred to use fine particles of Ag or Au which are difficult to be oxidized as the electrically conductive fine particles, and it is preferred to use a resin having a small moisture tsansmissivity such as epoxy resin or phenoxy resin as the binder resin.

RESIN

In the case of using a resin to form the second joining portion, the resin may be a thermosetting resin or a thermoplastic resin. Such resin can include, for example, epoxy resin, urethane resin, butyral resin, melamine resin, alkyd resin, polyester resin, polyimide resin, fluororesin, silicone resin, and phenoxy resin.

In the following, the present invention will be described using other examples.

Figure 5A:
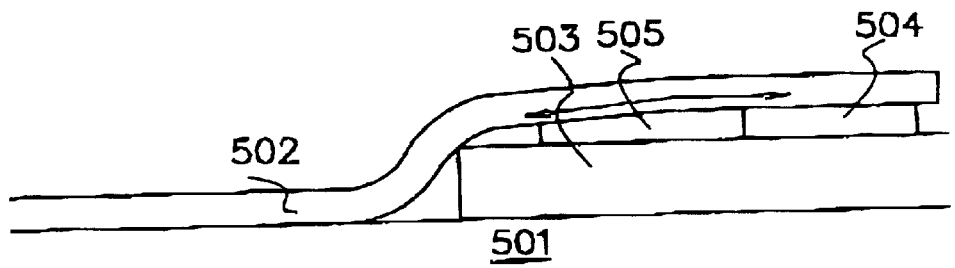
FIGS. 5(a) and 5(b) are schematic views respectively showing a mechanism of exhibiting the effects of the present invention, where
Figure 5B:
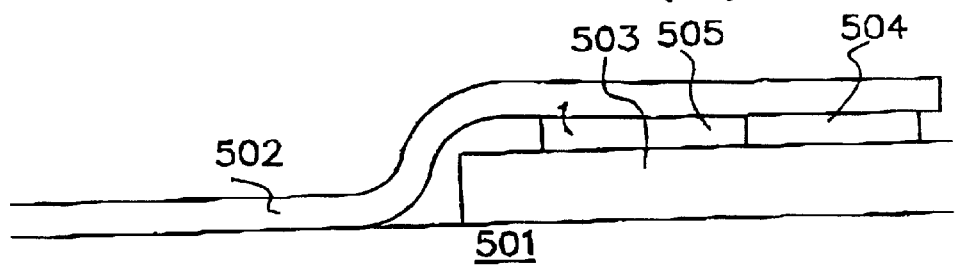

FIGS. 5(*a*) and 5(*b*) a schematic views respectively showing a mechanism of exhibiting the effects of the present invention, where FIG. 5(*a*) is a schematic view showing a state in that a stress is effected in a direction of pressing or pulling in parallel to a wire, and FIG. 5(*b*) is a schematic view showing a state in that a stress is effected in a direction perpendicular to a wire, In FIGS. 5(*a*) and 5(*b*), reference numeral 501 indicates a photovoltaic layer of a photovoltaic element, reference numeral 502 a wire, reference numeral 503 an electrode, reference numeral 504 a first joining portion, and reference numeral 505 a second joining portion.

A shown in FIG. 5(*a*), a tress applied in a direction of pressing or pulling the wire 502 in parallel to the wire 502 is not directly applied to the first joining portion 504 where the wire 502 and the electrode 503 are joined but is absorbed by the second joining portion 505 where the wire 502 and the electrode 503 are joined by an electrically conductive resin material. The reason for this is that the second joining portion 505 has an elasticity which is greater than that of the first joining portion 504. By this, the stress which is repeatedly applied to the first joining portion 504 is relaxed to prevent the wire 502 from being fatigued.

As shown in FIG. 5(*b*), in the case where a stress is applied in a direction perpendicular to the wire 502, because the wire 502 is deformed in a state of drawing a gentle curve by virtue of the elasticity of the resin in the second joining portion 505, it is directly converged to the root of the first joining portion 504 whereby preventing the wire 502 from being ruptured.

From the above description, it is understood that of the two joining portions of joining the wire and the electrode, the second joining portion comprising the resin material functions to protect the first joining portion. Thus, it is preferred for the resin material used in the second joining portion to comprise an electrically conductive resin material which has an adequate adhesion and an adequate elasticity or viscoelasticity for the wire and the electrode and which functions to protect the electrically connected portion from an external stress. In order to satisfy these requirement, it is preferred for the resin material to contain urethane resin or butyral resin. Further, in order to improve the adhesion of the resin material with the wire or the electrode, it is possible to incorporate a coupling agent into the resin material. Such coupling agent can include, for example, silane series coupling agents and titanate series coupling agents.

The formation of the joining portion comprising such resin material may be conducted by, for example, a manner in that a given electrically conductive resin material is applied onto the wire or the electrode to form a coat thereon by a conventional coating method using a dispenser or the like, the coat-bearing face of the wire or the electrode is contacted with the corresponding face of the remainder, and a prescribed pressure or a prescribed heat is supplied to the resultant. Incidentally, in this case, to adopt a joining method which will be later described in the production of a photovoltaic element is more simple and preferable.

OTHERS (The Area of the First Joining Portion and that of the Second Joining Portion)

The ratio between the area of the first joining portion and that of the second joining portion may be adequately determined depending on the situation involved.

However, in any case, it is necessary for the first joining portion and the second joining portion to be designed such that the first joining portion has a sufficiently low resistivity and the second joining portion functions to sufficiently protect the first joining portion which is adjacent thereto.

Separately, in the case of using an electrically conductive resin material in order to electrioally joining the wire and the electrode, it is preferred to use metal fine particles of Ag or Au, which are costly, as the electrically conductive fine particles in the electrically conductive resin material as previously described.

According to the present invention, this costly situation is desirably mitigated. That is, because the joining portion of the wire and the electrode is formed by at least two different joining portions, i.e., the first joining portion and the second joining portion, the amount of such costly, electrically conductive fine particles can be reduced to a minimum amount necessary in electrically connecting the wire and the electrode, where stable joining of the wire and the electrode can be attained at a reasonable cost.

(Substrate)

In the case where the photovoltaic layer of the photovoltaic element comprises a thin film series photovoltaic layer, the thin film series photovoltaic layer is generally formed on a retaining substrate.

The substrate may comprise, for example, a glass plate, a metal plate or a plate made of a plastic resin which has been applied with electrically conductive treatment to the surface thereof. Particularly, in the case where this substrate is provided on the light receiving face side, the substrate is required to be transparent. Therefore, a glass plate is preferred to be used as the substrate.

Separately, in the case where the thin film series photovoltaic layer is formed on a substrate by means of a chemical vapor deposition (CVD) process, because the substrates is heated to a high temperature, it is preferred to use a substrate made of glass, a metal or polyimide as the substrate.

(Transparent Electrically Conductive Layer)

In general, a transparent electrically conductive layer is formed on the photovoltaic layer. It is a matter of course that the effects of the present invention do not depend on the presence or absence of the transparent electrically conductive layer. The transparent electrically conductive layer may comprise, for example, a thin film comprising a indium-tin oxide material or a tin oxide material formed by means of sputtering.

(Solar Cell Module)

It is known that a solar cell module can be produced by electrically serializing a plurality of photovoltaic element to obtain a photovoltaic element string and sealing said string by a covering material into a module form.

The present intention is to attain an improvement in the resistance to stress of a photovoltaic element. Therefore, the effects of the present invention become significant when the present invention is adopted particularly in a solar cell module whose cover is simple and which is liable to distort clue to a stress applied thereon.

As such solar cell module which is ample in flexibility, there is known a solar cell module produced by sequentially stacking a back side covering resin material, a photovoltaic element string comprising a plurality of photovoltaic elements electrically serialized with each other, and a front side covering resin material on a metal substrate to obtain a stacked body and subjecting said stacked body to a thermocompression bonding treatment while evacuating the system involved. As each of the back side covering resin material and the front side covering resin material, EVA which excels in weatherability and is relatively inexpensive is generally used.

In the following, description will be made of the process for producing a photovoltaic element in the present invention.

The process of the present invention is for producing a photovoltaic element having a covered wire comprising a wire whose surface is covered by a cover which is disposed on a surface of said photovoltaic element for outputting a power generated by said photovoltaic element, and an electrode electrically joined with said covered wire through at least two different joining portions formed between said covered wire and said electrode, said process including the steps of removing part of said cover of said covered wire to form a cover-removed portion at said covered wire, for instance, by way of radiation of a laser beam, fixing said covered wire on the surface of said photovoltaic element, and joining said covered wire and said electrode to form a first joining portion where said cover-removed portion of said covered wire is joined with said electrode and a second joining portion where said cover of said covered wire is joined with said electrode. It is preferred for the second joining portion to have an elasticity which is greater than that of the first joining portion.

Figure 6A:
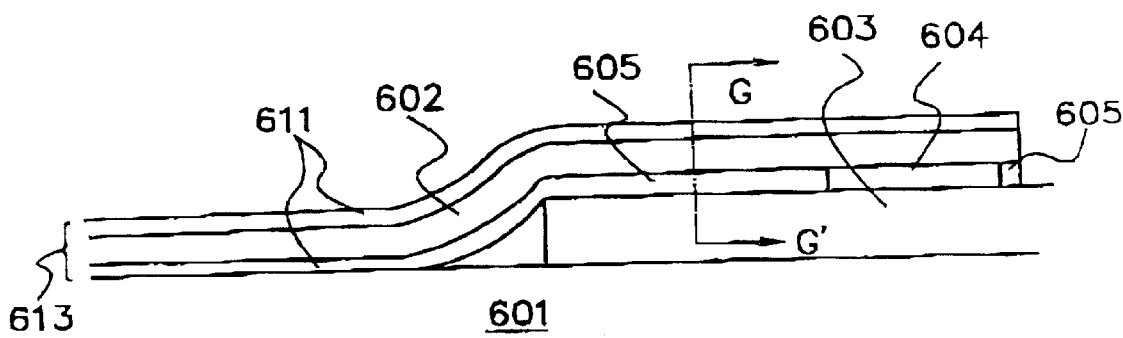
FIG. 6(a) is a schematic cross-sectional view illustrating an example or a photovoltaic element produced by a photovoltaic element-producing process of the present invention.
Figure 6B:
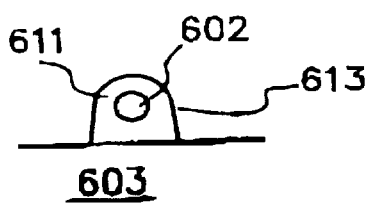
FIG. 6(b) is a schematic cross-sectional view, taken along the line G–G' in FIG. 6(a).
Figure 7A:
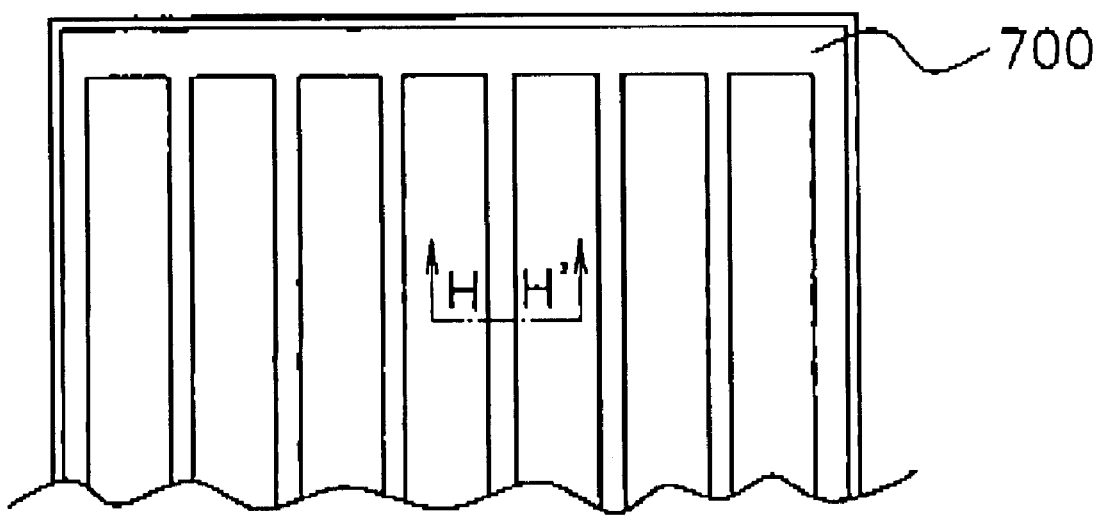
FIGS. 7(a) and 7(b) are schematic views illustrating an example of a conventional photovoltaic element.
Figure 7B:
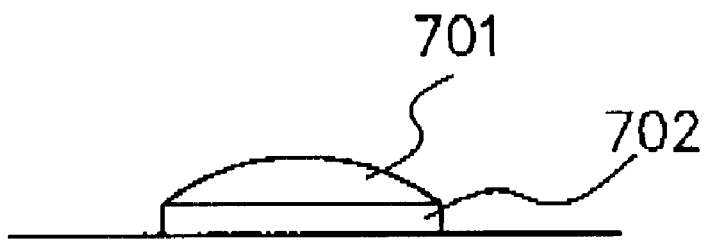
Figure 8A:
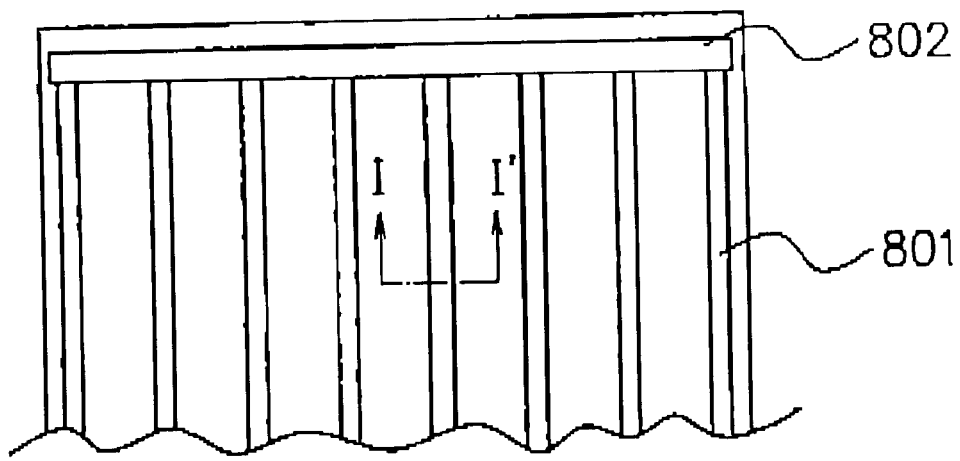
FIGS. 8(a) and 8(b) are schematic views illustrating another example of a conventional photovoltaic element.
Figure 8B:
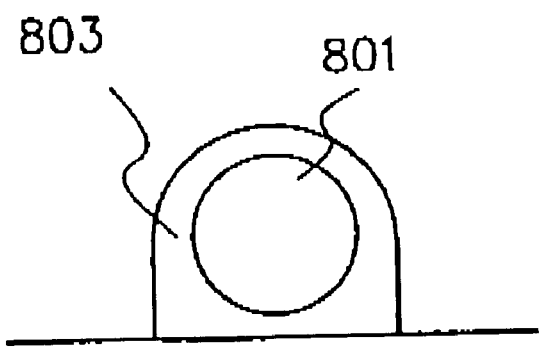

FIG. 6(a) is a schematic cross-sectional view illustrating an example of a photovoltaic element produced by the photovoltaic element-producing process of the present invention. FIG. 6(b) is a schematic cross-sectional view, taken along the line G–G' in FIG. 6(a).

In FIGS. 6(a) and 6(b), reference numeral 601 indicates a photovoltaic layer of a photovoltaic element, reference numeral 602 a wire, reference numeral 603 an electrode, reference numeral 604 a cover-removed portion (a first joining portion), and reference numeral 605 a cover (a second joining portion). Reference numeral 611 indicates a cover comprising a resin material for the wire 602, and reference numeral 613 a covered wire (as a collecting electrode) comprising the wire 602 as a core wire covered by the cover 611.

As will be understood with reference to FIGS. 6(a) and 6(b), a method of removing only a prescribed potion of the cover 611 of the covered wire 613 to form an exposed wire portion which is used for forming the first joining portion 604 is very simple. By simply fastening said exposed wire portion of the covered wire 613, which is used for the formation of the first joining portion 604, to a necessary extent and by making the cover 611 have a function of electrically connect the wire 602 with the photovoltaic layer 601 as the surface region of the photovoltaic element and also a function to electrically connect the wire 602 with the electrode, a desirable photovoltaic element can be readily produced.

In this embodiment, part of the cover 611 functions as the second joining portion 605.

Now, in the case where a transparent electrically conductive layer is formed on the surface off the photovoltaic layer 601, the covered wire 613 (as the collecting electrode) is electrically connected with the transparent electrically conductive layer.

In the case where the cover 611 is made have a function of mechanically and electrically connecting the wire 602 with the photovoltaic layer 601 (or the transparent electrically conductive layer), the cover 611 is preferred to be constituted by an electrically conductive resin material. As such electrically conductive resin material, a resin paste containing electrioally conductive fine particles of carbon or a metal oxide dispersed therein.

The resin paste may comprise a resin selected from a group consisting of epoxy resin, urethane resin, butyral resin, phenol resin, melamine resin, alkyd resin, polyester resin, polyimide resin, fluororesin, silicone resin, and phenoxy resin.

In order to make the second joining portion 605 have an elasticity, to use urethane resin or butyral resin is preferred.

In order to improve the adhesion with the wire 602 and the electrode 603, it is preferred to add a coupling agent. Such coupling agent can include silane series coupling agents and titanate series coupling agents.

The cover 611 may have a layered structure. In the case where the wire is directly contacted with the photovoltaic layer, there is an occasion in that metal ions of the wise are dispersed into the photovoltaic layer to deteriorate the performance of the photovoltaic element. In order to prevent occurrence of this situation, it is known that the wire is coated with an electrically conductive resin layer which functions as a metal ion-blocking layer. In this case, a thermosetting resin is used as the resin, and it is heated to cure upon forming the coat over the wire. Further, a semi-cured electrically conductive resin coat as an adhesive layer on the exterior surface of the blocking layer. And when the wire thus coated is arranged on the surface of the photovoltaic layer and a prescribed pressure and a prescribed heat are supplied thereon, the wire is fixed through the semi-cured resin. The layered structure of the cover 611 may be formed in accordance with this method.

(Formation of the Cover on the Wire)

The present invention does not depend on the kind of a manner of forming a cover on the wire. As the resin material to constitute the cover, any of those above mentioned may be optionally used. The formation of a resin material cover on the wire may be conducted by a conventional coating method using a dispenser, a brush coater, a spray coater, or a roll coater. It is a most simple manner that a resin material is coated by means of a roll coater to form the resin material cover 611 which fixes the wire 602 on the surface of the photovoltaic layer 601 ad the resin material portion 605 which is fixed to the electrode 602 at the same time, where the resin material cover 611 and, the resin material portion 605 are made to be in common. According to this manner, the resin material cover 611 and the resin material portion 605 can be formed at the same time and at a high speed.

(Cover Removal by Way of Radiation of Laser Beam)

By using laser, only a prescribed portion of the cover of the covered wire clan be selectively and readily removed. The cover removal may be also conducted by a manner of etching using a chemical material or by a manner of shaving using a sand paper or a cutter. However, these manners are problematic in that they do not have such selectivity as in the case of using laser, and they often antail damages to the wire, where the wire becomes in a state that it is liable to rupture. Hence, the manner using layer is most appropriate.

When the cover removal using the laser is conducted while scanning the laser beam supplied, there is a pronounced advantage such that a cover-free portion of from an extremely small area to a large area can be optionally formed at the covered wire. As the laser, any laser may be used as long as the energy of laser beam is converted into thermal energy in the resin material cover to break the chains of the resin. In general, $CO_2$ laser, YAG laser, and eximer laser may be desirably used. However, in the case where $CO_2$ laser or eximer laser is used, the apparatus involved is large and costly, and the maintenance thereof is complicated. Therefore, YAG laser is the most appropriate.

It is preferred that Q-switch modulation is added to YAG laser beam to shorten the pulse and at the same time with this, the pulse peak value is enlarged. By doing this way, the situation becomes such that the wire is difficult to receive negative influence of the heat. The selectivity of removing only a prescribed portion of the cover of the covered wire is increased. If necessary, it is possible to conduct moderate defocusing.

The canning of the laser beam is preferred to be conducted using a galvanometer in which a rotary mirror or a rotary prism is used. In this case, the canning of the laser beam can be readily conducted at a high speed. Further, in this case, the path of guiding the laser beam comprises a fixed optical system, where it is not necessary to use an optical fibers, and because of this, the radius of spot size for the laser beam can be minimized, and the energy density at the pulse peak is increased. Hence, the foregoing selectivity is more improved.

In addition, by incorporating a material having a high absorptivity for the energy of the laser beam such as carbon black or graphite into the resin material constituting the cover of the covered wire, the foregoing selectivity is further improved.

Further in addition, it is possible to conduct the radiation of the laser beam by providing a reflector capable of reflecting the laser beam on the side opposite the laser beam-outputting unit. In this case, the removal of a prescribed portion of the cover of the covered wire along the entire perimeter of the covered wire can be desirably performed. As the reflector, there can be mentioned, for example, a metal body having a high reflectance, and a body made of glass, deposited with a metal film having a high reflectance.

SECOND ASPECT

As previously described, the second aspect of the present invention is to provide a method for forming an electrical continuity between a covered wire and cover conductor, including a method of removing a cover portion of said covered wire and a method of joining said covered wire with said conductor.

In the following, the method of removing a cover portion of a covered wire in the present invention will be detailed by illustrating a concrete embodiment of the method. It should be understood that the present invention is not restricted by this embodiment.

Figure 14:
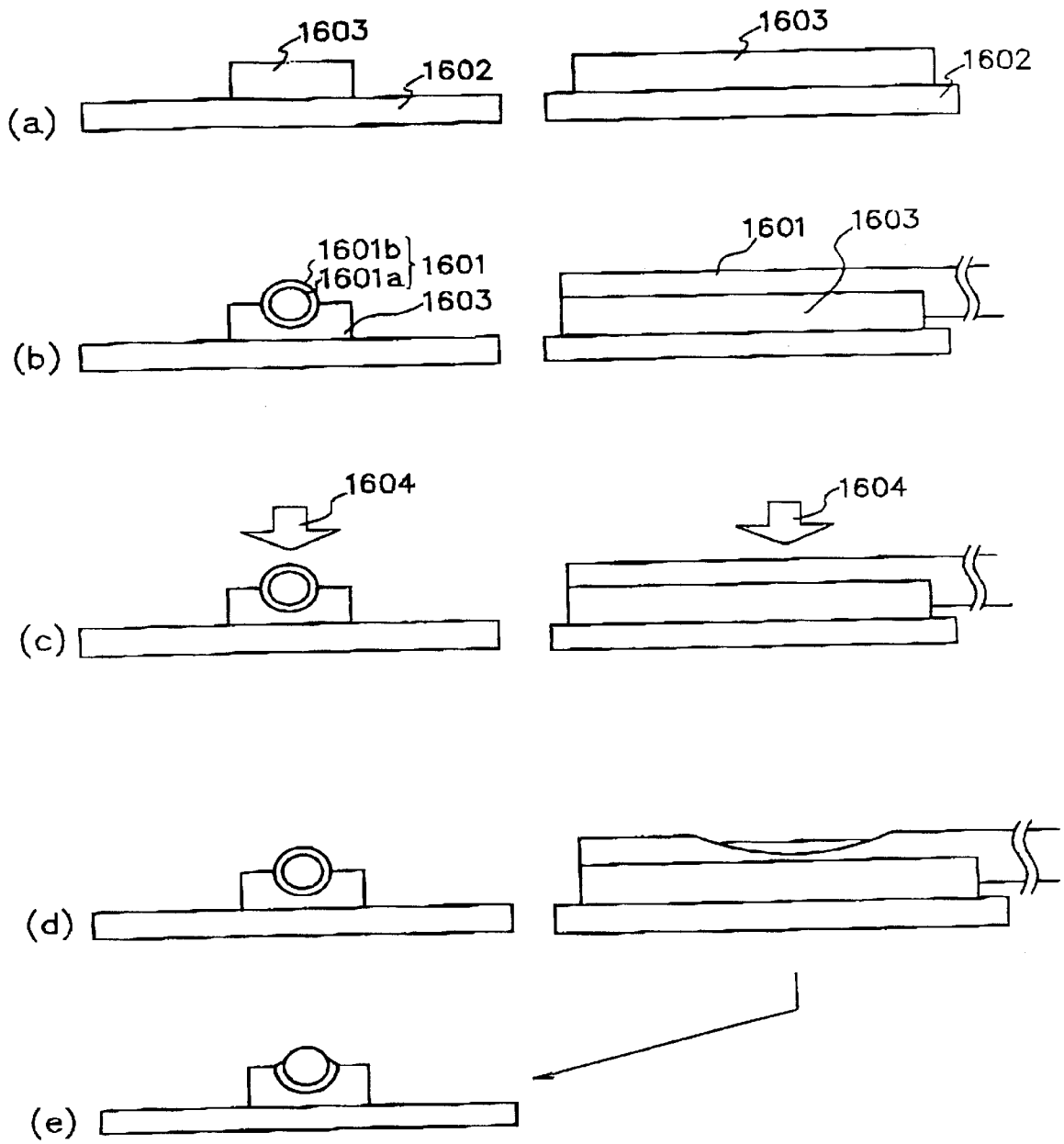
FIG. 14 is a schematic view for explaining an embodied example of the present invention.

FIG. 14 is a schematic diagram for explaining an embodiment of the method of removing a cover portion of a covered wire in the present invention.

FIG. 14, reference numeral 1601 indicates a covered wire comprising a wire 1601a (as a core wire) whose surface is covered by a cover 1601b, reference numeral 1602 a substrate, reference numeral 1603 a fixing member, and reference 1604 energy beam.

In step 1 [see, FIG. 14(a)], the fixing member 1603 is fixed onto the substrate 1602.

In step 2 [see, FIG. 14(b)], at least part of the covered wire 1601 is fixed onto the substrate 1602 through the fixing member 1603.

In step 3 [see, FIG. 14(c)], energy beam 1604 is radiated to at least part of the covered wire 1601 which is fixed on the substrate 1602 through the fixing member 1603.

By this, a cover portion of the cover 1601b of the covered wire 1601 to which the energy beam has been radiated is removed from the surface of the core wire 1601a of the covered wire 1601 to form an exposed wire portion [see, FIG. 14(d) and FIG. 14(e)].

Upon the cover removal by the energy beam, it is rare that the face of the covered wire which receives the energy beam is a plane precisely perpendicular to an incident direction of the energy beam. Therefore, a momentum in a direction perpendicular to the incident direction of the energy beam is occurred at the covered wire. That is, an action which makes the covered wire to escape from the energy beam works. Because of this, in the case of the conventional method in that a covered wire is retained in the air without being fixed to a substrate, and energy beam is radiated to the covered wire, there is a tendency in that the cover removal becomes insufficient.

In additional, when the covered wire receives the energy beam, the cover of the covered wire absorbs the energy of the energy beam and as a result, the temperature of the covered wire is heightened. In this connection, in the case of the conventional method in that a covered wire is wound on a substrate to retain, and energy beam is radiated to the covered wire, the covered wire is expanded and loosened, where the fixation of the covered wire becomes insufficient. Therefore, as well as in aforesaid case, there is a tendency in that the covered wire escapes from the from the energy beam, and the cover removal becomes insufficient.

In the present invention, the covered wire 1601 is surely fixed to the substrate 1602 by means of the fixing member 1603 so that the covered wire 1601 is stably maintained without suffering such positional deviation as in the prior art upon the radiation of the energy beam. Therefore, the cover removal can be sufficiently performed as desired in the present invention.

In the following, description will be made of each component in the present invention.

COVERED WIRE 1601

The covered wire 1601 comprises the wire 1601 a (as the core wire) whose surface is covered by the cover 1601b as previously described. In FIG. 14, the cover 1601b comprises a single layer. This is not limitative. The cover 1601b may be of a layered structure comprising a plurality of layers being stacked.

In the present invention, there is no particular limitation for the constituent of the wire 1601a. The wire 1601a may comprise a glass material such as a glass fiber or it may comprise an inorganic oxide material, a semiconductor material or a metallic material, respectively having a high thermal conductivity.

As the constituent of the wire which is electrically conductive in the field of electronics, there are known metals such as Cu, Al, Au, Ag, Sn, Pb, Zn, Ni, Cr, Mn, Mo, and W; alloys of these metals; inorganic oxides having a superconductor transition point; and electrically conductive organic materials, respectively used in lead wires, electrodes, cables, fuses, or coils.

The wire 1601a may comprise any of the above-mentioned materials. The wire 1601a constituted by a given material selected from the above-mentioned materials may have a plated layer or a clad layer, comprising a given material selected from those materials mentioned in the above which is different from the material constituting the wire.

There is no particular limitation for the shape of the wire 1601a. The cross section of the wire 1601a may be in a round form, an oval form, a triangle form, or an other polygonal form. However, the wires which can readily prepared and which are widely used are of a cross section in a complete round form.

In the present invention, there is no particular limitation for the thickness of the wire. The effects of the present invention becomes significant particularly in the case of wires which are more difficult to fix their position due to their tensile forces in comparison with those in the prior art and also in the case of wires which are readily elongated due to heat. Particularly, the present invention is more effective for the wires having a thickness of 10 $\mu$m to 1 mm.

For other characteristics of the wire, there can be mentioned elastic modulus, coefficient of thermal expansion, absorptivity for energy of energy beam, and reflectance. The present invention does not depend on these characteristics of the wire.

However, as the effects of the present invention becomes significant particularly in the case of wires which are more difficult to fix their position due to their tensile forces in comparison with those in the prior and also in the case of wires which are readily elongated due to heat as above described, the present invention is more effective for the wires having a large coefficient of thermal expansion. In addition, in the case where the fixing member is small in terms of the elastic modulus and is hard, as the coefficient of thermal expansion of the wire comes to closer to that of the fixing member, the fixation of the covered wire is facilitated.

In any case, it is preferred that the wire does not suffer a damage due to the radiation of the energy beam. Therefore, it is more advantageous in the case where the wire is high in terns of the reflectance or transmissivity for the energy of the energy beam and is high in terms of the absorptivity for the energy of the energy beam.

The effects of the present invention are afforded by the fixation of the covered wire. The effects of the present invention do not depend on the constituent material of the cover of the covered wire.

The constituent material of the cover of the covered wire may be any resin materials, any metallic materials or any inorganic insulative materials as long as they have properties such that they absorb the energy of the energy beam to modify, decompose, fuse or vaporize and are peeled off from the surface of the wire. However, in order to facilitate the cover removal, it is preferred to use an appropriate material selected from those mentioned in the above as the constituent material of the cover which is low in term of the reflectance or transmissivity for the energy of the energy beam and is high in terms of the absorptivity for the energy of the energy beam. In the case where the constituent material of the cover comprises a material which does not satisfy these conditions, it is effective to incorporate an appropriate material having absorptivity for the energy of the energy beam thereinto.

Specific examples of the material which can be used as the constituent material of the cover of the covered wire chloride, enamel, nylon, polyethylene, polyester, polyimide, and polyamide-imide. These resin materials may contain a coupling agent in order to have an improved adhesion. Similarly, these resin material may contain an electrically conductive filler in order to hare an electrically conductivity. Further, these resin material may contain carbon particles order to have an improved absorptivity for the energy of the energy beam.

Separately, the cover of the covered wise may have is a layered structure comprising a plurality of layers comprising a different material being stacked.

There is no particular limitation for the thickness of the cover of the covered wire. In general, the thickness of the cover is in a range of 0.01 $\mu$m to 1 mm.

Incidentally, in the field of solar cell, the covered wire is generally used as a collecting electrode.

SUBSTRATE 1602

The substrate 1602 is used for fixing and retaining the covered wire 1601. As long as a composite structure provided by fixing the covered wire on the substrate through the fixing member has a superior rigidity which is surpassing that of the covered were itself, the present invention is effective. The substrate is not governed by its constituent material, size and structure. However the substrate is preferred to be highly rigid. Therefore, it is preferred for the substrate to be constituted by a metallic material such as Fe, stainless steel, brass, or Al which have al high hardness or other inorganic material such as ceramics which also have a high hardness. Besides, it is possible to use an appropriate plastic material having an elasticity as the constituent material of the substrate by thickening the thickness of the plastic material.

For the size of the substrate, it is sufficient that the size is of a magnitude which makes the substrate have a sufficient rigidity. However, it is preferred for the substrate to have such a size that the size in a direction perpendicular to the longitudinal direction of the covered wire is greater than the thickness of the covered wire.

The structure of the substrate may be shaped in a plate form, a square form, or a round bar form. Besides, the substrate may be made have a structure which has other functions besides it functions to retain the covered wire. In any case, the substrate is preferred to have a structure which is open toward the direction for the energy beam to be radiated so that the substrate itself does not shade the radiation path of the energy beam. Further, because there will be an occasion in that when the energy beam is radiated to the covered wire for the cover removal, it is also radiated to the substrate. Therefore, the substrate is preferred to have a strength such that the substrate is not damaged when the energy beam is radiated thereto. In addition, the substrate is preferred to have a high reflectance against the energy beam.

Separately, it is effective to make the substrate have an irregular surface or a modified surface with a porous texture which is capable of improving the fixing force of the interface between the substrate and the covered wire.

Incidentally, as a specific example of the substrate, there can be mentioned a photovoltaic element in the field of solar cell.

FIXING MEMBER 1603

The fixing member 1603 is situated between the covered wire 1601 and the substrate 1602, and it functions to fix the relative position for the covered wire and the substrate. There is no particular limitation for the fixing member as long as it functions as required.

The fixing force of the interface between the fixing member and the substrate may be based on a mechanical frictional force by means of screwing using screw or vis or on a chemical joining force of molecular level by means of an adhesive. Similarly, the fixing force of the interface between the fixing member and the covered wire may be based on a frictional force which works when the covered wire is sandwiched by the two planes or on a chemical joining force of molecular level by means of an adhesive. In order to provide such chemical joining force, there can be used, for example, an adhesive tape.

Figure 15A:
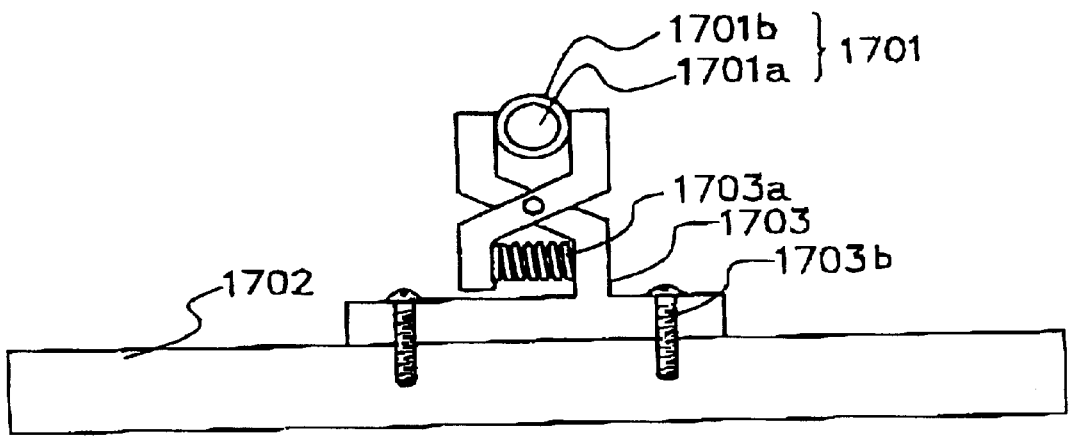
FIGS. 15(a) to 15(c) is a schematic view for explaining anther embodied example of the present invention.
Figure 15B:
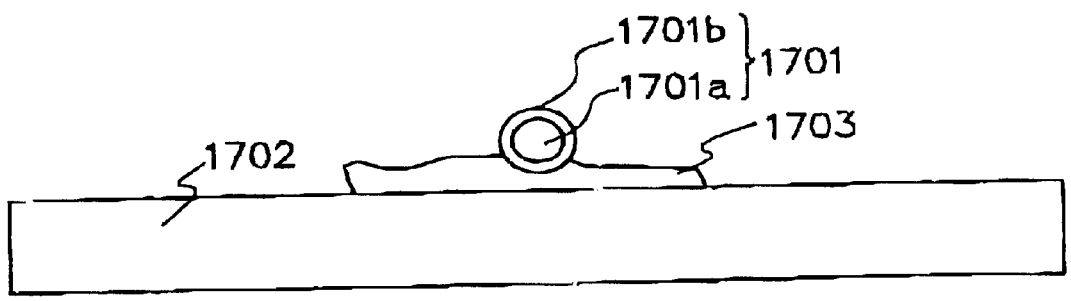
Figure 15C:
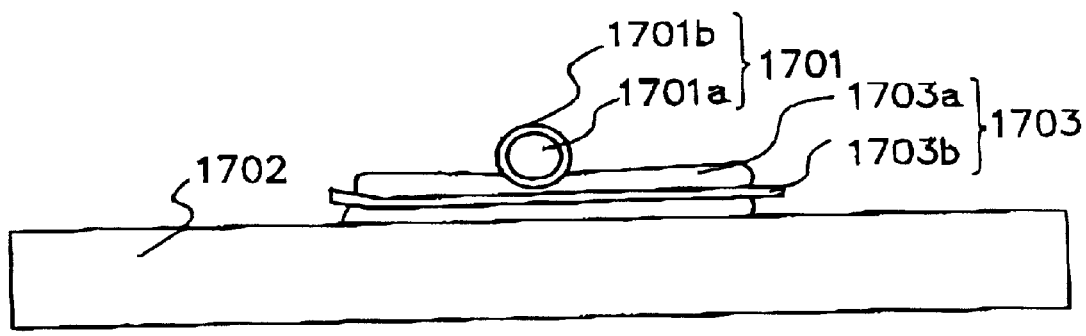
Figure 17A:
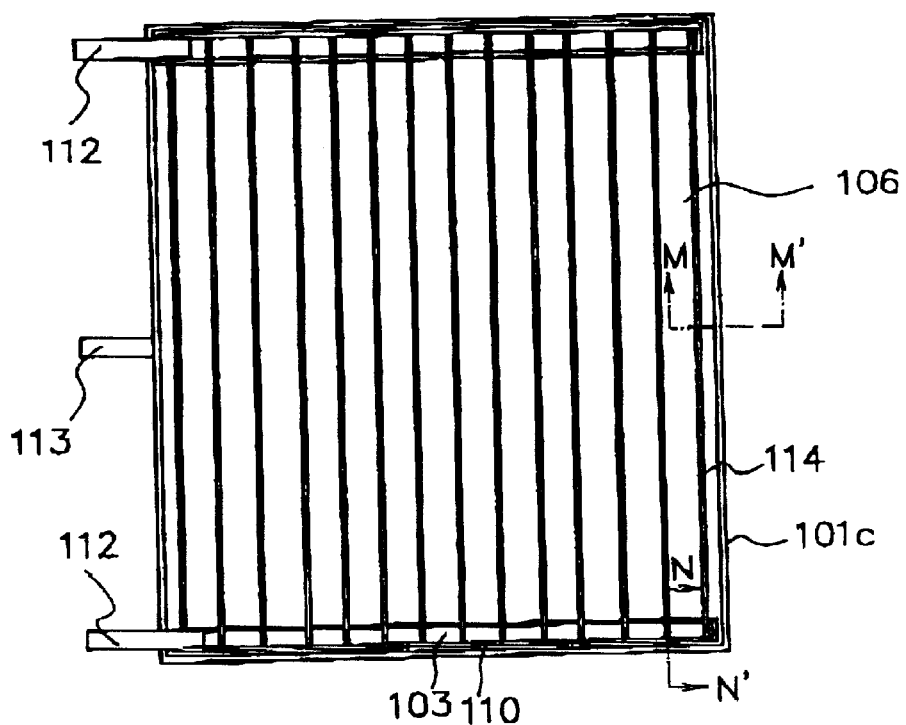
FIG. 17(a) is a schematic top view of a comparative photovoltaic element in a comparative example which will be described later.
Figure 17B:
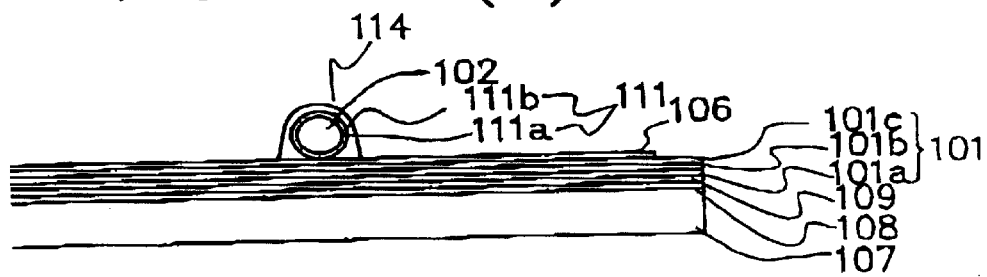
FIG. 17(b) is a schematic cross-sectional view, taken along the line M–M' in FIG. 17(a).
Figure 17C:
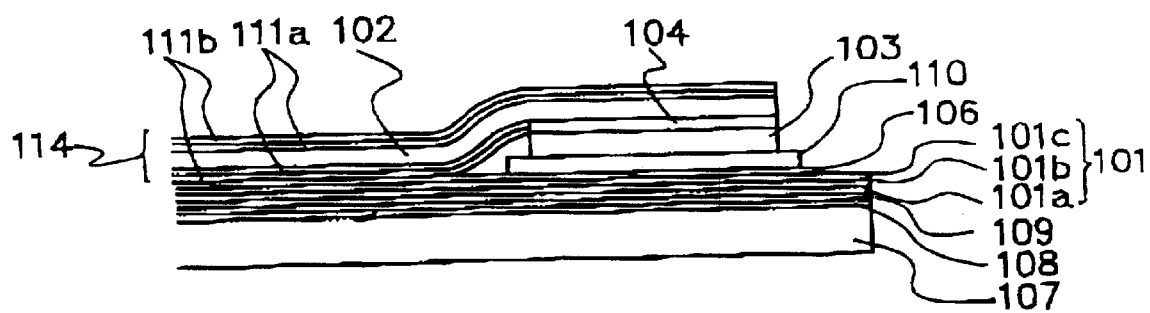
FIG. 17(c) is a schematic cross-sectional view, taken along the line N–N' FIG. 17(a).
Figure 18A:
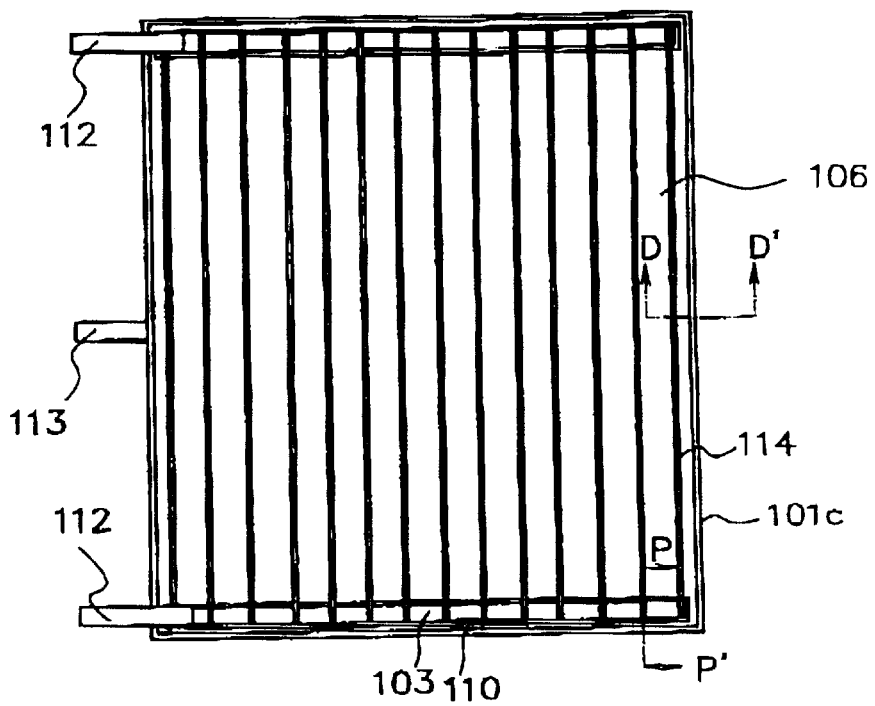
FIG. 18(a) is a schematic top view of another comparative photovoltaic element in another comparative example which will be described later.
Figure 18B:
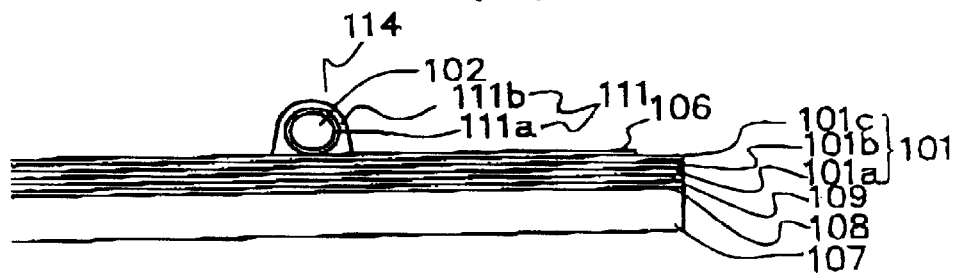
FIG. 18(b) is a schematic cross-sectional view, taken along the line O–O' in FIG. 18(a).
Figure 18C:
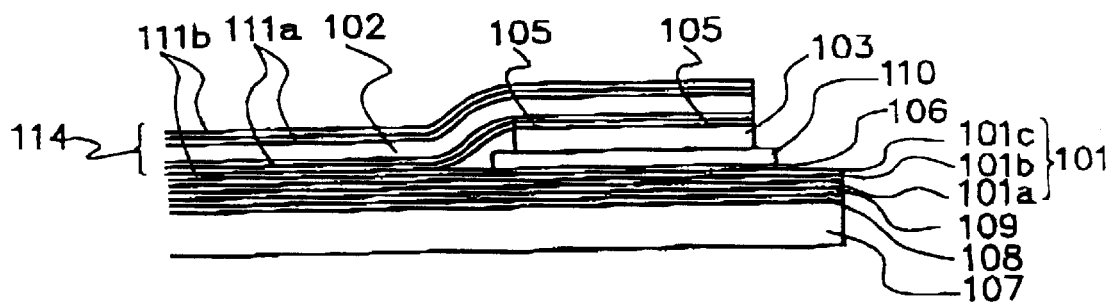
FIG. 18(c) is a schematic cross-sectional view, taken along the line P–P' in FIG. 18(a).

In the case where the fixation between the fixing member and the substrate and that between the fixing member and the covered wire are by means of the mechanical frictional force, it is necessary for the fixing member to have a high rigidity in order to generate a strong frictional force. In FIG. 15(*a*), there is shown an example of a fixing member by means of a mechanical frictional force. In FIG. 17(*a*), reference numeral 1701 indicates a covered wire comprising a wire 1701*a* (as a core wire) whose surface is covered by a cover 1701*b*. Reference numeral 1702 indicates the foregoing substrate. Reference numeral 1703 indicates a fixing member, reference 1703*a* a spring which is provided at the fixing member, and reference numeral 1703*b* a screw.

As shown in FIG. 17(*a*), the fixing member 1703 comprising a clip which can be closed by means of the spring 1703*a* is fixed onto the substrate 1702 by means of the screws 1703*b*.

In the case where a frictional force is generated at the interface between the fixing member and the substrate by means of the screwing, when the rigidity of the fixing member is low, the generation of the frictional force is limited to a partial region of the interface in the vicinity of the crew, and because of this, the retaining ability of the fixing member is inferior. Also in the case where the frictional force is generated at the interface between the fixing member and the covered wire by sandwiching the covered wire by the two planes of the fixing member, when the rigidity of the fixing member is low, the retaining ability of the fixing member is inferior, as well as in the former case.

In the case of such mechanical fixation as above described, the fixing member is preferred to be constituted by a forming material comprising a metallic material or an epoxy resin which is high in terms of the rigidity, because of aforesaid reasons. And the structure of the fixing member is desired to be designed so that it does not shade on the radiation side of the energy beam so as to obstruct the radiation path of the energy beam.

The foregoing convectional method in which the covered wire is fixed by winding it around the terminal is corresponding to a method of fixing the covered wire by generating a frictional force at the interface between the fixing member (the terminal) and the covered wire. However, this conventional method differs from the method of the present invention in terms of the mechanism of generating the frictional force. That is, in the conventional method, the frictional force is generated by virtue of the tensile force remained in the covered wire, and therefore, when the covered wire is elongated due to the radiation of the energy beam, the tensile force is weakened to result in a decrease in the frictional force and as a result, the fixation of the covered wire becomes insufficient.

On the other hand, in the present invention, the frictional force is generated by the mechanism of the fixing member itself and therefore, it is not governed by the elongation of the covered wire.

In the case of the fixing member by means of the foregoing mechanical force, the contact area thereof with the covered wire is narrowed in many cases, in that case, there will be an occasion i that the fixation of the covered wire becomes insufficient and as a result, the covered wire separates from the fixing member, where the cover removal occasionally becomes insufficient. In addition, there is a tendency in that the structure of the fixing member is complicated, for instance, as shown in FIG. 15(*a*)

In view of the above-described situation, the fixation of the covered wire 1701 is preferred to be conducted by means of the chemical joining force of molecular level of an adhesive 1703 (including an adhesive mass) as shown in FIG. 15(*b*), because the fixation is strong enough and the fixing method is simple and readily conducted.

As the adhesive 1703, any adhesive can be adopted as long as it has bond properties to the surface of the substrate 1702 and also the surface of the covered wire 1701. As such adhesive, there can be mentioned synthetic resin series adhesives such as thermoplastic resin adhesive, thermosetting resin adhesive, elastomeric resin adhesive, and mixtures of these; and natural organic adhesives such as starch paste, glue, common rosin, asphalt, and tar. Besides, inorganic materials having bond properties such cement, sodium silicate, ordinary solder, silver solder, and ceramics are also usable as the adhesive 1703.

Of these, synthetic resin aeries adhesives are more appropriate because their composition, additive, and application condition, and if necessary, their curing condition can be properly adjusted depending upon the constituent material and roughness of the surface of the substrate and that of the covered wire so as to exhibit a desired adhesion upon fixing the covered wire to the substrate. Further, of the synthetic resin series adhesives, those which also bit adherence are more preferred because they exhibit a moderate elasticity.

Now, when the energy beam is radiated to the covered wire and the energy of the energy beam is absorbed by the covered wire, there is a tendency in that the covered wire is elongated and a shearing stress is occurred at the interface between the covered wire and the substrate. In order to maintain the bond-fixed state between the covered wire and the substrate while absorbing said stress it is preferred for the fixing member to have a high elasticity.

Incidentally, there are known various adhesive masses which exhibit a high elasticity. It is also known that elastomer series adhesive mass exhibit a rubber elasticity.

Such adhesive mass is preferred because it makes it possible to instantly fix the covered wire to the substrate. Specific preferable examples of such adhesive mass thermoplastic acrylic resins and silicone rubber series elastomers.

In the case where the fixing member is made to have a bond performance using aforesaid adhesive mass, it is preferred for the bonding face thereof with the covered wire to be made such that there is not occurred a situation in that the bonding face overlaps the face of the covered wire to which the energy beam is radiated to impede the cover removal. It is also preferred to be made to prevent occurrence of a situation in that the fixing member is projected into the incident path of the energy beam to impede the radiation of the energy beam to the covered wire.

In the case where a body comprising the foregoing adhesive mass is used as the fixing member it has a moderate elasticity and an improved resistance against the thermal expansion of the covered wire. However, these characteristics are diminished as the thickness of the adhesive mass as the fixing member between the covered wire and the substrate is thinned.

Therefore, in order to maintain the thickness of the adhesive mass at a suitable magnitude, as shown in FIG. 15(*c*), it is preferred to use a double-coated adhesive tape 1703 comprising a base member 1703*b* whose opposite surfaces are coated by an adhesive layer 1703*a*. Because of the presence of the base member 1703*b*, it is possible to prevent the thickness of the adhesive layer between the base member and the substrate 702 from being thinned, where the adhesive layer maintains its moderate elasticity. And the use of the double-coated adhesive tape serves to facilitate the arrangement the fixing member.

As the base member, there be mentioned resin films made of a resin such as polyethylene terephthalate, polyimide, or polyethylene naphthalate. These films are preferable be cause they have a moderate elasticity.

Now, the energy beam 1604 for the cover removal is radiated to the covered wire 1601 (see. FIG. 14), where it is occasionally radiated also the fixing member 1603. In this respect, the fixing member is preferred to have a strength with a proper magnitude such that the fixing member is not damaged when the energy beam is radiated thereto. It is also preferred that the fixing member is low in terms of the energy transmissivity and the energy absorptivity for the energy beam and is high in terms of the reflectance for the energy beam.

In order to efficiently conduct the cover removal while preventing the fixing member from being damaged, it is effective that the ratio of the energy absorptivity of the fixing member to that of the cover of the covered wire (the energy absorptivity of the fixing member/ the energy absorptivity of the cover) is in a range 0.0001 to 0.9999

ENERGY BEAM 1604

As the energy beam 1604, any energy beam can be adopted as long as it imparts an energy flow capable of being absorbed by the cover 1601*b* of the covered wire 1601. The energy beam can include, for example, magnetic wave, electron beam, ion beam, and the like. However, in view of handing easiness, magnetic wave is generally used. Particularly, it is preferred to use laser bean of an appropriate laser which makes it possible to readily increase the energy density and to conduct spot-like radiation. Such laser can include, for example, YAG laser such as solid-state laser, $CO_2$ laser, and the like, eximer laser such as gas laser, and the like. Besides, liquid laser and semiconductor laser are also usable. In any case, it is preferred to use an appropriate laser having a long wavelength which is readily absorbed by a prescribed cover portion of the cover of the covered wire which is intended to remove. However, depending on the kind of laser, even when it has a long wavelength which meets the high energy absorptivity of the cover of the covered wire, there will be an occasion in that it is difficult to sufficiently increase the energy density and because of this, the cover removal cannot be sufficiently performed.

YAG laser is particularly preferred in the present invention for the following reasons. That is, YAG laser has a wavelength in an infrared ray region which is readily absorbed by various materials. And by adding modulation upon the oscillation by means of a Q-switch, the energy density can be readily increased.

In the process of removing aforesaid prescribed cover portion of the cover of the covered wire, when laser beam having a high energy density is instantly radiated to the prescribed cover portion, it is possible to prevent the remaining cover portion of the cover of the covered wire from suffering the influence from said radiation of the laser beam. In view of this, the modulated laser beam by the Q-switch is particularly effective. The laser beam an be selectively radiated to an exterior periphery of a prescribed cover portion of the cover of the covered wire which is intended to remove by scanning by means of the galvanometer mirror and condensing by means of the condenser lens.

In the following, the method of joining a covered wire with a conductor (an electrode) in the second aspect of the present invention will be detailed by illustrating a concrete embodiment of the method. It should be understood that the present invention is not restricted by this embodiment.

Figure 16:
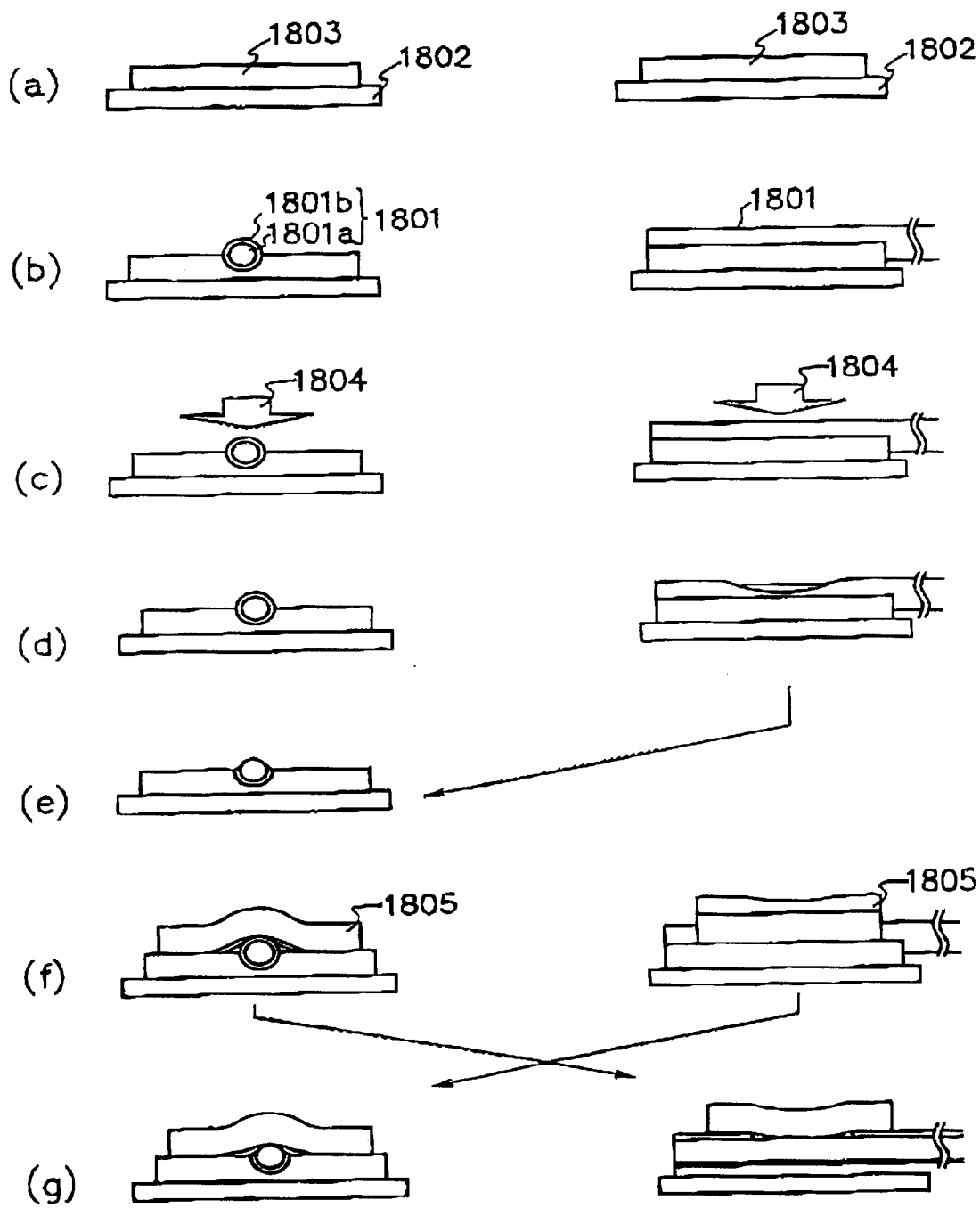
FIG. 16 is a schematic view for explaining a further embodied example of the present invention.

FIG. 16 is a schematic diagram for explaining an embodiment of the method of joining a covered wire with a conductor (an electrode).

FIG. 16, reference numeral 1801 indicates a covered wire comprising a wire 1801a (as a core wire) whose surface is covered by a cover 1801b, reference numeral 1802 a substrate, reference numeral 1803 a fixing member, reference 1804 energy beam, and reference numeral 1805 a conductor (an electrode).

In step 1 [see, FIG. 16(a)], the fixing member 1803 is fixed onto the substrate 1802.

In step 2 [see, FIG. 16(b)], at least part of the covered wire 1801 is fixed onto the substrate 1802 through the fixing member 1803.

In step 3 [see, FIG. 16(c)], energy beam 1804 is radiated to at least part of the covered wire 1801 which is fixed on the substrate 1802 through the fixing member 1803. By this, a cover portion of the cover 1801b of the covered wire 1801 to which the energy beam has been radiated is removed from the surface of the core wire 1801a of the covered wire 1801 to form an exposed wire portion [see, FIG. 16(d) and FIG. 16(e)].

In step 4, the conductor 1805 (the electrode) is joined with the cover-removed portion (the exposed wire portion) of the covered wire 1801 [see, FIG 16(g) and FIG. 16(g)].

The steps 1 to 3 are the same as those in the foregoing cover-removing method of the covered wire.

As above described, the cover portion of the cover of the covered wire which is situated on the incident side of the energy beam is removed to form the exposed wire portion by the steps 1 to 3. The covered wire is in a state that it is fixed to the substrate, and therefore, the cover-removed portion (the exposed wire portion) of the covered wire can be faced in a desired direction by handing the substrate, where it is possible for the conductor (the electrode) to be precisely press-contacted to and joined with the cover-removed portion (the exposed wire portion) of the covered wire in step 4.

Incidentally, in the case where the covered wire is extended in the air and a prescribed portion of one side face of the cover of the covered wire is removed by radiating the energy beam to said prescribed portion, the cover-removed portion of the covered wire is liable to dislocate due to distortion of the covered wire. Because of this, when the conductor (the electrode) is intended to precisely join with the cover-removed portion, it is necessary to newly adopt a manner of detecting the position of the cover-removed portion and press-contacting the conductor (the electrode) to the cover-removed portion while precisely handing the back side of the cover-removed portion, or otherwise, it is necessary to remove the entire circumferential region (including the prescribed portion) of the cover of the covered wire. Doing this is extremely difficult particularly in the case where the covered wire is fine. Further, in the case where after the covered wire is wound around the conductor (the electrode), the energy beam is radiated to a prescribed cover portion of the cover of the covered wire which is intended to remove as in the foregoing conventional method, the conductor (the electrode) is situated behind said prescribed cover portion where the residual cover portion remained without being removed is present between the cover-removed portion (that is, the exposed wire portion) and the conductor (the electrode), it is difficult to join the conductor (the electrode) with the exposed wire portion of the covered wire in a desirable state.

In the method of the present invention, it is possible that the cover-removed portion (the exposed wire portion) of the covered wire is precisely faced to the conductor (the electrode) side, and therefore, such difficulty is not occurred.

COVERED WIRE 1801

In the covered wire 1801 used in the joining method of the present invention is the same as that used in the foregoing cover-removing method of the covered wire

SUBSTRATE 1802

The substrate 1802 is used for fixing and retaining the covered wire 1801. As long as a composite structure provided by fixing the covered wire on the substrate through the fixing member has a superior rigidity which is surpassing that of the covered wire itself and functions to prevent the covered wire from being distorted, the present invention is effective. The substrate is not governed by its constituent material, size and structure. However, the joining method of the present invention is featured in that the covered wire is fixed onto the substrate having a large size and the handing performance of the substrate is improved, and therefore, the size of the substrate is preferred to be larger than that of the covered wire. Other related things of the substrate is the same as those described in the foregoing cover-removing method of the covered wire

FIXING MEMBER 1803

The fixing member 1803 used in the joining method of the present invention is the same as that used in the foregoing cover-removing method of the covered wire.

In the joining method, the fixing member is used for joining the conductor (the electrode) with the cover-removed portion of the covered wire. Particularly, the fixing member functions to fix the covered wire onto the substrate and it also functions to fix the conductor (the electrode) onto the substrate, where the fixing member makes it possible to fix the conductor (the electrode) and the covered wire while maintaining a state that the conductor (the electrode) is precisely press-contacted to the cover-removed portion (the exposed wire portion) of the covered wire.

ENERGY BEAM 1804

The energy beam 1804 used in the joining method of the present invention is the same as that used in the foregoing cover-removing method of the covered wire.

CONDUCTOR 1805

The conductor 1805 used in the joining method of the present invention may be any conductor as long as it comprises a material which transmits a thing which is the same as that the wire 1801a (the core wire) of the covered wire 1801 transmits. The present invention is not restricted by the material constituting the conductor.

In the case where the thing to be transmitted is light, the conductor is preferred to comprise a transparent material such as glass or the like. In the case where the thing to be transmitted is heat, the conductor is preferred to comprise an inorganic oxide material, a metal, or a semiconductor material. In the case where the thing to be transmitted is electromagnetic field, the conductor is preferred to comprise a material selected from a group consisting of metals. i.e., Cu, Al, Au, Ag, Fe, Sn, Pb, Zn, Ni, Cr, Mn, Mo, and W, and alloys of these metals or a material selected from a group consisting of inorganic oxide materials having a superconductor transition point and organic materials which are electrically conductive. The conductor which comprises any of these material may have a plated layer or a clad layer on the surface thereof, comprising a material selected those mentioned in the above which is different from the material constituting the conductor.

There is no particular limitation for the shape of the conductor. The shape of the conductor may be in a square timber form, a bar form, a foil forms or a wire form.

A specific examples of the conductor, there can be mentioned electrodes such as bus bar electrodes in the field of solar cell.

JOINING MANNER

As the manner of joining the covered wire and the conductor, there can be adopted any manner as long as it makes it possible to readily joining the conductor with the cover-removed portion of the covered wire by adequately butting the conductor and the covered wire to form a highly reliable joined portion between them. As specific examples of such manner, there can be mentioned a joining manner of joining them by intervening an adhesive material such as an ordinary solder, a silver solder, or a resin adhesive between them, a welding manner by mean of laser or resistance heating, and a bonding manner by means of ultrasonic waves. By fixing the conductor and the covered wire onto the substrate also upon joining the conductor and the covered wire, it is possible to stably for a desired joined portion between them.

The joining method of the present invention is effective particularly in the case of joining one conductor with a plurality of covered wires each having the foregoing cover-removed portion. Specifically, for instance, a plurality of covered wires each having a prescribed cover portion intended to remove are spacedly fixed onto the foregoing substrate (1802) through the foregoing fixing member (1803), then the foregoing energy beam (1804) is radiated to the prescribed cover portion of each of the covered wires to remove all the prescribed cover portions at the same time to form a cover-removed portion (an exposed wire portion) at each of the covered wire, and the foregoing conductor (1805) is joined with the cover-removed portion of each of the covered wires to form a joining portion between each of the covered wires and the conductor at the same time. In this way, the joining method of the present invention makes it possible to efficiently and readily form a plurality of joining portions between a plurality of covered wires and one conductor.

Particularly, the joining method of the present invention is effective in electrically joining a plurality of covered wires (which are used as a collecting electrode of a photovoltaic element) and a bus bar electrode (which is also used as an other electrode in the photovoltaic element).

FIG. 9 is a schematic diagram for explaining a process of forming an electrode structure on the light incident side of a photovoltaic element. In FIG. 9, reference numeral 1102a indicates a photovoltaic layer (a photoelectric conversion layer) of a photovoltaic element, and reference numeral 1022b a transparent electrically conductive layer formed on the photovoltaic layer 1102a.

For the simplification purpose, a combination of the photovoltaic, layer 1002a and the transparent electrically conductive layer 1102b will be expressed as a photovoltaic element.

As shown in FIG. 9, a collecting electrode comprising a plurality of fine covered wires 1101 each comprising a wire 1101a (a core wire) whose surface is covered by a cover 1101b is formed on the light incident side face of the photovoltaic element by spacedly arranging said covered wires 1101 at a given interval on the light incident face side of the photovoltaic element so that they do not obstruct incident light and bonding the covered wires 1101 on the light incident side face of the photovoltaic element.

As an example to form the collecting electrode said in this way, there is known a method in that a plurality wires (1101a) are provided, the surface of each of the wires is coated by an electrically conductive adhesive material to obtain a plurality of covered wires (1101) each comprising the wire (1101a) whose surface is covered by a cover (1101b) comprising the electrically conductive adhesive material, the covered wires (1101) are spacedly arranged at a given interval on the light incident side face of the photovoltaic element so that they do not obstruct incident light, and the covered wires (1101) are bonded on the light incident side face of the photovoltaic element to form the collecting electrode. As the above electrically conductive adhesive material, there is used a adhesive material having a low electrical conductivity, The covered wires (1101) which are arranged, and bonded on the light incident side face of the photovoltaic element as the collecting electrode is joined with a bus bar electrode 1105.

Now, an electric current which is collected by the collecting electrode is then collected by the bus bar electrode 1105 and guided outside the photovoltaic element by the bus bar electrode 1105. In this connection, there is a tendency in that the collected electric current is converged at a joining portion between the collecting electrode and the bus bar electrode, and because of this, the joule loss at the joining portion is increased. In order to improve this situation, it is necessitated that a prescribed cover portion of the cover of each of the covered wires (1101) is removed to form a cover-removed portion (an exposed wire portion) at each of the covered wires, and soon after this, the bus bar electrode is surely joined with all the cover-removed portions, for instance, through a material having a high electric conductivity. In this case, it is required to surely join the bus bar electrode with all the cover-removed portions of the covered wires so that all the joining portions between the bus bar electrode and the covered wires have a sufficiently low electric resistance.

The joining method of the present invention enables one to satisfactorily attain this purpose.

The present invention will be described in more detail with reference to examples which will be described below. It should be understood that these examples are only for illustrative purposes but not intended to restrict the scope of the invention only to them.

In the following, Examples 1 to 5 are of the foregoing first aspect of the present invention, and Examples 6 to 20 are of the foregoing second aspect of the present invention.

EXAMPLE 1

Figure 1B:
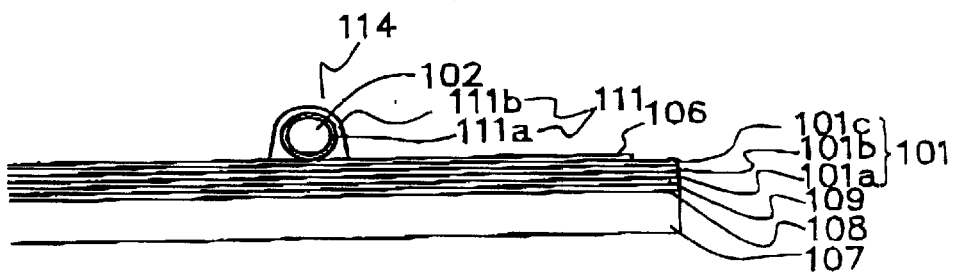
FIG. 1(b) is a schematic cross-sectional view, taken along the line A–A' in FIG. 1(a).
Figure 1C:
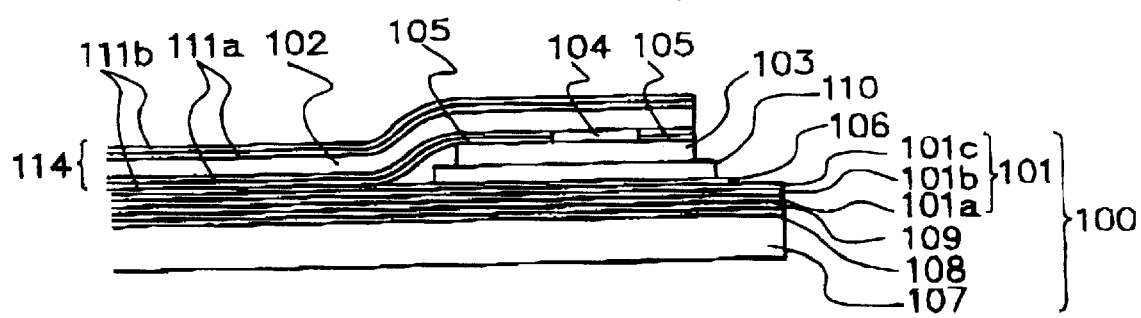
FIG. 1(c) is a schematic cross-sectional view, taken along the line B–B' in FIG. 1(a).

In this example, there was prepared a photovoltaic element (a solar cell) having such configuration as shown in FIGS. 1(a) to 1(c).

FIG. 1(a) is a schematic top view of an example of a photovoltaic element of the present invention. FIG. 1(b) is a schematic cross-sectional view, taken along the line A–A' in FIG. 1(a). FIG. 1(c) is a schematic cross-sectional view, taken along the line B–B' in FIG. 1(a).

In FIGS. 1(a) to 1(c), reference numeral 100 indicates a photovoltaic element which an aluminum layer 108 as a back reflecting layer, a zinc oxide layer 109 as a lower electrode layer and a photovoltaic layer 101 (a photoelectric conversion semiconductor layer) stacked in this order on a substrate 107. The photovoltaic layer 101 has a triple cell structure comprising a bottom p-i-n junction layer 101a, a middle p-i-n junction layer 101b, and a top p-i-n junction layer 101c being stacked in this order from the side of the substrate 107.

Reference numeral 106 indicates a transparent electrically conductive formed on the front surface of the photovoltaic layer 101. The transparent electrically conductive 106 is not always necessary to be provided.

Reference numeral 103 indicates an electrode, reference numeral 104 a first joining portion, and reference numeral 105 a second joining portion. Reference numeral 114 indicates a covered wire as a collecting electrode, comprising a wire 102 (a core wire) whose surface is covered by a two-layered cover 111 comprising an inner layer 111a and an outer layer 111b. Reference numeral 110 indicates a double-coated adhesive tape, reference numeral 112 a positive power output electrode, and reference numeral 113 a negative power output electrode.

The photovoltaic element in this example was prepared as will be described below.

1. Preparation of Covered Wire 114

The covered wire 114 was prepared by coating the surface of a metal wire as the core wire 102 by an electrically conductive resin cover 111, using a roll coater for the preparation of an enamel wire. The electrically conductive resin cover 111 was made to have a two-layered structure comprising an inner resin layer 111a for blocking metal ion from mobilizing and an outer resin layer 111b for bonding and fixing the wire 102 on the photovoltaic layer 101 and also on the electrode 103.

Specifically, the covered wire 114 was prepared as will be described blow.

There was provided a long silver-coated copper wire having a diameter of 4 to 5 mm. This silver-coated copper wire was introduced into a wire-drawing apparatus, where it was subjected to wire-drawing treatment to obtain an elongated silver-coated copper wire having a diameter of 100 $\mu$m as the wire 102. This elongated silver-coated copper wire was wound on a bobbin.

The bobbin having the elongated silver-coated copper wire wound thereon was set to a roll-to-roll type washing apparatus provided with a washing vessel. In the washing apparatus, the silver-coated copper wire was paid out from the bobbin and it was continuously delivered to pass through the washing vessel while being taken up by and wound on a take-up bobbin, where in the washing vessel, the foreign matter including oil material, then dried.

The bobbin having the cleaned silver-coated copper wire wound thereon was taken out from the washing apparatus and it was set to a first roll coater provided with a treating vessal in which a felt containing an electrically conductive resin material therein is provided. In the first roll coater, the silver-coated copper wire was paid out from the bobbin and it was continuously delivered to pass through the treating vessel while being taken up by and wound on a take-up bobbin, where in the treating vessel the surface of the silver-coated copper wire was coated with the electrically conductive resin material, then dried, whereby a resin material coat as the inner resin layer 111a was formed on the surface of the silver-coated copper wire.

As the above electrically conductive resin material, there was used an electrically conductive resin material obtained by together introducing 33 parts by weight of carbon black, 6.4 parts by weight of butyral resin, 4.2 parts of cresol resin, 4.2 parts by weight of phenol resin, 4.2 parts by weight of aromatic hydrocarbon resin. 18 parts by weight of diol isocyanate (as a curing agent), 18 parts by weight of xylene (as a solvent), 12 parts by weight of diethylene glycol monomethyl ether (as a solvent), 3.6 parts by weight of cyclohexanone (as a solvent), and 0–7 part by weight of γ-mercaptopropyltrimethoxysilane (as a coupling agent) into a paint shaker and subjecting the materials introduced in the paint shaker to mixing and dispersing treatment.

The bobbin having the thus treated silver-coated copper-wire wound thereon was taken out from the first roll coater, and it was set to a treating apparatus having a drying furnace. In the treating apparatus, the silver-coated copperwire was paid out from the bobbin and it was continuously delivered to pass through the drying furnace while being taken up by and wound on a take-up bobbin, where prior to entering in the drying furnace, unnecessary resin material on the silver-coated copper wire was removed using a dies, and in the drying furnace, the resin material coat formed on the silver-coated copper wire was completely cured. In this case, by properly adjusting the transportation speed of the silver-coated copper wire having the resin material coat as the inner resin layer 111a and also properly adjusting the size of the dies, the thickness of the resin material coat of the silver-coated copper wire was made to be 5 $\mu$m.

The bobbin having the silver-coated copper wire with the inner resin layer 111a wound thereon was set to a second roll coater provided with a treating vessel in which a felt containing an electrically conductive resin material therein is provided. In the second roll coater, the silver-coated copperwire was paid out from the bobbin and it was continuously delivered to pass through the treating vessel while being taken up by and wound on a take-up bobbin, where in the treating vessel, the surface of the silver-coated copper wire was coated with the electrically conductive resin material, then dried, whereby a resin material coat as the outer resin layer 111b was formed on the surface of the previously formed inner resin layer 111a on the silver-coated copper wire.

As the above electrically conductive resin material, there was used an electrically conductive resin material obtained by together introducing 35 parts by weight of carbon black, 41 parts by weight of urethane resin, 14 parts of phenoxy resin, 6 parts by weight of hydrogen-added diphenylmethane isocyanate (as a curing agent), 4 parts by weight of aromatic solvent (as a solvent), and 0.7 part by weight of γ-mercaptopropyltrimethoxysilane (as a coupling agent) into a paint shaker and subjecting the materials introduced in the paint shaker to mixing and dispersing treatment.

The bobbin having the thus treated silver-coated copper wire wound thereon was taken out from the second roll coater, and it was set to a treating apparatus having a drying furnace. In the treating apparatus the silver-coated copper wire was paid out from the bobbin and it was continuously delivered to pass through the drying furnace while being taken up by and wound on a take-up bobbin, where prior to entering in the drying furnace, unnecessary resin material on the silver-coated copper wire was removed using a dies, and in the drying furnace, the resin material coat formed on the surface of the inner resin layer 111a of the silver-coated copper wire was subjected to semi-curing treatment. In this case, by properly adjusting the transportation speed of the silver-coated copper wire having the resin material coat as the outer resin layer 111b on the inner resin layer 111a and also properly adjusting the size of the dies, the thickness of the resin material coat as the outer resin layer 111b of the silver-coated copper wire was made to be 25 μm.

Thus, there was obtained a covered wire 114 comprising the silver-coated copper wire 102 (the core wire) whose surface is covered by a two-layered cover 111 comprising the inner resin layer 111a and the outer resin layer 111b.

A test sample was obtained from the resultant covered wide 114. For the test sample, the cross section and surface thereof were examined by means of a scanning electron microscope (SEM). As a result, the two-layered cover 111 was found to be uniform with respect to the inner resin layer 111a and the outer resin layer 111b and have no pinhole.

2. Preparation of Photovoltaic Element:

(1). There was provided an elongated substrate web made of stainless steel of 150 μm in thickness and 36 cm in width, having a 2000 Å thick Al film as a back reflecting layer 108 and a 1 μm thick ZnO film as a lower electrode layer 109 formed in this order by a conventional sputtering process, which is wound on a reel.

The reel was set to a conventional roll-to-roll type microwave plasma CVD apparatus having a plurality of film-forming chambers communicated with each other between a load chamber and an unload chamber, where a bottom cell 101a comprising an n-type semiconductor layer, an i-type semiconductor layer, and a p-type semiconductor layer respectively comprising an amorphous silicon (a-Si) semiconductor material; a middle cell 101b comprising an n-type semiconductor layer, an i-type semiconductor layer, and a p-type semiconductor layer respectively comprising an a-Si semiconductor material; and a top cell 101c comprising an n-type semiconductor layer, an i-type semiconductor layer, and a p-type semiconductor layer respectively comprising an a-Si semiconductor material were continuously formed in this order to form a photovoltaic layer 101 on the surface of the lower electrode layer 109 of the substrate web which was transporting from the load chamber to pass through the plurality of film-forming chambers and enter in the unload chamber where the substrate web was taken up on and wound on a take-up reel.

The reel having the substrate web wound thereon was taken out from the plasma CVD apparatus, and it was set to a conventional roll-to-roll type sputtering apparatus, where a 700 Å thick ITO film as a transparent electrically conductive layer 106 capable of functioning also as a light reflection preventive layer was continuously formed on the surface of the photovoltaic layer 101 of the substrate web at a film-forming temperature (a substrate temperature) of 450° C.

The substrate web having the transparent electrically conductive layer 106 thus formed on the photovoltaic layer 101 was cut to obtain 100 photovoltaic elements having a size of 36 cm (width)×24 cm (length).

Figure 2:
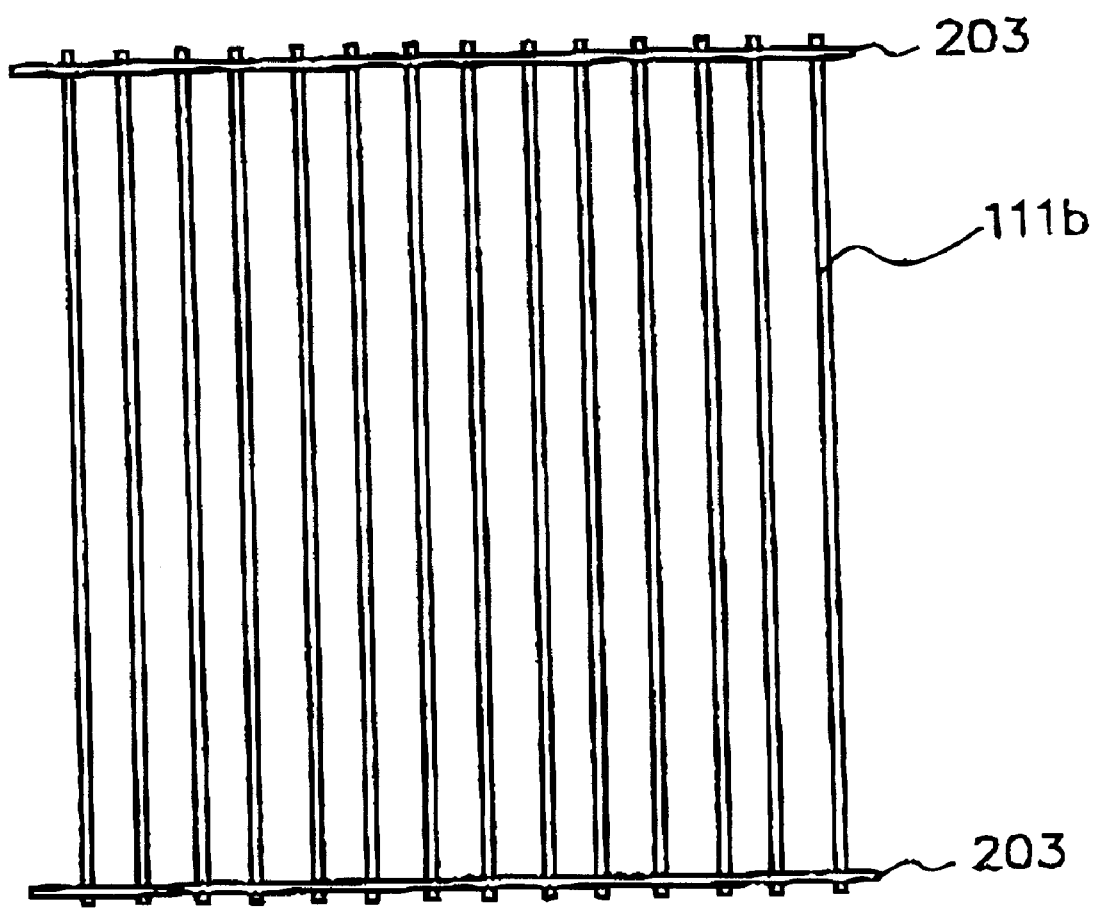
FIG. 2 is a schematic plan view illustrating an example of an arrangement of wires, for instance, in a photovoltaic element, of the present invention.

For each of the photovoltaic elements obtained, a peripheral region of 1 mm in width of the transparent electrically conductive layer 106 was removed by an electrolytic etching method of impressing an electric field between the photovoltaic element having a patterning mask superposed thereon and a counter electrode in an aqueous sulfuric acid solution (2). There was established a wire arrangement by arranging the covered wire obtained in the above step 1 as shown in FIG. 2. In FIG. 2, reference numeral 111b indicates the outer resin layer of the cover 111 of the covered wire, reference numeral 203 a scanning area to which laser beam is to be radiated.

For the cover 111 of each of the covered wires in the wire arrangement, only its one side cover portion of 2 mm along the longitudinal direction was selectively removed to form a cover-removed portion (an exposed wire portion) at the covered wire by radiating YAG laser beam modulated by the Q-switch to the scanning area 203 from above using a galvanometer scanner (working distance: 145 mm) having a rotary mirror. The laser radiation conditions in this case were 10 W for the output power (measured by a thermopile type probe), 50 kHz for the pulse frequency, several n seconds for the pulse width, 2000 mm/second for the scanning speed, about 100 μm for the radius of spot size, and 15 mm for the defocus.

In this way, for each of the covered wires in the wire arrangement there was formed a cover-removed portion (an exposed wire portion) at each of the opposite end sides.

examination was conducted of the cover-removed portions by a X-ray diffractometer of SEM. As a result, in any of them, the surface of the core wire was exposed in a state with no residual resin cover material.

It is understood that this cover removing method can be conducted very selectively and at a higher speed in comparison with the conventional cover-removing method by way of chemical treatment or using a sand paper.

(3). For each of the photovoltaic elements obtained in the above step (1), on each of the opposite side portions of the photovoltaic layer 101 where the transparent electrically conductive layer 106 is not present, a double-coated adhesive tape 110 having a width of 7 mm and a length of 24 cm (comprising a 50 μm thick PET film as a base member sandwiched between a pair of silicone adhesive material) was bonded, and a copper foil of 100 μm in thickness, 5 mm in width and 24 cm in length as the electrode 103 was affixed onto the double-coated adhesive tape 110.

Then, the wire arrangement obtained in the above step (2) was arranged on the surface of the photovoltaic element so that the two cover-removed portions of each covered wire 114 were contacted respectively with the corresponding electrode 110 as shown in FIG. 1(c), and the resultant as subjected to thermocompression bonding treatment using a thermocompression apparatus, where the outer resin layer 111b in the semi-cured state of the covered wire 114 was completely cured, whereby the covered wire 114 was bonded to the electrode 103 such that the cover-removed portion of the covered wire 114 was contacted with the electrode 103 to form a fist joining portion 104 between the wire 102 of the covered wire 114 and the electrode 103. At this time, there is formed also a second joining portion 105 between the wire 102 of the covered wire 114 and the electrode 103.

The first joining portion 104 was formed by supplying a 6:4 solder into the cover-removed portion of the covered wire 114 in contact with the electrode 103 and heating the solder in the cover-removed portion by means of a soldering iron. By this, electrical continuity between the wire 102 of the covered wire 114 and the electrode 103 was realized also at the second joining portion 105 and as a result, the formation of the second joining portion 105 was completed. The amount of the solder supplied into each cover-removed portion was 0.1 g.

By adopting the above constitution, there could be very efficiently formed the first joining portion 104 to an irreducible minimum extent for outputting a power and the second joining portion 105 for protecting the first joining portion 104 from suffering a stress.

For the electrically conductive resin over 111 of the covered wire 114, examination was conducted with respect to its characteristics. As a result, the electrically conductive resin cover was found to have a glass transition point of 110° C. and a resistivity of 7.2 Ω·cm.

Then, for each photovoltaic element having such electrode structure as above described, a positive power output electrode 112 and a negative power output electrode 113 were connected by way of soldering.

In this way, there were obtained 100 triple cell type photovoltaic elements.

Evaluation

For the resultant triple cell type photovoltaic elements, some of them were randomly selected, and they were evaluated as will be described below.

1. Evaluation of Initial Characteristics (1). For each photovoltaic element, there was measured its I–V characteristics in dark state to obtain an I–V characteristic curve. From the gradient near the origin of the I–V characteristic curve, there was obtained a shunt resistance. As a result, the shunt resistance on the average was 200 kΩ·cm². Thus, it was found that substantially no shunt is occurred in each case.

(2). For each photovoltaic element, there was measured its I–V characteristics using a pseudo sunlight simulator (produced by SPIRE Company) in which a pseudo sunlight having a global sunlight spectrum of AM 1.5 with an intensity of 100 mW/cm² is used, and based on the I–V characteristics, there was obtained a photoelectric conversion efficiency. As a result, each of the photovoltaic elements was found to have an initial photoelectric conversion efficiency of 9.0±0.2%. The variation of the photoelectric conversion efficiency among the photovoltaic elements was slight. In addition, the yield was found to be 98%.

2. Mechanical Loading Test

For each of the photovoltaic elements which have been subjected to the evaluation in the above 1, in order to its resistance to stress, each photovoltaic element was subjected to the mechanical loading test of repeating a cycle of applying a load with a radius of curvature of 2 mm upwards and downwards for 5 seconds 10000 times.

After this, for each of the photovoltaic elements having began endured in this way, its photoelectric conversion efficiency was evaluated in the same manner as in the above 1. As a result, a change between the initial photoelectric conversion efficiency and the photoelectric conversion efficiency after the endurance was found to be less than 1.0% on the average. Based on this fact, it is understood that any of the photovoltaic elements is substantially not deteriorated with respect to the characteristics even when severe load is repeatedly applied thereon.

For each of the photovoltaic elements after the endurance, its upper electrode structure was examined. As a result, substantially no rupture was found at the wire 102 in the vicinity of the first joining portion 104 in any case.

3. Temperature-humidity Cycle Test

Separately using each of the photovoltaic elements having been subjected to the mechanical loading test in the above 2, there was obtained a photovoltaic element module by stacking a 460 μm thick EVA sheet, the photovoltaic element, and a 460 μm thick EVA sheet in this order on a 0.4 mm thick galvanized steel sheet to obtain a stacked body and subjecting to thermocompression bonding treatment under reduced pressure. In this way, there were obtained a plurality of photovoltaic element modules. Each of the photovoltaic element modules was subjected to reliability test based on the temperature-humidity cycle test stipulated in the environmental test method and durability test method of JIS C8917.

Specifically, the photovoltaic element module was positioned in a thermo-hygrostat capable of controlling the temperature and humidity, where the photovoltaic element module was subjected a cycle test of repeating a cycle of maintaining the photovoltaic element module in an atmosphere with −40° C. and maintaining the photovoltaic element module in an atmosphere with 85° C./RH 85% 20 times.

After this, for the photovoltaic element in each of the photovoltaic element modules having been endured in this way, its photoelectric conversion efficiency was evaluated in the same manner as in the above 1. As a result, a change between the initial photoelectric conversion efficiency in the evaluation in the above 1 and the photoelectric conversion efficiency after the endurance was found to be less than 2.0% on the average. Based on this fact, it is understood that the photovoltaic element in each of the photovoltaic element modules is substantially not deteriorated with respect to the characteristics even after the photovoltaic element module has been repeatedly exposed severe environment.

4. Mechanical Loading Test

For each of the photovoltaic element modules which have been subjected to the endurance test in the above 3, in order to its resistance to stress, each of the photovoltaic element modules was subjected to the mechanical loading test of repeating a cycle of applying a load with a radius of curvature of 2 mm upwards and downwards for 5 seconds 10000 times.

After this, for the photovoltaic element in each of the photovoltaic element modules having been endured in this way, its photoelectric conversion efficiency was evaluated in the same manner as in the above 1. As a result, a change between the initial photoelectric conversion efficiency in the evaluation of the above 1 and the photoelectric conversion efficiency after the endurance was found to be less than 3.0% on the average. Based on this fact, it is understood that the photovoltaic element in each of the photovoltaic element modules is still maintained in a desirable state with no substantial deterioration with respect to the characteristics.

Based on the above results, it is understood that a photovoltaic element having the electrode structure of the present invention has good characteristics which are hardly deteriorated and excels in reliability.

COMPARATIVE EXAMPLE 1

The procedures of Example 1 were repeated, except for the following points, to obtain 100 triple cell type photovoltaic element.

In the step 2-(2) of Example 1, for the cover 111 of each of the covered wires in the wire arrangement, only its one side cover portion of 7 mm along the longitudinal direction was removed to form a cover-removed portion. By using this cover-removed portion, the wire 102 (the exposed wire portion) was joined with the electrode 103 only by means of the solder, and because of this, no second joining potion was established. Specifically, in this case, the wire 102 and the electrode are joined by only one joining portion in which the solder is used. In addition, the cover removal to form the cover-removed portion was conducted by a manner of coating a cover-removing chemical by mean of a coating brush and swabbing the chemical by means of a paper towel. This method required much labor and became a cause of decreasing the yield.

Evaluation

For the resultant photovoltaic elements, some of them were randomly selected, they were evaluated in the same manner as in Example 1.

1. Each of the photovoltaic elements was evaluated with respect to its initial characteristics in the same manner as in the evaluation 1 of Example 1. Specifically, the shunt resistance of each photovoltaic element was measured. As a result, the shunt resistance on the average was 200 kΩ·cm². Thus, it was found that substantially no shunt is occurred. then, for each photovoltaic element, there was measured I–V characteristics, and based on the I–V characteristics, there was obtained a photoelectric conversion efficiency. As a result, each of the photovoltaic elements was found to have an initial photoelectric conversion efficiency of 9.0±0.2%. The variation of the photoelectric conversion efficiency among the photovoltaic elements was slight. In addition, the yield was found to be 98%.

For each of the photovoltaic elements which have been subjected to the evaluation in the above 1, in order to its resistance to stress, each photovoltaic element was subjected to the mechanical loading test in the same manner as in the evaluation 2 of Example 1.

For each of the photovoltaic elements having been endured in this way, its photoelectric conversion efficiency was evaluated in the same manner as in the evaluation 1 of Example 1. As a result, a change between the initial photoelectric conversion efficiency and the photoelectric conversion efficiency after the endurance was found to be 5.0% on the average. Based on this fact, each of the photovoltaic elements was found to be markedly deteriorated in comparison with Example 1.

For each of the photovoltaic elements after the endurance, its upper electrode structure was examined. As a result, in 10% of the covered wires in the wire arrangement, distinguishable rupture was found at each of their root portions of the joining portions comprising the solder only. It is considered that this situation is a main cause for the above deterioration.

3. Using each of the photovoltaic elements having been subjected to the mechanical loading test in the above 2, there was obtained a photovoltaic element module in the same manner as in the evaluation 3 of Example 1. Each of the resultant photovoltaic element modules was subjected to the reliability test in the same manner as in the evaluation 3 of Example 1. After this, for the photovoltaic element in each of the photovoltaic element modules having been endured in this way, its photoelectric conversion efficiency was evaluated in the same manner as in the evaluation 1 of Example 1. As a result, a change between the initial photoelectric conversion efficiency in the evaluation in the above 1 and the photoelectric conversion efficiency after the endurance was found to be 9.0% on the average.

4. For each of the photovoltaic element modules which have been subjected to the endurance test in the above 3, in order to its resistance to stress, each of the photovoltaic element modules was subjected to the mechanical loading test in the same manner as in the evaluation of Example 1.

After this, for the photovoltaic element in each of the photovoltaic element modules having been endured in this way, its photoelectric conversion efficiency was evaluated in the same manner as in the evaluation 1 of Example 1. As a result, a change between the initial photoelectric conversion efficiency in the evaluation of the above 1 and the photoelectric conversion efficiency after the endurance was found to be 15% on the average.

For the photovoltaic element in each of the photovoltaic element modules after the endurance, its upper electrode structure was examined. As a result, in 30% of the covered wires in the wire arrangement, distinguishable rupture was found at each of their root portions of the joining portions comprises the solder only.

When the results of Example 1 are compared with those of comparative Example 1, it is understood that the present invention is significantly superior in terms of the effects.

COMPARATIVE EXAMPLE 2

The procedures of Example 1 were repeated, except that such cover-removed portion as in Example 1 was not formed and the joining by means of the solder with the electrode was not conducted, that is, the wire 302 and the electrode 103 were joined by way of one joining portion comprising the electrically conductive resin material, to obtain 100 triple cell type photovoltaic elements.

Evaluation

For the resultant photovoltaic elements, some of them were randomly selected, they were evaluated in the same manner as in Example 1.

1. Each of the photovoltaic elements was evaluated with respect to its initial characteristics in the same manner as in the evaluation 1 of Example 1. Specifically, the shunt resistance of each photovoltaic element was measured. As a result, the shunt resistance on the average was 300 kΩ·cm². Thus, it was found that substantially no shunt is occurred. And the electric resistance of each joining portion of the wire with the electrode by means of the resin material cover of the wire was found to be 0.4±0.1 Ω.

Then, for each photovoltaic element, there was measured I–V characteristics, and based on the I–V characteristics, there was obtained a photoelectric conversion efficiency. As a result, each of the photovoltaic elements was found to have an initial photoelectric conversion efficiency of 8.5±0.2%. The variation of the photoelectric conversion efficiency among the photovoltaic elements was slight. In addition, the yield was found to be 97%.

2. For each of the photovoltaic elements which have been subjected to the evaluation in the above 1, in order to its resistance to stress, each photovoltaic element was subjected to the mechanical loading test in the same manner as in the evaluation 2 of Example 1.

For each of the photovoltaic elements having been endured in this way, its photoelectric conversion efficiency was evaluated in the same manner as in the evaluation 1 of Example 1. As a result, a change between the initial photoelectric conversion efficiency and the photoelectric conversion efficiency after the endurance was found to be 6.0% on the average. Based on this fact, each of the photovoltaic elements was found to be markedly deteriorated in comparison with Example 1.

For each of the photovoltaic elements after the endurance, its upper electrode structure was examined. As a result, in 13% of the joining portions of the wires and the electrode by means of the electrically conductive resin material covers of the wires in each case, their electric resistance value was found to be increased by more than three times of their initial electric resistance value. It is considered that this situation is a main cause for the above deterioration.

3. Using each of the photovoltaic elements having been subjected to the mechanical loading test in the above 2, there was obtained a photovoltaic element module in the same manner as in the evaluation 3 of Example 1. Each of the resultant photovoltaic element modules was subjected to the reliability test in the same manner as in the evaluation 3 of Example 1. After this, for the photovoltaic element in each of the photovoltaic element modules having been endured this way, its photoelectric conversion efficiency was evaluated in the same manner as in the evaluation 1 of Example 1. As a result, a change between the initial photoelectric conversion efficiency in the evaluation in the above 1 and the photoelectric conversion efficiency after the endurance was found to be 11% on the average.

4. For each of the photovoltaic element modules which have been subjected to the endurance test in the above 3, in order to its resistance to stress, each of the photovoltaic element modules was subjected to the mechanical loading test in the same manner as in the evaluation 4 of Example 1.

After this, for the photovoltaic element in each of the photovoltaic element modules having been endured in this way, its photoelectric conversion efficiency was evaluated in the same manner as in the evaluation 1 or Example 1. As a result, a change between the initial photoelectric conversion efficiency in the evaluation or the above 1 and the photoelectric conversion efficiency after the endurance was found to be 20% on the average.

For the photovoltaic element in each of the photovoltaic, element modules after the endurance, its upper electrode structure was examined. As a result, in 40% of the joining portions of the wires and the electrode by means of the electrically conductive resin material covers of the wires in each case, their electric resistance value was found to be increased by more than five times of their initial electric resistance value.

When the results of Example 1 are compared with those of Comparative Example 2, it is understood that the present invention is significantly superior in terms of the effects.

EXAMPLE 2

The procedures of Example 1 were repeated, except that no coupling agent was used in the electrically conductive material constituting the outer resin layer $111b$, to obtain 100 triple cell type photovoltaic elements.

Now, because no coupling agent was used in the electrically conductive material constituting the outer resin layer $111b$, the adhesion of the outer resin layer $111b$ was inferior to that of the outer resin layer $111b$ in Example 1.

Evaluation

For the resultant photovoltaic elements, some of them were randomly selected, they were evaluated in the same manner as in Example 1.

1. Each of the photovoltaic elements was evaluated with respect to its initial characteristics in the same manner as in the evaluation 1 of Example 1. Specifically, the shunt resistance of each photovoltaic element was measured. As a result, the shunt resistance of the average was 200 k$\Omega \cdot$cm$^2$. Thus, it was found that substantially no shunt is occurred.

Then, for each photovoltaic element, there was measured I–V characteristics, and based on the I–V characteristics, there was obtained a photoelectric conversion efficiency. As a result, each of the photovoltaic elements was found to have an initial photoelectric conversion efficiency of 9.0±0.2%. The variation of the photoelectric conversion efficiency among the photovoltaic elements was slight. In addition, the yield was found to be 98%.

2. For each of the photovoltaic elements which have been subjected to the evaluation in the above 1, in order to its resistance to stress, each photovoltaic element was subjected to the mechanical loading test in the same manner as in the evaluation 2 of Example 1.

For each of the photovoltaic elements having been endured in this way, its photoelectric conversion efficiency was evaluated in the same manner as in the evaluation 1 of Example 1. As a result, a change between the initial photoelectric conversion efficiency and the photoelectric conversion efficiency after the endurance was found to be 1.0% on the average. Based on this fact, each of the photovoltaic elements was found to be substantially not deteriorated in terms of the photoelectric conversion efficiency.

3. Using each of the photovoltaic elements having been subjected to the mechanical loading test in the above 2, there was obtained a photovoltaic element module in the same manner as in the evaluation 3 or Example 1. Each of the resultant photovoltaic element modules was subjected to the reliability test in the same manner as in the evaluation 3 of Example 1. After this, for the photovoltaic element in each of the photovoltaic element modules having been endured in this way, its photoelectric conversion efficiency was evaluated in the same manner as in the evaluation 1 of Example 1. As a result, a change between the initial photoelectric conversion efficiency in the evaluation in the above 1 and the photoelectric conversion efficiency after the endurance was found to be 5.0% on the average which is apparently inferior to that in Example 1.

4. For each of the photovoltaic element module which have been subjected to the endurance test in the above 3, in order to its resistance to stress, each of the photovoltaic element modules was subjected to the mechanical loading test in the same manner as in the evaluation 4 of Example 1.

After this, for the photovoltaic element in each of the photovoltaic element modules having been endured in this way, its photoelectric conversion efficiency was evaluated in the same manner as in the evaluation 1 of Example 1. As a result, a change between the initial photoelectric conversion efficiency in the evaluation of the above 1 and the photoelectric conversion efficiency after the endurance was found to be 6.0% on the average For the photovoltaic element in each of the photovoltaic element modules after the endurance, its upper electrode structure was examined. As a result, the occurrence of rupture was found in 12% of the wires in the joining portions. It is considered that this situation is a main cause for the above deterioration.

When the results of Example 1 are compared with those of Example 2, apparent effects by incorporating the coupling agent in the electrically conductive material constituting the outer resin layer $111b$ can be understood.

EXAMPLE 3

The procedures of Example 1 were repeated, except that no butyral resin was used in the electrically conductive material constituting the outer resin layer $111a$ and no urethane resin was used in the electrically conductive material constituting the outer resin layer $111b$, to obtain, 100 triple cell type photovoltaic elements Now because no butyral resin was used in the electrically conductive material constituting the inner resin layer $111a$ and no urethane resin was used in the electrically conductive material constituting the outer resin layer $111b$, the elasticity of each of the inner resin layer $111a$ and the outer resin layer $111b$ was inferior to that of each of the inner resin layer $111a$ and the outer resin layer $111b$ in Example 1.

Evaluation

For the resultant photovoltaic elements, some of them were randomly selected, they were evaluated in the same manner as in Example 1.

1. Each of the photovoltaic elements was evaluated with respect to its initial characteristics in the same manner as in the evaluation 1 of Example 1. Specifically, the shunt resistance of each photovoltaic element was measured. As a result, the shunt resistance on the average was 200 kΩ·cm². Thus, it was found that substantially no shunt is occurred.

Then, for each photovoltaic element, there was measured I–V characteristics, and based on the I–V characteristics, there was obtained a photoelectric conversion efficiency. As a result, each of the photovoltaic elements was found to have an initial photoelectric conversion efficiency of 9.0±0.2%. The variation of the photoelectric conversion efficiency among the photovoltaic elements was slight. In addition, the yield was found to be 98%.

2. For each of the photovoltaic elements which have been subjected to the evaluation in the above 1, in order to its resistance to stress, each photovoltaic element was subjected to the mechanical loading test in the same manner as in the evaluation 2 of Example 1.

For each of the photovoltaic elements having been endured in this way, its photoelectric conversion efficiency was evaluated in the same manner as in the evaluation 1 of Example 1. As a result, a change between the initial photoelectric conversion efficiency and the photoelectric conversion efficiency after the endurance was found to be 3.0% on the average which is apparently inferior to that in Example 1. For each photovoltaic element after the endurance, its upper electrode structure was examined. As a result, the occurrence of rupture was found in 6% of the wires in the joining portions. It is considered that this situation is a main cause for the above deterioration.

3. Using each of the photovoltaic elements having been subjected to the mechanical loading test in the above 2, there was obtained a photovoltaic element module in the same manner as in the evaluation 3 of Example 1. Each of the resultant photovoltaic element modules was subjected to the reliability test in the same manner as in the evaluation 3 of Example 1. After this, for the photovoltaic element in, each of the photovoltaic element modules having been endured in this way, its photoelectric conversion efficiency was evaluated in the same manner as in the evaluation 1 of Example 1. As a result, a change between than initial photoelectric conversion efficiency in the evaluation in the above 1 and the photoelectric conversion efficiency after the endurance was found to be 7.0% on the average which is apparently inferior to that in Example 1.

4. For each of the photovoltaic element modules which have been subjected to the endurance test in the above 3, in order to its resistance to stress, each of the photovoltaic element modules was subjected to the mechanical loading test in the same manner as in the evaluation 4 of Example 1.

After this, for the photovoltaic element in each of the photovoltaic element modules having been endured in this way, its photoelectric conversion efficiency was evaluated in the same manner as in the evaluation 1 of Example 1. As a result, a change between the initial photoelectric conversion efficiency in the evaluation of the above 1 and the photoelectric conversion efficiency after the endurance was found to be 8.0% on the average.

For the photovoltaic element in each of the photovoltaic element modules after the endurance, its upper electrode structure was examined. As a result, the occurrence of rupture was found in 16% of the wires in the joining portions. It is considered that this situation is a main cause for the above deterioration.

When the results of Example 1 are compared with those of Example 3, it is understood that the incorporation of urethane resin into the electrically conductive material constituting the outer resin layer 111b or the incorporation of butral resin into the electrically conductive material constituting the inner resin layer 111a contributes in increasing the elasticity of the second joining portion.

EXAMPLE 4

The procedures of Example 1 were repeated, except that an aluminum wire was used as the wire (the core wire), to obtain 100 triple cell type photovoltaic elements.

Evaluation

For the resultant photovoltaic elements, some of them were randomly selected, they were evaluated in the same manner as in Example 1.

1. Each of the photovoltaic elements was evaluated with respect to its initial characteristics in the same manner as in the evaluation 1 of Example 1. Specifically, the shunt resistance of each photovoltaic element was measured. As a result, the shunt resistance on the average was 340 kΩ·cm². Thus, it was found that substantially no shunt is occurred in each case.

Then, for each photovoltaic element, there was measured I–V characteristics, and based on the I–V characteristics, there was obtained a photoelectric conversion efficiency. As a result, each of the photovoltaic elements was found to have an initial photoelectric conversion efficiency of 8.7±0.2%. The variation of the photoelectric conversion efficiency among the photovoltaic elements was slight. In addition, the yield was found to be 98%.

2. For each of the photovoltaic elements which have been subjected to the evaluation in the above 1, in order to its resistance to stress, each photovoltaic element was subjected to the mechanical loading test in the same manner as in the evaluation 2 of Example 1.

For each of the photovoltaic elements having been endured in this way, its photoelectric conversion efficiency was evaluated in the same manner as in the evaluation 1 of Example 1. As a result, a change between the initial photoelectric conversion efficiency and the photoelectric conversion efficiency after the endurance was found to be 3.0% on the average which is apparently inferior to that in Example 1. For each photovoltaic element after the endurance, its upper electrode structure was examined. As a result, the occurrence of rupture was found in 6% of the wires in the joining portions. It is considered that this situation is a main cause for the above deterioration.

3. Using each of the photovoltaic elements having been subjected to the mechanical loading test in the above 2 there was obtained a photovoltaic element module in the same manner as in the evaluation 3 of Example 1. Each of the resultant photovoltaic element modules was subjected to the reliability test in the same manner as in the evaluation 3 of Example 1. After this, for the photovoltaic element in, each of the photovoltaic element modules having been endured in this way, its photoelectric conversion efficiency was evaluated in the same manner as in the evaluation 1 of Example 1. As a result, a change between the initial photoelectric conversion efficiency in the evaluation in the above 1 and the photoelectric conversion efficiency after the endurance was found to be 7.0% on the average which is apparently inferior to that in Example 1.

For each of the photovoltaic element modules which have been subjected to the endurance test in the above 3, in order to its resistance to stress, each of the photovoltaic element modules was subjected to the mechanical loading test in the same manner as in the evaluation 4 of Example 1.

After this, for the photovoltaic element in each of the photovoltaic element modules having been endured in this way, its photoelectric conversion efficiency was evaluated in the same manner as in the evaluation 1 of Example 1. As a result, a change between the initial photoelectric conversion efficiency in the evaluation of the above 1 and the photoelectric conversion efficiency after the endurance was found to be 8.0% on the average.

For the photovoltaic element in each of the photovoltaic element modules after the endurance, its upper electrode structure was examined. As a result, the occurrence of rupture was found in 20% of the wires in the joining portions. It is considered that this situation is a main cause for the above deterioration.

When the results of Example 1 are compared with those of Example 4, it is understood that the effects in the case of using the wire comprising Cu are superior to those in the case of using the aluminum wire. For the reason for this, it is considered such that the ductility of Cu is greater than that of Al.

EXAMPLE 5

Figure 3A:
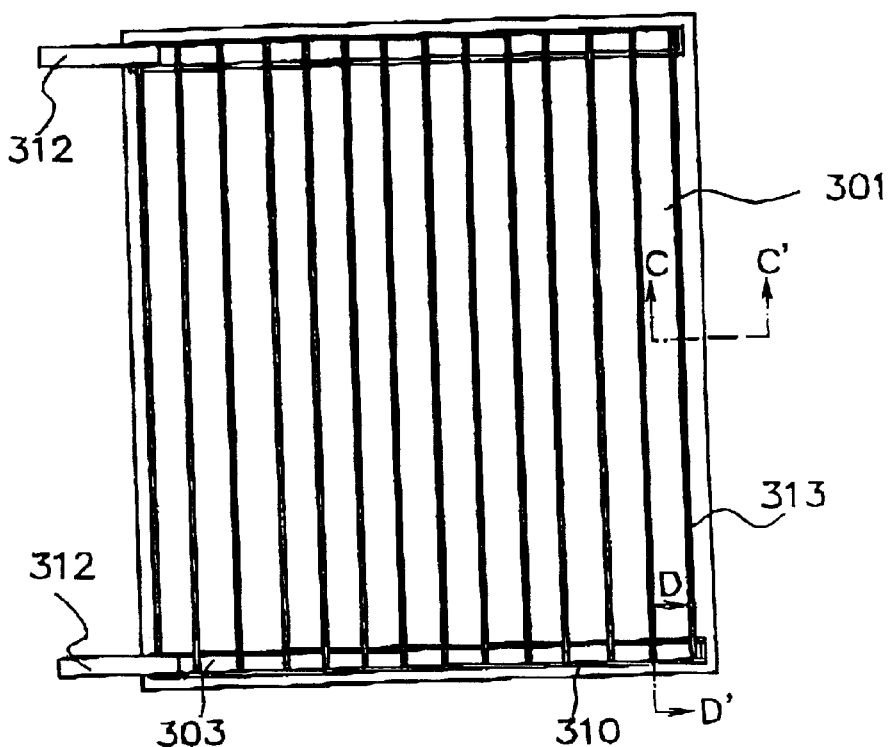
FIG. 3(a) is a schematic top view of another example of a photovoltaic element of the present invention.
Figure 3B:
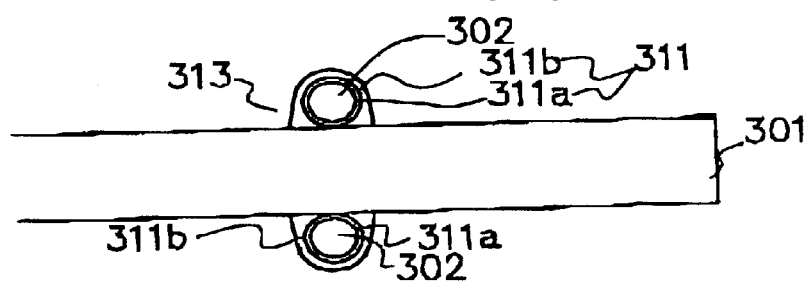
FIG. 3(b) is a schematic cross-sectional view, taken along the line C–C' in FIG. 3(a).
Figure 3C:
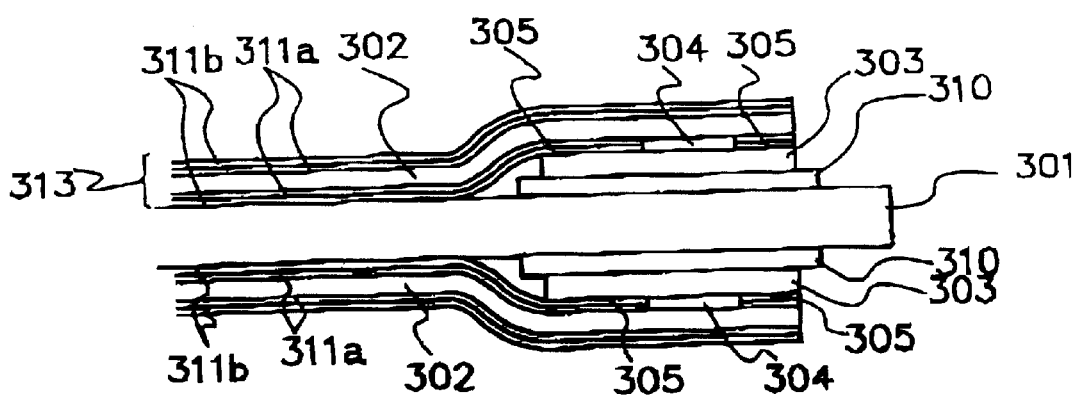
FIG. 3(c) is a schematic cross-sectional view, taken along the line D–D' in FIG. 3(a).

In this example, there was prepared a photovoltaic element having such configuration as shown in FIGS. 3(a) to 3(c). FIG. 3(a) is a schematic top view of an example of a photovoltaic element of the present invention. FIG. 3(b) is a schematic cross-sectional view, taken along the line C–C' in FIG. 3(a). FIG. 3(c) is a schematic cross-sectional view, taken along the line D–D' in FIG. 3(a).

In FIGS. 3(a) to 3(c), reference numeral 301 indicates a photovoltaic layer, reference numeral 302 a wire (a core wire), reference numeral 303 an electrode, reference numeral 304 a first joining portion, reference numeral 305 a second joining portion, and reference numeral 310 a double-coated adhesive tape. Reference numeral 313 indicates a covered wire as a collecting electrode, comprising, the wire 302 (the core wire) whose surface is covered by a two-layered cover 311 comprising an inner electrically conductive resin material layer 311a and an outer electrically conductive resin material layer 311b.

This example differs from Example 1 for the following points. The photovoltaic layer 301 comprises a 1 mm thick polycrystal silicon semiconductor having a semiconductor junction structure without such transparent electrically conductive layer, back reflecting layer, and stainless steel substrate as in Example 1. In this example, the electrode structure on the light incident side is substantially the same as that in Example 1. In this example, an electrode structure which is the same as that the light incident side was provided also on the back side of the photovoltaic layer 301.

In this example, there were prepared a plurality of photovoltaic elements having such configuration as shown in FIGS. 3(a) to 3(c).

Evaluation

The resultant photovoltaic elements was evaluated in the same manner as in Example 1.

1. Each of the photovoltaic elements was evaluated with respect to its initial characteristics in the same manner as in the evaluation 1 of Example 1. Specifically, the shunt resistance of each photovoltaic element was measured. As a result, the shunt resistance on the average was 500 k$\Omega \cdot cm^2$. Thus, it was found that substantially no shunt is occurred in each case.

Then, for each photovoltaic element, there was measured I–V characteristics, and based on the I–V characteristics, there was obtained a photoelectric conversion efficiency. As a result, each of the photovoltaic elements was found to have an initial photoelectric conversion efficiency of 10.5±0.2%. The variation of the photoelectric conversion efficiency among the photovoltaic elements was slight. In addition, the yield was found to be 99%.

2. For each of the photovoltaic elements which have been subjected to the evaluation in the above 1, in order to its resistance to stress, each photovoltaic element was subjected to the mechanical loading test in the same manner as in the evaluation 2 of Example 1, except for making the radius of curvature for the load to be 5 times that in Example 1.

For each of the photovoltaic elements having been endured in this way, its photoelectric conversion efficiency was evaluated in the same manner in the evaluation 1 of Example 1. As a result, a change between the initial photoelectric conversion efficiency and the photoelectric conversion efficiency after the endurance was found to be 1.0% on the average.

3. Using each of the photovoltaic elements having been subjected to the mechanical loading test in the above 2, there was obtained a photovoltaic element module in the same manner as in the evaluation 3 of Example 1. Each of the resultant photovoltaic element modules was subjected to the reliability test in the same manner as in the evaluation 3 of Example 1. After this, for the photovoltaic element in each of the photovoltaic element modules having been endured in this way, its photoelectric conversion efficiency was evaluated in the same manner as in the evaluation 1 of Example 1. As a result, a change between the initial photoelectric conversion efficiency in the evaluation in the above 1 and the photoelectric conversion efficiency after the endurance was found to be 2.0% on the average.

4. For each of the photovoltaic element modules which have been subjected to the endurance test in the above 3, in order to its resistance to stress, each of the photovoltaic element modules was subjected to the mechanical loading test in the same manner as in the evaluation 4 of Example 1, except for making the radius of curvature for the load to be 5 times that in Example 1.

After this, for the photovoltaic element in each of the photovoltaic element modules having been endured in this way, its photoelectric conversion efficiency was evaluated in the same manner as in the evaluation 1 of Example 1.

As a result, a change between the initial photoelectric conversion efficiency in the evaluation of the above 1and the photoelectric conversion efficiency after the endurance was found to be 3.0% on the average which is acceptable in practice.

COMPARATIVE EXAMPLE 3

The procedures of Example 5 were repeated, except for the following points, to obtain a plurality of photovoltaic elements.

That is as well as in Comparative Example 1, for the cover 311 of each of the covered wires in the wire arrangement, only its one side cover portion of 7 mm along the longitudinal direction was removed to form a cover-removed portion By using this cover-removed portion, the wire 302 (the exposed wire portion) was joined with the electrode 303 only by means of the solder, and because of this, no second joining potion was established. Specifically, in this case, the wire 302 and the electrode 303 are joined by only one joining portion in which the solder is used.

Evaluation

This resultant photovoltaic elements were evaluated in the same manner as in Example 1.

1. Each of the photovoltaic elements was evaluated with respect to its initial characteristics in the same manner as in the evaluation 1 of Example 1. Specifically, the shunt resistance of each photovoltaic element was measured. As a result, the shunt resistance on the average was 300 k$\Omega \cdot$cm$^2$. Thus, it was found that substantially no shunt is occurred in each case.

Then, for each photovoltaic element, there was measured I–V characteristics, and based on the I–V characteristics, there was obtained a photoelectric conversion efficiency. As a result, each of the photovoltaic elements was found to have an initial photoelectric conversion efficiency of 10.5±0.2%. The variation of the photoelectric conversion efficiency among the photovoltaic elements was slight. In addition the yield was found to be 89%.

2. For each of the photovoltaic elements which have been subjected to the evaluation in the above 1, in order to its resistance to stress, each photovoltaic element was subjected to the mechanical loading test in the same manner as in the evaluation 2 of Example 1, except for making the radius of curvature for the load to be 5 times that in Example 1.

For each of the photovoltaic elements having been endured in this way, its photoelectric conversion efficiency was evaluated in the same manner as in the evaluation 1 of Example 1. As a result, a change between the initial photoelectric conversion efficiency and the photoelectric conversion efficiency after the endurance was found to be 5.0% on the average, which is apparently inferior to that in Example 5.

For each of the photovoltaic elements after the endurance, its upper electrode structure was examined. As a result, the occurrence of rupture was found in 10% of the wires in the wire arrangement. It is considered that this situation is a main cause for the above deterioration.

3. Using each of the photovoltaic elements having been subjected to the mechanical loading test in the above 2, there was obtained a photovoltaic element module in the same manner as in the evaluation 3 of Example 1. Each of the resultant photovoltaic element modules was subjected to the reliability test in the same manner as in the evaluation 3 of Example 1. After this, for the photovoltaic element in each of the photovoltaic element modules having been endured in this way, its photoelectric conversion efficiency was evaluated in the same manner as in the evaluation in the above 1 and the photoelectric evaluation 1 of Example 1. As a result, a change between the initial photoelectric conversion efficiency in the evaluation in the above 1 and the photoelectric conversion efficiency after the endurance was found to be 7.0% on the average.

4 For each of the photovoltaic element modules which have been subjected to the endurance test in the above 3, in order to its resistance to stress, each of the photovoltaic element modules was subjected to the mechanical loading test in the same manner as in the evaluation 4 of Example 1, except fox making the radius of curvature for the load to be 5 times that in Example 1.

After this, for the photovoltaic element in each of the photovoltaic element modules having been endured in this way, its photoelectric conversion efficiency was evaluated in the same manner as in the evaluation of Example 1. As a result, a change between the initial photoelectric conversion efficiency in the evaluation of the above 1 and the photoelectric conversion efficiency after the endurance was found to be 9.0% on the average.

For the photovoltaic element in each of the photovoltaic element modules after the endurance, its upper electrode structure was examined. As a result, the occurrence of rupture was found in 30% of the wires in the wire arrangement.

When the results of Example 1 and Example 5 are compared with those of Comparative Example 3, the following facts are understood, That is, the present invention provides significant effects regardless the constitution of the photovoltaic element involved and also regardless the presence or absence of the substrate or the transparent electrically conductive electrode layer.

Separately, as in Example 6 which will be later described, it is a matter of course that the positional relation ship of the covered wire and the electrode (the bus bar electrode) may be reversed.

In the following, the method concerning the second aspect of the present invention will be described in more detail with reference to the following examples 6 to 20. It should be understood that these examples are only for illustrative purposes but not intended to restrict the scope of the invention only to them.

EXAMPLE 6

In this example, description will be made of a specific example of the process shown in FIGS. 9(a) to 9(h) comprising a step of removing a given cover portion of a covered wire and a step of joining said covered wire having a cover-removed portion (an exposed wire portion). FIG. 9(f) is a schematic cross-sectional view taken along the line J–J' in FIG. 9(a), and FIG. 9(h) is a schematic cross-sectional view taken along the line K–K' in FIG. 9(g).

Figure 9A:
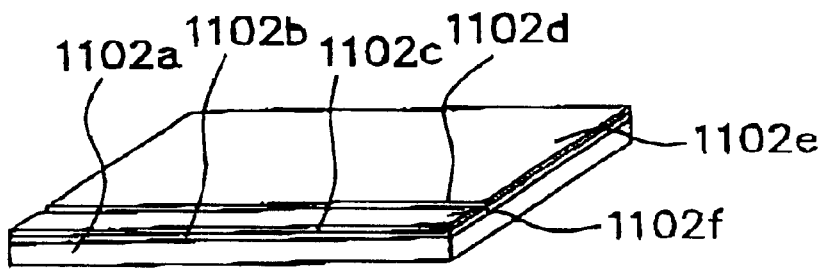
FIGS. 9(a) to 9(h) is a schematic view for explaining a method comprising a cover-removing a step of removing a cover portion of a covered wire and a step of joining said covered wire and a conductor (an electrode) in the present invention.

Step 1 [FIG. 9(a)]:

In this example, as the substrate 1102 there was used a photovoltaic element which was prepared as will be described below.

Preparation of Photovoltaic Element:

There was provided an elongated substrate web made of stainless steel of 150 $\mu$m in thickness and 36 cm in width, having a lower electrode layer 1102a comprising a 2000 Å thick Al layer (not shown) and a 1 $\mu$m thick ZnO layer (not shown) formed in this order by a conventional sputtering process, which is wound on a reel.

The reel was set to a conventional roll-to-roll type microwave plasma CVD apparatus having a plurality of film-forming chambers communicated with each other between a load chamber and an unload chamber, where a bottom cell comprising an n-type semiconductor layer, an i-type semiconductor layer, and a p-type semiconductor layer respectively comprising an amorphous silicon (a-Si) semiconductor material; a middle cell comprising an n-type semiconductor layer, an i-type semiconductor layer, and a p-type semiconductor layer respectively comprising an a- Si semiconductor material; and a top cell comprising an n-type semi-conductor layer, an i-type semiconductor layer, and a p-type semiconductor layer respectively comprising an a-Si semiconductor material were continuously formed in this order to form a photovoltaic layer 1102b on the surface of the lower electrode layer 1102a of the substrate web which was transporting from the load chamber to pass through the plurality of film-forming chambers and enter in the unload chamber where the substrate web was taken up on and wound on a take-up reel.

The reel having the substrate web wound thereon was taken out from the plasma CVD apparatus, and it was set to a conventional roll-to-roll type sputtering apparatus, where a 700Å thick ITO film as a transparent electrically conductive layer 1102c capable of functioning also as a light reflection preventive layer was continuously formed on the surface of the photovoltaic layer 1102b of the substrate web at a film-forming temperature (a substrate temperature) of 450° C.

The substrate web having the transparent electrically conductive layer 1102c thus formed on the photovoltaic layer 1102b was cut to obtain a plurality of photovoltaic elements having a size of 36 cm (width)×24 cm (length).

From the resultant photovoltaic elements, one photovoltaic element was randomly selected for the photovoltaic element, a peripheral region of 1 mm in width of the transparent electrically conductive layer 1102c was removed while forming a division groove 1102d in the transparent electrically conductive layer 1102c which divides the surface of the photovoltaic element into an effective power generation area 1102e and a non-effective power generation area 1102f by an electrolytic etching method of impressing an electric field between the photovoltaic element having a prescribed patterning mask superposed thereon and a counter electrode in an aqueous sulfuric acid solution.

Figure 9B:
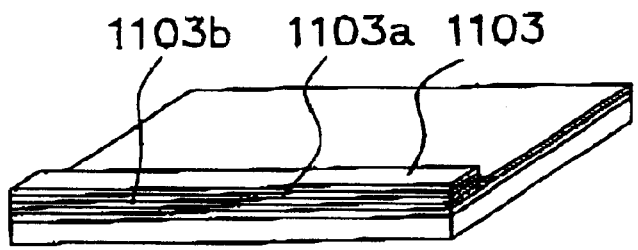
Figure 9C:
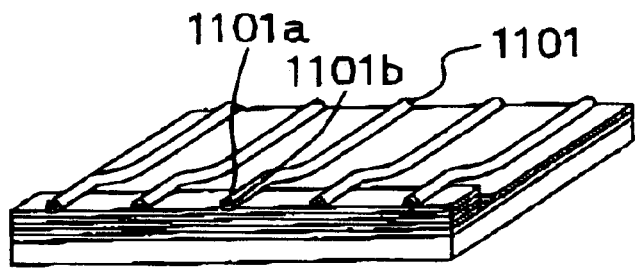

Step 2 [FIG. 9(b)];

On the photovoltaic element obtained in Step 1 as the substrate 1102, a fixing member 1103 was fixed. Specifically, a double-coated adhesive tape having a width of 7 mm and a length of 240 mm as the fixing member 1103 was affixed onto the non-effective power generation area 1102f of the photovoltaic element. As the double-coated adhesive tape as the fixing member 1103, there was used a double-coated adhesive tape comprising a base member 1103a (a composite member comprising a 25 μm thick polyimide film and a 50 μm thick polyethylene terephthalate film laminated) sandwiched between a pair of acrylic adhesive layers 1103b having a thickness of 60 μm.

Step 3 [FIG. 9 (c)]:

A covered wire 1101 was fixed on the photovoltaic element (as the substrate 1102 ) by means of the fixing member 1103 (the double-coated adhesive tape). Specifically, as shown in FIG. 9(a), 42 covered wires (in the figure, only 5 covered wires are shown for the simplification purpose) were spacedly bonded on the double-coated adhesive tape affixed on the photovoltaic element at an equal interval of 5.6 mm.

The covered wire 1101 comprises a covered wire comprising a wire 1101a (a core wire) whose surface is covered by a cover 1101b, prepared as will be described below.

Preparation of Covered Wires:

As a starting material for the wire 1101a (the core wire), there was provided a long composite wire comprising a copper wire with a diameter of 4 to 5 mm having a silver coil of 50 μm in thickness affixed to the exterior surface thereof. The composite wire was introduce into a wire-drawing apparatus, where it was subjected to wire-drawing treatment to obtain an elongated silver-coated copper wire having a diameter of 100 μm as the wire 1101a, where the elongated silver-coated copper wire obtained was continuously wound on a bobbin. The thickness of the silver coat of the silver-coated copper wire was found to be 1 μm.

Then, for the silver-coated copper wire, there was formed a cover 1101b was formed so as to cover the surface of the silver-coated copper wire using a conventional roll coater to obtained a covered wire as the covered wire 1101. In this example, the cover 1101b was made to have a two-layered structure which comprises an inner resin material layer (not shown) comprising a completely cured electrically conductive resin material and an outer resin material layer (not shown) comprising a semi-cured electrically conductive resin material for bonding and fixing the covered wire onto the surface of the photovoltaic element.

Now the formation of the cover 1101b having such two-layered structure on the silver-coated copper wire was conducted as will be described below.

The bobbin having the silver-coated copper wire wound thereon was set to a roll-to-roll type washing apparatus provided with a washing vessel. In the washing apparatus, the silver-coated copper wire was paid out from the bobbin and it was continuously delivered to pass through the washing vessel while being taken up by and wound on a take-up bobbin, where in the washing vessel, the silver-coated copper wire was washed with acetone to remove foreign matter including oil material, then dried.

The bobbin having the cleaned silver-coated copper wire wound thereon was taken out from the washing apparatus and it was set to a first roll coater provided with a treating vessel in which a felt containing an electrical conductive resin material therein is provided. In the first roll coater, the silver-coated copper wire was paid out from the bobbin and it was continuously delivered to pass through the treating vessel while being taken up by and wound on a take-up bobbin, where in the treating vessel, the surface of the silver-coated copper wire is coated with the electrically conductive resin material then dried, whereby a resin material coat as the inner resin material layer was formed on the surface of the silver-coated copper wire.

As the above electrically conductive resin material, there was used an electrically conductive resin material obtained by together introducing 33 parts by weight of carbon black, 6.4 parts by weight of butyral resin, 4.2 parts of cresol resin, 4.2 parts by weight of phenol resin, 4.2 parts by weight of aromatic hydrocarbon resin, 18 parts by weight of diol isocyanate (as a curing agent), 18 parts by weight of xylene (as a solvent), 12 parts by weight of diethylene glycol monomethyl ether (as a solvent), 3.6 parts by weight of cyclohexanone (as a solvent), and 0.7 part by weight of γ-mercaptopropyltrimethoxysilane (as a coupling agent) into a paint shaker ad subjecting the materials introduced in the paint shaker to mixing and dispersing treatment.

The bobbin having the thus treated silver-coated copper-wire wound thereon was taken out from the first roll coater, and it was set to a treating apparatus having a drying furnace. In the treating apparatus, the silver-coated copper wire was paid out from the bobbin and it was continuously delivered to pass through the drying furnace while being taken up by and wound on a take-up bobbin, where prior to entering in the drying furnace, unnecessary resin material on the silver-coated copper wire was removed using a dies, and in the drying furnace, the resin material coat formed on the silver-coated copper wire was completely cured in this case, by properly adjusting the transportation speed of the silver-coated copper wire having the resin material coat as the inner resin layer and also properly adjusting the size of the dies, the thickness of the resin material coat of the silver-coated copper wire was made to be 5 μm.

The bobbin having the silver-coated copper wire with the inner resin material layer wound thereon was set to a second roll coater provided with a treating vessel in which a felt containing an electrically conductive resin material therein is provided. In the second roll coater, the silver-coated copper wire was paid out from the bobbin and it was continuously delivered to pass through the treating vessel while being taken up by and wound on a take-up bobbin, where in the treating vessel, the surface of the silver-coated copper wire is coated with the electrically conductive resin material, then dried, whereby a resin material coat as the outer resin material layer was formed on the surface of the previously formed inner resin material layer on the silver-coated copper wire.

As the above electrically conductive resin material, there was used an electrically conductive resin material obtained by together introducing 35 part by weight of carbon black, 41 parts by weight of urethane resin, 14 parts of phenoxy resin, 6 parts by weight of hydrogen-added diphenylmethane isocyanate (as a curing agent), 4 parts by weight of aromatic solvent (as a solvent), and 0.7 part by weight of γ-mercaptopropyltrimethoxysilane (as a coupling agent) into a paint shaker and subjecting the materials introduced in the paint shaker to mixing and dispersing treatment.

This bobbin having the thus treated silver-coated copper wire wound thereon was taken out from the second roll coater, and it was set to a treating apparatus having a drying furnace. In the treating apparatus, the silver-coated copper wire was paid out from the bobbin and it was continuously delivered to pass through the drying furnace while being taken up by and wound on a take-up bobbin, where prior to entering in the drying furnace, unnecessary resin material on the silver-coated copper wire was removed using a dies, and in the drying furnace, the resin material coat formed on the surface of the inner resin layer of the silver-coated copper wire was subjected to semi-curing treatment. In this case, by properly adjusting the transportation speed of the silver-coated copper wire having the resin material coat as the outer resin material layer on the inner resin material layer and also properly adjusting the size of the dies, the thickness of the resin material coat as the outer resin material layer of the silver-coated copper wire was made to be 25 µm.

Thus, there was obtained a covered wire 1101 comprising the silver-coated copper wire 1101a (the core wire) whose surface is covered by a two-layered cover 1101b comprising the inner resin material layer and the outer resin material layer.

Figure 9D:
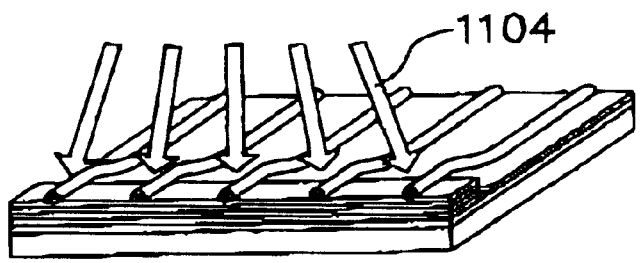

Step 4:

Energy beam 1104 was radiated to a portion of the covered wire which is fixed on the substrate (the photovoltaic element) through the fixing member [see, FIG. 9(d)].

The energy beam 1104 used comprises YAG laser beam having a wavelength of 1.06 µm.

Specifically, as shown in FIG. 9(d), to a portion of the covered wire which is situated at the position where the covered wire is fixed on the photovoltaic element by means of the double-coated adhesive tape, the laser beam 1104 was radiated from above the cover of the covered wire. The laser beam used comprises laser beam comprising pulse beam having a high output power peak value provided by modulating said YAG laser beam by a conventional Q-switch. And in the radiation of the laser beam, the direction for the laser beam to be radiated was adjusted by means of a galvanometer scanner having a rotary mirror, and the laser beam was focused to a prescribed cover-removing portion of the cover of the covered wire by means of a fθ lens.

The laser radiation conditions in this case were 36 W for the average output power (measured by a thermopile type probe), 50 kHz for the pulse frequency, several n seconds for the pulse width, 700 mm/second for the scanning speed, and about 100 µm for the radius of spot size.

Figure 9E:
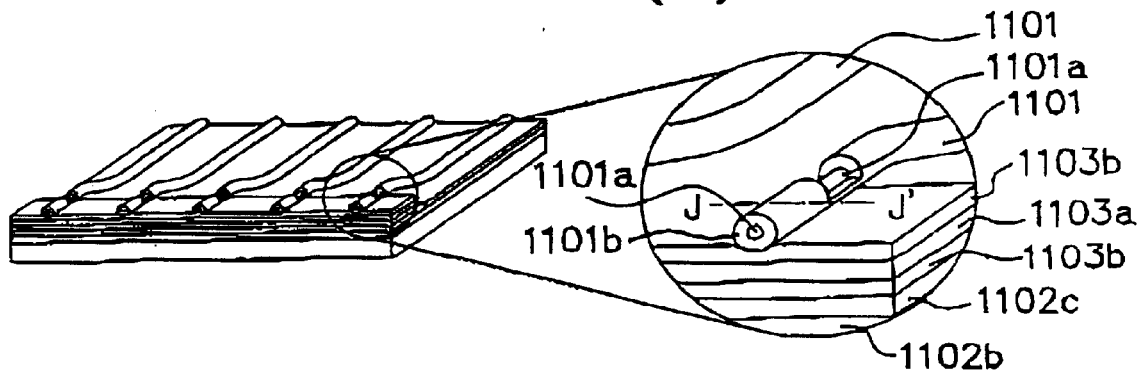
Figure 9F:
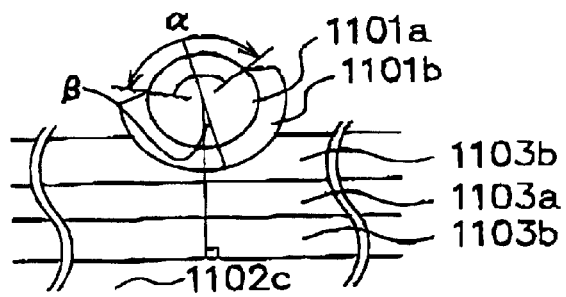

By the radiation of the energy beam 1104 in this way, for each of the covered wires, a prescribed cover portion thereof to which the energy beam was radiated was removed to form a cover-removed portion (a exposed wire portion) as shown in FIG. 9(e). The length of the cover-removed portion in each case was 2 mm.

FIG. 9(f) is a schematic cross-sectional view taken along the line J–J' in FIG. 9(e). The cover-removed angle β in the J–J' cross section in FIG. 9(e) is an angle given by the normal line direction of the surface of the photovoltaic element as the substrate and the bisector of the circular arc of the cover-removed portion viewed in the J–J' cross section. When the angle β in this example was measured, it was found to be in a range of −40° to 40°. In addition, the angle α (the cover-removed open angle) which the circular arc of the cover-removed portion viewed in the J–J' cross section was 120°±30°.

Examination was conducted of the cover-removed portions by a X-ray diffractometer of SEM. As a result, in any of them, the ratio of the characteristic X-ray quantity of the cover of the covered wire to that of the silver coat of the covered wire was found to be less than 0.1. Based on this, it was confirmed that the cover removal was desirably conducted in any case.

Step 5

Figure 9G:
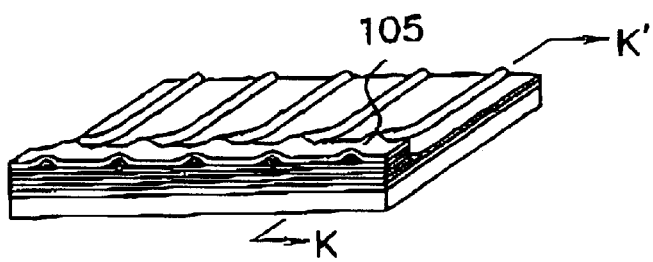
Figure 9H:
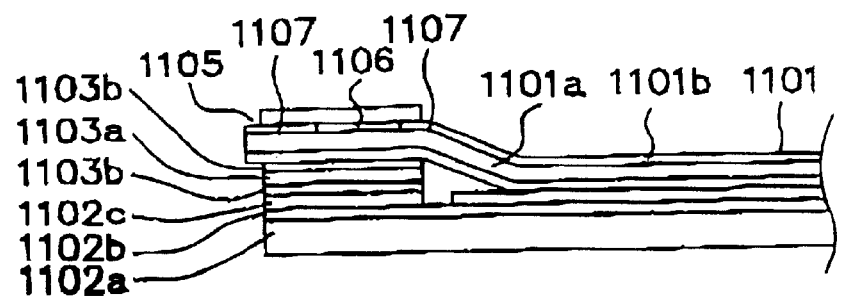

A conductor 1105 (a bus bar electrode) was joined to the cover-removed portions of the covered wires as shown in FIG. 9(g).

As the conductor 1105 (the bus bar electrode), there was a silver-plated copper foil having a thickness of 100 µm, a width of 6 mm and a length of 240 mm.

The joining was conducted using an Ag-paste. Particularly, the joining was conducted by a manner of applying the Ag-paste on the cover-removed portions of the covered wires (not shown), and putting the silver-plated copper foil 1105 thereon from above as shown in FIG. 9(g). At this time, it pressure was added from above so that the silver-plated copper foil 1105 itself was also fixed to the substrate (the photovoltaic element) through the fixing member (the double-coated adhesive tape).

Thereafter the resultant element body was positioned in a conventional vacuum laminator, where while adding a pressure of about 1 atmospheric pressure from above the conductor (the silver-plated copper foil), the element body was subjected to heat treatment at a prescribed temperature for a prescribed period of time, whereby the Ag-paste was cured to form a joining portion between the conductor (the silver-plated copper foil) and each of the covered wires. In this case, the heat and the pressure were effected also to the covered wires on the effective power generation area of the photovoltaic element to thermally cure the covers of the covered wires, whereby the covered wires were bonded and fixed on the on the effective power generation area of the photovoltaic element.

FIG. 9(h) is a schematic cross-sectional view at the line K–K' in FIG. 9(g). As shown in FIG. 9(h) a first joining portion comprising the Ag paste is formed between the wire 1101a and the electrode 1105 (the bus bar electrode), and being adjacent to the first joining portion, a second joining portion comprising the electrically conductive resin material is formed.

In the above, because the covered wires were filed to the substrate (the photovoltaic element) by means the fixing member while maintaining their cover-removed angles β in a range of −40 ° to 40° so that all the cover-removed portions of the 42 covered wires were surely faced toward the silver-plated copper foil, it was possible to very easily and surely form the first joining portion having a desirably small electric resistance between the wires of the covered wires and the silver-plated copper foil (the bus bar electrode).

In this example, because the silver-plated copper foil (the bus bar electrode) itself was fixed to the substrate (the photovoltaic element) through the double-coated adhesive tape (the fixing member), not only the fist joining portion but also the second joining portion could be easily formed.

In view of the above, there was obtained a photovoltaic element heaving a specific electrode structure in which the joule loss at the joining portion between the collecting electrode (comprising the covered wires) and the bus bar electrode (the conductor) is desirably diminished and which stably exhibits good characteristics in the present invention.

In this example, by repeating the above procedures, there were obtained a plurality of photovoltaic elements having such specific electrode structure.

Each of the resultant photovoltaic elements was evaluated with respect to its photoelectrode conversion efficiency in the following manner. That is, a conventional power output terminal was connected to each of the positive electrode and the negative electrode of the photovoltaic element, and the photovoltaic element was set to a pseudo sunlight simulator (produced by SPIRE Company) in which a pseudo sunlight having a global sunlight spectrum of AM 1.5 with an intensity of 100 mW/cm$^2$ is used, where there was measured its I–V characteristics, and based on the I–V characteristics, there was obtained a photoelectric conversion efficiency. As a result, each of the photovoltaic elements was found to have a photoelectric conversion efficiency of 10% on the average.

Separately, in this example, as above described, the foregoing double-coated adhesive tape was used as the fixing member. Because of this, in comparison with the conventional method in that the covered wire is fixed by winding it around the conductor, the bonding power of the interface between the fixing member and the covered wire became greater and in addition, the area of the interface was increased, where stable fixing could be readily attained. Further, because the double-coated adhesive tape was used as the fixing member, moderated and stable bonding power could be instantly attained for the interface between the covered wire and the fixing member. Further in addition, because the double-coated adhesive tape had a moderate elasticity, the bonded interface between the double-coated adhesive tape and the covered wire desirably absorbed a stress so that no peeling was occurred at the interface, although the covered wire was elongated due to the radiation of the energy beam. And the positional dislocation of the covered wire when the energy beam was radiated thereto was of a slight extent such that the cover-removing rate is not decreased.

As a result of having examined the energy absorptivity of the double-coated adhesive tape (used as the fixing member) for YAG laser beam, it as found to be 5%. The energy absorptivity was obtained by a manner in that the same laser beam as that used for the cover removal of the covered wire is radiated to the double-coated adhesive tape at the same output power and the same pulse width as those in the cover removal of the covered wire and a decreased quantity of the radiated energy of the laser beam with respect to the energy of the laser beam outputted from the double-coated adhesive tape when the former energy is radiated to the double-coated adhesive tape is made to be the energy absorptivity. Similarly, when the energy absorptivity of the cover of the covered wire was measured it was found to be 90%. Thus, the ratio of the energy absorptivity of the fixing member to that of the cover of the covered wire is 0.0556.

Because of this, only a prescribed cover portion of the cover of the covered wire can be selectively removed by the radiation of the laser beam without the fixing member being damaged by the laser beam. In this connection, it was possible to increase the intensity of the energy beam and the residual ratio of the cover material remained without being removed upon the cover removal could be made to be less than 0.1% which is very.

The constituents in this example are shown in Table 1 and the evaluated results in this example are shown in Table 2.

Comparative Example 4

This comparative example is different from Example 6 with the point in that the order of the step of fixing the covered wire on the substrate (the photovoltaic element) through the fixing member (the adhesive tape) and the step of radiating the energy beam to the covered wire in Example 1 were reversed in this comparative example.

In FIGS. 10(a) to 10(g), the steps in this comparative example are shown. In FIGS. 10(a) to 10(g), reference numeral 1201 indicates a covered wire comprising a wire 1201a (a core wire) whose surface is covered by a cover 1201b. This covered wire is the same as that used in Example 1. Reference numeral 1202a indicates a lower electrode layer, reference numeral 1202b a photovoltaic layer, reference numeral 1202c a transparent electrically conductive layer, reference numeral 1202d a division groove, 1202e an effective power generation area, reference numeral 1202f a non-effective power generation area, reference numeral 1203 a double-coated adhesive tape comprising a base member 1203a sandwiched between a pair of adhesive materials, and 1205 a conductor. These are also the same as those in Example 1.

In the following, description will be made of the three steps which are different from Example 6.

Figure 10A:
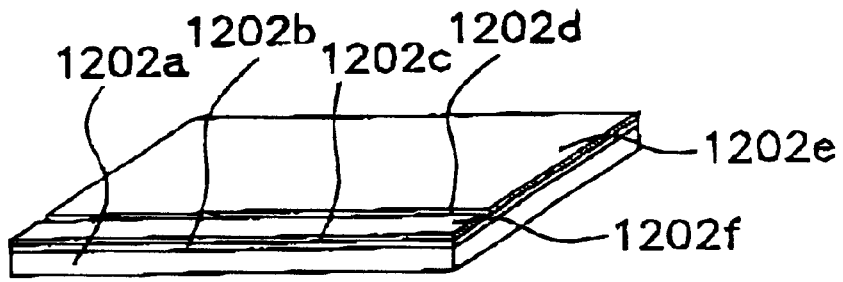
FIGS. 10(a) to 10(g) is a schematic view for explaining a comparative method comprising a cover-removing a step of removing a cover portion of a covered wire and a step of joining said covered wire and a conductor (an electrode) in a comparative example which will be described later.
Figure 10B:
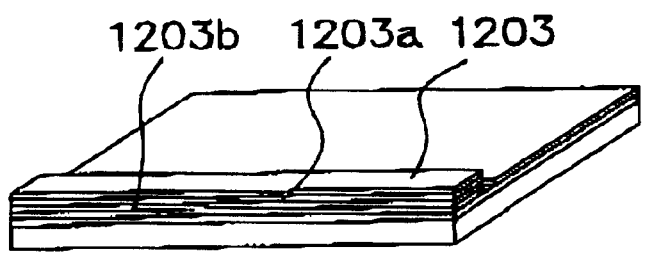
Figure 10C:
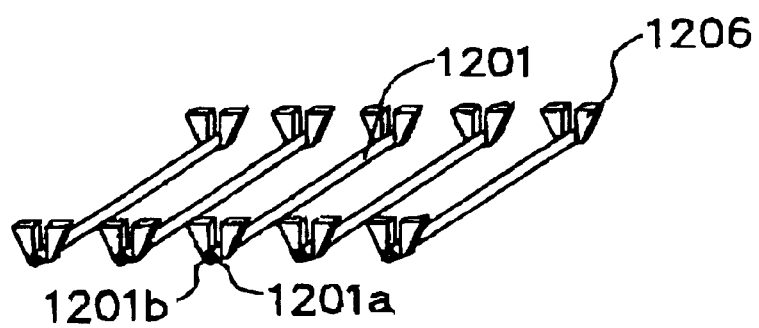

Step 3:

The covered wires 1203 were wired in the air as shown in FIG. 10(c).

Specifically, the 42 covered wires 1201 each having a prescribed length were fixed by pinching their opposite end portions by clips 1206, and they were wired within a horizontal plane in the air while supplying a tensile force thereon in the longitudinal direction. In the figure, only the 5 covered wires are shown for the simplification purpose.

Figure 10D:
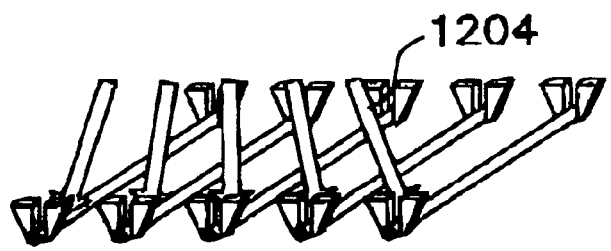

Step 4:

The same energy beam (YAG laser beam 1204 ) as that used in Example 6 was radiated to the covered wires which were wired in the above [see, FIG. 10(d)].

Figure 10E:
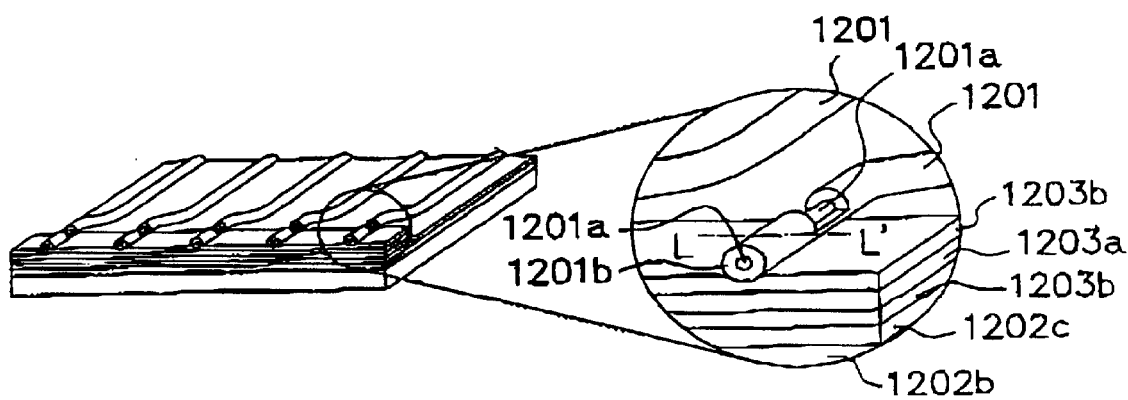

Step 5:

By operating the clips 1206 so that the cover-removed portions of the covered wires which were formed by the radiation of the energy beam 1204 are positioned on the fixing member (the double-coated adhesive tape 1203), the covered wires were fixed on the substrate (the photovoltaic element 1202) by the fixing member [see, FIG. 10(e)].

Figure 10F:
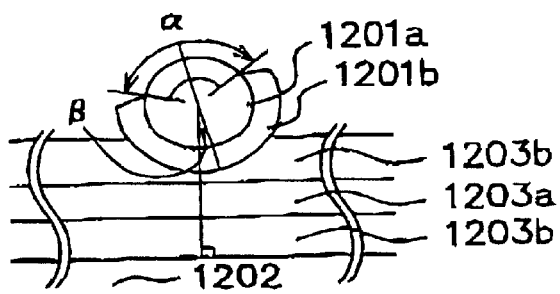
Figure 10G:
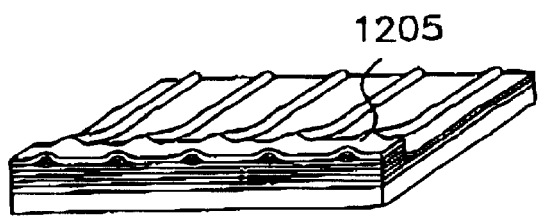

FIG. 10(f) is a schematic cross-sectional view of a cross section at the line L–L' in FIG. 10(e).

As well as the case shown in FIG. 9(f) the L–L' cross section in FIG. 10(f) is a cross section of the cover-removed potion of the covered wire. When the cover-removed angle β in the L–L' cross section was measured, it was found to be a range of −90° to 90°. Similarly, when the cover-removed open angle α was measured, it was found to be 100°±40°.

Further, examination was conducted of the cover-removed portions by a X-ray diffractometer of SEM. As a result, in any of them, the ratio of the characteristic X-ray quantity of the cover of the covered wire to that of the silver coat of the covered wire was found to be less than 0.5.

In this comparative example, there were prepared a plurality of photovoltaic elements having such specific electrode structure. Each of the resultant photovoltaic elements was evaluated with respect to its photoelectric conversion efficiency in the same manner as in Example 6. As a result, each of the photovoltaic elements was found to have a photoelectric conversion efficiency of 9.5% on the average.

Separately, in this comparative example, in comparison with Example 6, the positional fixation of the covered wire when the energy beam is radiated is insufficient. Specifically, because the covered wires are merely retained in the air by pinching their opposite end portions by the clips, the positional freedom of each of the covered wires between the clips involved is great. In this connection, by virtue of the reaction upon the radiation of the energy beam, the covered wire escaped, wherein the cover removal became insufficient. Because of this, in comparison with Example 6, the average of the α is narrower as being 100° and the variation thereof is greater as being 40°. In addition, the residual ratio of the cover material remained without being removed upon the cover removal is 0.5% which is higher than the 0.1% in Example 6. According to this, it is understood that the cover-removing method of the present invention is markedly advantageous.

Further, in this comparative example, after the cover removal, the covered wire is fixed on the substrate, followed by connecting the conductor (the electrode) to the cover-removed portion of the covered wire. Because the covered wire is fixed to the substrate after the cover removal, the β is ±90° which is greater than the ±40° in Example 6. This situation indicates that the cover-removed portion of the covered wire cannot be surely faced toward the conductor (the electrode) side upon connecting the conductor (the electrode) to the cover-removed portion and that it is difficult to connect the conductor (the electrode) to the wire of the covered wire. Because of this in this comparative example, the connection resistance of the conductor (the electrode) with the wire of the covered wire becomes greater than that in Example 6, and the photoelectric conversion efficiency is decreased to be 9.5%. Thus, it is understood that the method of connecting the covered wire with the conductor (the electrode) is markedly advantageous.

The constituents in this comparative example are shown in Table 1 and the evaluated results in this comparative example are shown in Table 2.

EXAMPLE 7

This example is different from Example 6 only with the point in that $CO_2$ laser beam was used as the energy beam.

The $CO_2$ laser beam used is one by the conventional RF excitation. The direction for the laser beam to be radiated was adjusted by means of a galvanometer scanner having a rotary mirror, and the laser beam was focused to a prescribed cover-removing portion of the cover of the covered wire by means of a fθ lens to remove the cover-removing portion.

The laser radiation conditions in this case were 25 W for the average output power (measured by a thermopile type probe), 700 mm/second for the scanning speed, and about 100 μm for the radius of spot size.

In this example, there were prepared a plurality of photovoltaic elements having such specific electrode structure as described in Example 6.

In this example, the absorptivity of the cover of the covered wire when the cover absorbed the energy of the $CO_2$ laser beam under the laser radiation conditions was 95%. Similarly, the absorptivity of the fixing member (the double-coated adhesive tape) was 10%. The ratio of the absorptivity of the cover of the covered wire to that of the fixing member was 0.1053, which is in a range of 0.0001 to 0.9999, as well as in the case of Example 6.

In this example, the residual ratio of the cover material remained without being removed upon the cover removal could be made to be less than 0.1% which is very small, as well as in the case of Example 6. Thus, it is understood that the present invention is markedly advantageous. It is also understood that the effects of the cover-removing method of a covered wire do not depend on the kind of the energy beam used.

Further, also in this example, for all the 42 covered wires, there was obtained the cover-removed open angle α of 120°±30°, as well as in the case of Example 6. Because of this, the electrical connection of the wire of the covered wire with the bus bar electrode could be formed to have a sufficiently low electric resistance. Thus, the photovoltaic elements prepared in this example exhibited a photoelectric conversion efficiency of 10.0% on the average, which is satisfactory. Further in addition, it is understood that the joining method of the covered wire with the conductor in the present invention does not depend on the kind of the energy beam used.

The constituents in this example are shown in Table 1 and the evaluated results in this example are shown in Table 2.

EXAMPLE 8

This example is different from Example 6 only with the point in that semiconductor laser beam was used as the energy beam.

The laser beam used in this example comprises pulse laser beam whose central wavelength is 808 nm. The direction for the laser beam to be radiated was adjusted by means of a optical fiber, and the laser beam was focused to a prescribed cover-removing portion of the cover of the covered wire by means of a condenser lens to remove the cover-removing portion.

The laser radiation conditions in this case were 60 W for the average output power (measured by a thermopile type probe), 500 mm/second for the scanning speed, and about 500 μm for the radius of spot size.

In this example, there were prepared a plurality of photovoltaic elements having such specific electrode structure as described in Example 6.

In this example, the absorptivity of the cover of the covered wire then the cover absorbed the energy of the semiconductor laser beam under the above laser radiation conditions was 80%. Similarly, the absorptivity of the fixing member (the double-coated adhesive tape) was 3%. The ratio of the absorptivity of the cover of the covered wire to that of the fixing member was 0.0375, which is in a range of 0.0001 to 0.9999, as well as in the case of Example 6.

In this example, the residual ratio of the cover material remained without being removed upon the cover removal could be made to be less than 0.1% which is very small, as well as in the case of Example 6. Thus, it is understood that the present invention is markedly advantageous. It is also understood that the effects of the cover-removing method of a covered wire do not depend on the kind of the energy beam used.

Further, also in this example, for all the 42 covered wires, there was obtained the cover-removed open angle α of 120°±30°, as well as in the case of Example 6. Because of this, the electrical connection of the wire of the covered wire with the bus bar electrode could be formed to have a sufficiently low electric resistance. Thus, the photovoltaic elements prepared in this example exhibited a photoelectric conversion efficiency of 10.0% on the average, which is satisfactory. Further in addition, it is understood that the joining method of the covered wire with the conductor in the present invention does not depend on the kind of the energy beam used.

The constituents in this example are shown in Table 1 and the evaluated results in this example are shown in Table 2.

EXAMPLE 9

This example is different from Example 6 only with the point in that metal halide lamp beam was used as the energy beam.

The direction for the lamp beam to be radiated was adjusted by means of a optical fiber, and the lamp beam was focused to a prescribed cover-removing portion of the cover of the covered wire by means of a condenser lens to remove the cover-removing portion.

The laser radiation conditions in this case were 1.5 kW for the average output power (measured by a thermopile type probe), 300 mm/second for the scanning speed, and about 2 mm for the radius of spot size.

In this example, there were prepared a plurality of photovoltaic elements having such specific electrode structure and described in Example 6.

In this example, the absorptivity of the cover of the covered wire when the cover absorbed the energy of the lamp beam under the above laser radiation conditions was 85%. Similarly, the absorptivity of the fixing member (the double-coated adhesive tape) was 7%. The ratio of the absorptivity of the cover of the covered wire to that of the fixing member was 0.0824, which is in a range of 0.0001 to 0.9999, as well as in the case of Example 6.

In this example, the residual ratio of the cover material remained without being removed upon the cover removal could be made to be less than 0.1% which is very small, as well as in the case of Example 6. Thus, it is understood that the present invention is markedly advantageous. It is also understood that the effects of the cover-removing method of a covered wire do not depend on the kind of the energy beam used.

Further, also in this example, for all the 42 covered wires there was obtained the cover-removed open angle $\alpha$ of 120°±30°, as well as in the case of Example 6. Because of this, the electrical connection of the wire of the covered wire with the bus bar electrode could be formed to have a sufficiently low electric resistance. Thus, the photovoltaic elements prepared in this example exhibited a photoelectric conversion efficiency of 10.0% on the average, which is satisfactory. Further in addition, it is understood that the joining method of the covered wire with the conductor in the present invention does not depend on the kind of the energy beam used.

The constituents in this example are shown in Table 1 and the evaluated results in this example are shown in Table 2.

EXAMPLE 10

This example is different from Example 6 only with the points that the substrate (the photovoltaic element) was prepared to have a size of 10 cm×10 cm: as the conductor (the bus bar electrode), there was used copper wire of 100 $\mu$m in diameter and 100 mm in length whose surface is cladded with Ag at a thickness of 1 $\mu$m and 17 of the covered wires were joined with the conductor (the bus bar electrode).

In this example, there were prepared a plurality of photovoltaic elements having such specific electrode structure as described in Example 6.

In this example, for all the 17 covered wires there was obtained the cover-removed open angle $\alpha$ of 120°±30°, as well as in the case of Example 6. Because of this, the electrical connection of the wire of the covered wire with the bus bar electrode could be formed to have a sufficiently low electric resistance. Thus, the photovoltaic elements prepared in this example exhibited a photoelectric conversion efficiency of 10.0% on the average, which is satisfactory.

From the results, it is understood the joining method of the covered wire with the conductor in the present invention provides pronounced advantages without depending on the kind and size of the conductor used.

The constituents in this example are shown in Table 1 and the evaluated results in this example are shown in Table 2.

EXAMPLE 11

This example is different from Example 6 only with the point in that as each of the pair of adhesive materials 1103$b$ of the double-coated adhesive tape 1103 as the fixing member in Example 6, there was used a silicone series adhesive material.

In this example, there were prepared a plurality of photovoltaic elements having such specific electrode structure as described in Example 6.

In this example, the absorptivity of the fixing member (the above double-coated adhesive tape) against the energy of the YAG laser beam under the laser radiation conditions (described in Example 6) was 5%. which is the same as that in Example 6. And the ratio of the absorptivity of the cover of the covered wire to that of the fixing member was 0.0556, which is in a range of 0.0001 to 0.9999, as well as in the case of Example 6.

In this example, the residual ratio of the cover material remained without being removed upon the cover removal could be made to be less than 0.1% which is very small, as well as in the case of Example 6. Thus, it is understood that the effects of the cover-removing method of a covered wire do not depend on the kind of the adhesive material used.

Further, in this example, for all the 42 covered wires, there was obtained the cover-removed open angle $\alpha$ of 120°±30°, as well as in the case of Example 6. Because of this, the electrical connection of the wire of the covered wire with the bus bar electrode could be formed to have a sufficiently low electric resistance. Thus, the photovoltaic elements prepared in this example exhibited a photoelectric conversion efficiency of 10.0% on the average, which is satisfactory. Further in addition, it is understood that the joining method of the covered wire with the conductor in the present invention does not depend on the kind of the adhesive material used.

The constituents in this example are shown in Table 1 and the evaluated results in this example are shown in Table 2.

EXAMPLE 12

This example is different from Example 6 only with the point in that the cover of the covered wine was constituted by an Ag paste material.

In this example, there were prepared a plurality of photovoltaic elements having such specific electrode structure as described in Example 6.

In this example, the absorptivity of the cover of the covered wire when the cover absorbed the energy of the YAG laser beam under the laser radiation conditions (described in Example 6) was 50%, which is lower that in Example 6. However, the ratio of the absorptivity of the cover of the covered wire to that of the fixing member was 0.1000, which is in a range of 0.0001 to 0.9999, as well as in the case of Example 6.

In this example, the residual ratio of the cover material remained without being removed upon the cover removal could be made to be less than 0.1% which is very small, as well as in the case of Example 6. Thus, it is understood that the effects of the cover-removing method of the covered wire do not depend on the kind of the material constituting the cover of the covered wire.

Further, in this example, for all the 42 covered wires, there was obtained the cover-removed open angle α of 120°±30°, as well as in the case of Example 6. Because of this, the electrical connection of the wire of the covered wire with the bus bar electrode could be formed to have a sufficiently low electric resistance. Thus, the photovoltaic elements prepared in this example exhibited photoelectric conversion efficiency of 10.0% on the average, which is satisfactory. Further in addition, it is understood that the joining method of the covered wire with the conductor in the present invention does not depend on the kind of the material constituting the cover of the covered wire.

The constituents in this example are shown in Table 1 and the evaluated results in this example are shown Table 2.

EXAMPLE 13

This example is different from Example 6 only with the point in that the joining of the covered wire with the conductor (the bus bar electrode) was conducted using an eutectic solder in replacement of the Ag-paste. Specifically, an eutectic solder paste was coated on the cover-removed portion of the covered wire, the conductor (the bus bar electrode) was putted thereon, where a prescribed pressure was added from above so that the conductor (the bus bar electrode) itself was also fixed to the substrate (the photovoltaic element) through the fixing member (the double-coated adhesive tape), and thereafter, the conductor was heated from above to fuse the eutectic solder paste, whereby forming the joining portion between the conductor and the covered wire.

In this example, there were prepared plurality of photovoltaic elements having such specific electrode structure as described in Example 6.

In this example, for all the 42 covered wires, there was obtained the cover-removed open angle α of 120±30°, as well as in the case of Example 6. Because of this, the electrical connection of the wire of the covered wire with the bus bar electrode could be formed to have a sufficiently low electric resistance. Thus, the photovoltaic elements prepared in this example exhibited a photoelectric conversion efficiency of 10.0% on the average, which is satisfactory.

From the results, it is understood that the joining method of the covered wire with the conductor in the present invention provide pronounced advantages without depending on the kind of the joining method of the conductor with the covered wire.

The constituents in this example are shown in Table 1 and the evaluated results in this example are shown in Table 2.

EXAMPLE 14

This example is different from Example 6 only with the point in that the joining of the covered wire with the conductor (the bus bar electrode) was conducted by means of laser beam welding, without using the Ag-past.

Specifically, without coating the Ag-past, the conductor (the bus bar electrode) was putted on the cover-removed portion of the covered wire, where a prescribed pressure was added from above so that the conductor (the bus bar electrode) itself was also fixed to the substrate (the photovoltaic element) through the fixing member (the double-coated adhesive tape), then on the surface of the conductor, there was coated a black ink material capable of preventing reflection of laser beam for the laser beam welding, and thereafter, while adding a prescribed pressure from above by means of a pressing jig so that the cover-removed portion of the covered wire was close-contacted with the conductor, YAG laser beam was radiated to the intersection of the conductor with the covered wire to fuse the corresponding portion of the covered wire and that of the conductor, whereby the joining portion was formed between the covered wire and the conductor. The YAG laser beam radiated was 5 msec for the pulse width and 5 J for the energy. The YAG laser beam was transmitted by an optical fiber and condensed to have a spot size of 100 μm.

In this example, there were prepared a plurality of photovoltaic elements having such specific electrode structure as described in Example 6.

In this example, for all the 42 covered wires, there was obtained the cover-removed open angle α of 120 ±30°, as well as in the case of Example 6. Because of this, the electrical connection of the wire of the covered wire with the bus bar electrode could be formed to have a sufficiently low electric resistance. Thus, the photovoltaic elements prepared in this example exhibited a photoelectric conversion efficiency of 10.0% on the average, which is satisfactory.

From the results, it is understood that the joining method of the covered wire with the conductor in the present invention provides pronounced advantages without depending on the kind of the joining method of the conductor with the covered wire.

The constituents in this example are shown in Table 1 and the evaluated results in the example are shown in Table 2.

EXAMPLE 15

This example is different from Example 6 only with the point in that as the photovoltaic element in the step 2 of Example 6, there was used a polycrystal photovoltaic element having a size of 10 cm×10 cm produced by a manner wherein a polycrystal silicon ingot obtained by a conventional method is sliced by a conventional manner to obtain a polycrystal silicon substrate, the polycrystal silicon substrate is subjected to surface-roughening treatment to make the polycrystal silicon substrate have a roughened surface, thermally diffusing an n-type material was thermally diffused through the roughened surface of the polycrystal silicon substrate to make the polycrystal silicon substrate have a p-n junction structure, an aluminum film is formed at the back face of the polycrystal silicon substrate, followed by subjecting to thermal diffusion treatment.

In this example, there were prepared a plurality of photovoltaic elements having such specific electrode structure as described in Example 6.

In thus example, the residual ratio of the cover material remained without being removed upon the cover removal could be made to be less than 0.1% which is very small, as well as in the case of Example 6. Thus, it is understood that the effects of the cover-removing method of the covered wire do not depend on the kind of the substrate (the photovoltaic element) used.

Further, in this example, for all the 42 covered wires, there was obtained the cover-removed open angle α of 120°±30°, as well as in the case of Example 6. Because of this, the electrical connection of the wire of the covered wire with the bus bar electrode could be formed to have a sufficiently low electric resistance Thus, the photovoltaic elements prepared in this example exhibited a photoelectric conversion efficiency of 10.0% on the average, which is satisfactory. Further in addition, it is understood that the joining method of the covered wire with the conductor in the present invention does not depend oil the kind of the substrate (the photovoltaic element) used.

The constituents in this example are shown in Table 1 and the evaluated results in this exile are shown in Table 2.

EXAMPLE 16

This example is different from Example 6 only with the point in that instead of using the double-coated adhesive tape, a quick-drying adhesive was screen-printed at a thickness of 20 μm to fix the covered wire on the substrate (the photovoltaic element).

This fixing method of fixing the covered wire to the substrate by way of screen-printing the quick-drying adhesive was found to be interior to that using the double-coated adhesive tape in Example 6 in terms of the efficiency and the yield.

In this example, there were prepared a plurality of photovoltaic elements having such specific electrode structure as described in Example 6.

In this example, when the laser beam was radiated to the covered ware, in the portion where the covered wire was fixed on the substrate through the fixing member, slight peeling was occurred at a portion of the interface between the covered wire and the fixing member to which the laser beam was radiated. Because of this, the fixation of the covered wire became insufficient, where positional dislocation of the covered wire was occurred.

In this example, due to this situation, the residual ratio of the cover material remained without being removed upon the cover removal was increased be 0.2% or less, which is inferior to the residual ratio of less than 0.1% in Example 6.

Further, because of the insufficient fixation of the covered wire, the cover-removed angle was somewhat varied as being −45° to 45°. Thus, the electric resistance for the electrical connection of the wire of the covered wire with the bus bar electrode became higher than that in Example 6. Because of this, the average photoelectric conversion efficiency of the photovoltaic elements prepared in this example was 9.8%, which is smaller by 0.2% in comparison with that in Example 6. However, this example is still effective.

In view of the results of this example, it is understood that the method of fixing the covered wire to the substrate using the double-coated adhesive tape is more advantageous.

The constituents in this example are shown in Table 1 and the evaluated results in this example are shown in Table 2.

EXAMPLE 17

This example is different from Example 6 only with the point in that the double-coated adhesive tape used in Example 6, the base member (1103a) thereof was incorporated with a carbon series paint. The double-coated adhesive tape used in this example has an energy absorptivity of 90% against the energy of the YAG laser beam, which is higher than that of the double-coated adhesive tape used in Example 6. Hence, the ratio of the energy absorptivity of the cover of the covered wire to that of the fixing member in this example is 1.000.

In this example, there were prepared a plurality of photovoltaic elements having such specific electrode structure as described in Example 6.

In this example, when the laser beam was radiated to the covered wire, a damage was occurred also at the fixing member, and in the portion where the covered wire was fixed on the substrate through the fixing member, slight peeling was occurred at a portion of the interface between the covered wire and the fixing member to which the laser beam was radiated. Because of this, the fixation of the covered wire became insufficient, where positional dislocation of the covered wire was occurred.

In this example, due to this situation, the residual ratio of the cover material remained without being removed upon the cover removal was increased be 0.2% or less, which inferior to the residual ratio of less than 0.1% in Example 6.

Further, because of the insufficient fixation of the covered wire, the cover-removed angle was somewhat varied as being −45° to 45°. Thus, the electric resistance for the electrical connection of the wire of the covered wire with the bus bar electrode became higher than that in Example 6. Because of this, the average photoelectric conversion efficiency of the photovoltaic elements prepared in this example was 9.8%, which is smaller by 0.2% in comparison with that in Example 6. However, this example is still effective.

In view of the results of this example, it as understood that to make the ratio of the energy absorptivity of the cover of the covered wire to that of the fixing member to be in a range of 0.0001 to 0.9999 is markedly advantageous.

The constituents in this example are shown in Table 1 and the evaluated results in this example are shown in Table 2.

EXAMPLE 18

This example is different from Example 6 only with the point in that the step of adding the prescribed pressure in order to fix the conductor (the bus bar electrode) to the substrate (the photovoltaic element) through the fixing member (the double-coated adhesive tape) in Example 6 was omitted.

In this example, there were prepared a plurality of photovoltaic elements having such specific electrode structure as described in Example 6.

In this example, when the conductor and the covered wire were joined, the fixation of the conductor could not be sufficiently conducted as in Example 6. Because of this, it was impossible to form the joining portion in a desirable state while sufficiently mutually contacting the conductor and the covered wire. Because of this, the electric resistance for the electrical connection of the wire of the covered wire with the conductor (the bus bar electrode) became higher than that in Example 6. Thus, the average photoelectric conversion efficiency of the photovoltaic elements prepared in this example was 9.8%, which is smaller by 0.2% in comparison with that in Example 6. However, this example is still effective.

In view of the results of this example, it is understood that to fix conductor to the substrate through the fixing member is markedly advantageous.

The constituents in this example are shown in Table 1 and the evaluated results in this example are shown in Table 2.

EXAMPLE 19

This example shows another detailed embodiment of the second aspect of the present invention, which is different from Example 6. This example relates to a method of joining an insulative covered wire and a copper foil as a conductor.

FIG. 11 shows an embodiment including a cover-removing method of removing a prescribed cover portion of a covered wire and a joining method of joining said covered wire with a conductor.

Step 1:

As shown in FIG. 11(a), substrate 1302 comprising a stainless steel plate having a thickness of 5 mm was provided, and a mixing member 1303 was fixed on the substrate 1302. Specifically, a double-coated tape as the fixing member 1303 was affixed onto the stainless steel plate as the substrate 1302. As the double-coated adhesive tape as the fixing member 1303, there was used a double-coated adhesive tape of 7 mm in width and 10 mm in length which comprises a 100μm thick polyethylene terephthalate film as a base member comprising sandwiched between a pair of acrylic resin adhesive materials having a thickness of 100 μm.

Step 2:

As shown in FIG. 11(b), a covered wire 1301 was fixed on the substrate 1302 by means of the fixing member 1303. Specifically, the covered wire 1301 was affixed onto the double-coated adhesive tape as the fixing member 1303 affixed on the stainless steel plate as the substrate As the covered wire 1301 used in this example, there was used an enameled wire of 0.5 mm in diameter comprising a copper wire 1301a whose surface is covered by an enamel cover 1301b having a thickness of 100 μm.

Step 3:

Energy beam 1304 was radiated to a portion of the covered wire which is fixed on the substrate through the fixing member (the double-coated tape) [see, FIG. 11(c)].

The energy beam 1304 used comprises YAG laser beam having a wavelength of 1.06 μm.

Specifically, as shown in FIG. 11(c), to a portion of the covered wire which is situated at the position where the covered wire is fixed on the substrate by means of the double-coated adhesive tape, the laser beam 1304 was radiated from above the cover of the covered wire. The laser beam used comprises laser beam comprising pulse beam having a high output power peak value provided by modulating said YAG laser beam by a conventional Q-switch. And in the radiation of the laser beam, the direction for the laser beam to be radiate was adjusted by means of a galvanometer scanner having a rotary mirror, and the laser beam was focused to a prescribed cover-removing portion of the cover of the covered wire by means of a fθ lens.

The laser radiation conditions in this case were 50 W for the average output power (measured by a thermopile type probe), 30 kHz for the pulse frequency, several n seconds for the pulse width, 700 mm/second for the scanning speed, and about 100 μm for the radius of spot size.

By the radiation of the energy beam 1304 in this way, for the covered wire, a prescribed cover portion thereof to which the energy beam was radiated was removed to form a cover-removed portion (an exposed wire portion) as shown in FIGS. 11(d) and 11(e). The length of the cover-removed portion was 1 mm.

As well as in the case of Example 6, the cover-removed angle β in the cross section of the cover-removed portion in FIG. 11(e) is an angle given by the normal line direction of the surface of the substrate and the bisector of the circular arc of the cover-removed portion viewed in said cross section. When the angle β in this example was measured, it was found to be in a range of −40° to 40°. In addition, the angle α (the cover-removed open angle) which the circular arc of the cover-removed portion viewed in the above cross section was 120°±30°.

Examination was conducted of the cover-removed portions by a X-ray diffractometer of SEM. As a result, the ratio of the characteristic X-ray quantity of the cover of the covered wire to that of the surface of the copper wire of the covered wire was found to be less than 0.1. Based on this, it was confirmed that the cover removal was desirably conducted.

Step 4:

A conductor 1305 was joined to the cover-removed portion of the covered wire [see, FIGS. 11(f) and 11(g)].

As the conductor 1305, there was used a copper foil whose surface is cladded with a 1 μm thick silver coat, having a thickness of 100 μm, a width of 6 mm and a length of 240 mm.

The joining was conducted by means of laser beam welding. Specifically as shown in FIGS. 11(f) and 11(g), the conductor (the copper foil) was putted on the cover-removed portion of the covered wire, where a prescribed pressure was added from above so that the conductor itself was also fixed to the substrate through the fixing member (the double-coated adhesive tape), then on the surface of the conductor, there was coated a black ink material capable of preventing reflection of laser beam for the laser beam welding, and thereafter, while adding a prescribed pressure from above by means of a pressing jig so that the cover-removed portion of the covered wire was loose-contacted with the conductor, YAG laser pulse beam 1307 was radiated to the intersection of the conductor with the covered wire to fuse the corresponding portion of the conductor and that of the covered wire, whereby a joining portion was formed between the covered wire and the conductor. The YAG laser beam radiated was 5 msec for the pulse width and 5 J for the energy. The radiation conditions of the YAG laser pulse beam were 5 J for the radiation energy, 5 msec for the pulse width, and about 1 mm for the radius of spot size.

In this step, because the covered wire was fixed to the substrate by means of the fixing member while maintaining the cover-removed angle β in a range of −40° to 40° so that the cover-removed portion of the covered wire was surely faced toward the conductor (the copper foil), it was possible to very easily and surely form the joining portion having a desirably small electric resistance between the wire of the covered wire and the conductor (the copper foil).

In this example, because the conductor (the copper foil) itself was fixed to the substrate through the double-coated adhesive tape (the fixing member), the joining portion could be easily formed.

Separately, a plurality of joining portions between a plurality of the covered wires and a plurality of the conductors examination in accordance with the method of this example, and the yield in this case was examined. As a result, it was found that satisfactory welding was performed in 99.99% of the joining portions.

Further, in this example, as above described, the foregoing double-coated adhesive tape was used as the fixing member. Because of this, in comparison with the conventional method in that the covered wire is fixed by winding it around the conductor, the bonding power of the interface between the fixing member and the covered wire became greater and in addition, the area of the interface was increased, where stable fixing could be readily attained. Further, because the double-coated adhesive tape was used as the fixing member, moderate and stable bonding power could be instantly attained for the interface between the covered wire and the fixing member. Further in addition, because the double-coated adhesive tape had a moderate elasticity, the bonded interface between the double-coated adhesive tape and the covered wire desirably absorbed a stress so that no peeling was occurred at the interface, although the covered wire was elongated due to the radiation of the energy beam. And the positional dislocation of the covered wire when the energy beam was radiated thereto was of a slight extent such that the cover-removing rate is not decreased.

As a result of having examined the energy absorptivity of the double-coated adhesive tape (used as the fixing member) for YAG laser beam, it was found to be 5%. Similarly, when the energy absorptivity of the cover of the covered wire was measured, it was found to be 80%. Thus the ratio of the energy absorptivity of the fixing member to that of the cover of the covered wire is 0.0625.

Because of this, only a prescribed cover portion of the cover of the covered wire can be selectively removed by the radiation of the laser beam without the fixing member being damaged by the laser beam. In this connection, it was possible to increase the intensity of the energy beam, and the residual ratio of the cover material remained without being removed upon the cover removal could be made to be less than 0.1% which is very small.

The constituents in this example are shown in Table 1 and the evaluated results in this example are shown in Table 2.

COMPARATIVE EXAMPLE 5

This comparative example is different from Example 6 with the point in that without fixing the covered wire on the substrate (the stainless steel plate) through the double-coated adhesive tape (the fixing member), the energy beam is radiated and the covered wire and the conductor are joined.

Figure 12:
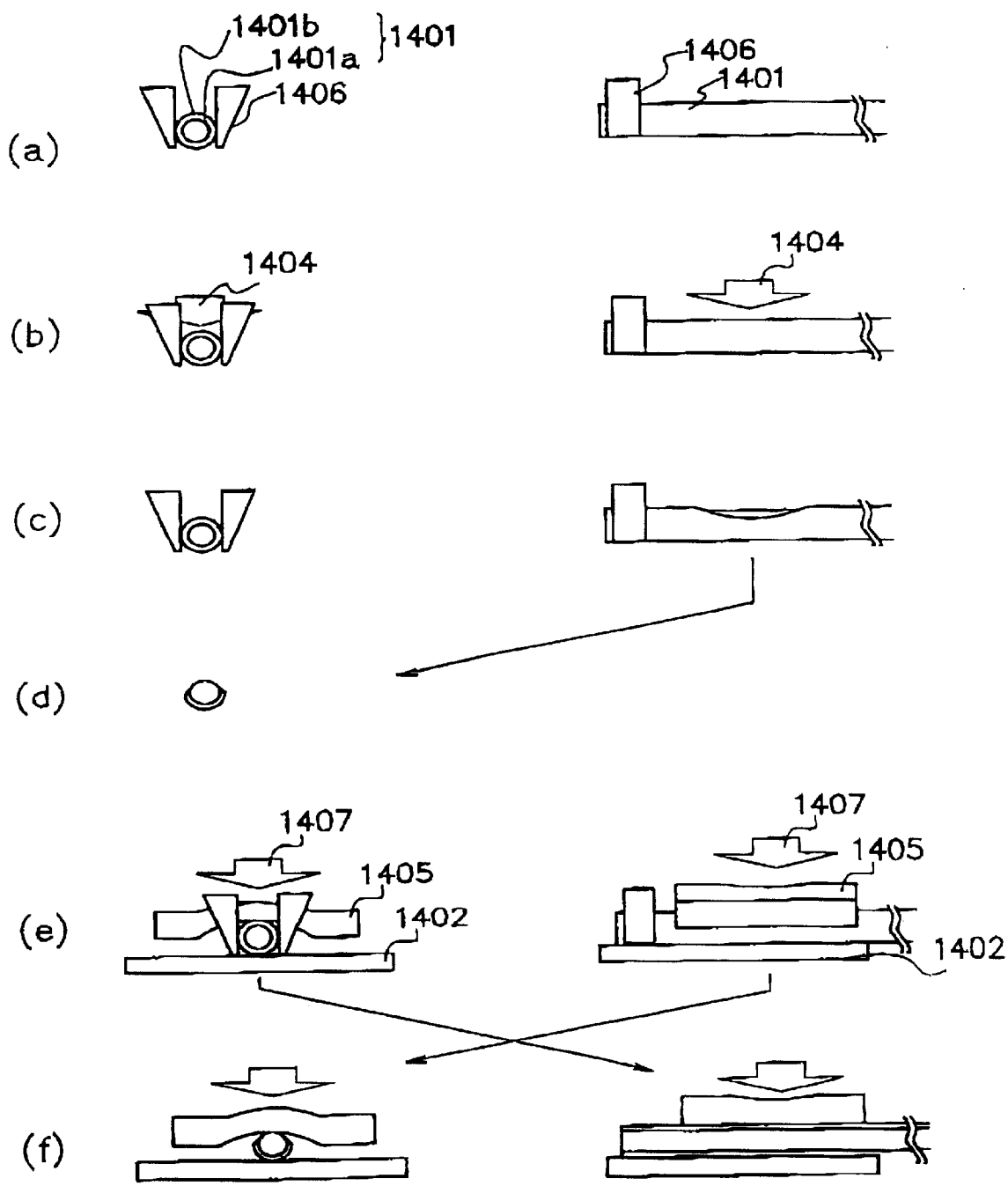
FIG. 12 is a schematic view for explaining another comparative method comprising a cover-removing a step of removing a cover portion of a covered wire and a step of joining said covered wire and a conductor (an electrode) in another comparative example which will be described later.

In FIG. 12, the steps of this comparative example are shown. In FIG. 12, reference numeral 1401 indicates a covered wire comprising a wire 1401a whose surface is covered by a cover 1401b. This covered wire is the same as that used in Example 19. Reference numeral 1402 indicates a substrate which is the same as that used in Example 19.

In the following, description will be made of the three steps which are different from Example 19.

Step 2;

The covered wire 1401 having a desired length was extended in the air by pinching its opposite end portion by clips 1406 as shown in FIG. 12(a).

Specifically, the covered wire 1401 was fixed by pinching the opposite end portions thereof by clips 1406, and it was wired in the air while supplying a tensile force thereon in the longitudinal direction.

Step 3:

The energy beam 1404 comprising the same YAG laser beam as in Example 19 was radiated to the covered wire which was wired in the above [see, FIG. 12(b)].

By the radiation of the energy beam 1404 in this way, for the covered wire, a cover portion thereof to which the energy beam was radiated was removed to form a cover-removed portion (an exposed wire portion) [see, FIGS. 12(c) and 12(d).

When the cover-removed angle β in this comparative example was measured, it was found to be in a range of −80° to 80°. In addition, the cover-removed open angle α was 110°±40°.

Examination was conducted of the cover-removed portions by a X-ray diffractometer of SEM. As a result, the ratio of the characteristic X-ray quantity of the cover of the covered wire to that of the surface of the copper wire of the covered wire was found to be less than 0.5.

In this comparative example, in comparison with Example 19, the positional fixation of the covered wire when the energy beam is radiated is insufficient.

Specifically, because the covered wire is merely retained in the air by pinching its opposite end portions by the clips, the positional freedom of the covered wire between the clips involved is great. In this connection, by virtue of the reaction upon the radiation of the energy beam, the covered wire escaped, wherein the cover removal became insufficient.

Because of this, in comparison with Example 19, the average of the α is narrower as being 110°, and the variation thereof is greater as being 40°. In addition, the residual ratio of the cover material remained without being removed upon the cover removal is 0.5% which is higher than the 0.1% in Example 19.

According to this, it is understood that the cover-removing method of the present invention is markedly advantageous.

Step 4:

After the cover removal, the covered wire was joined with the conductor 1405 [see, FIGS. 12(e) and 12(f)].

Specifically, by operating the clips 1406 so that the cover-removed portion of the covered wire which was formed by the radiation of the energy beam was positioned on the substrate. Then, an shown in FIGS. 12(e) and 12(i), from above, the conductor was pressed to the cover-removed portion of the covered wire, and the YAG laser beam 1407 was irradiated to the intersection between the covered wire and the conductor, whereby the covered wire and the conductor were joined.

In this comparative example, being different from Example 19, after the cover removal, the covered wire is fixed an the substrate, followed by connecting the conductor to the cover-removed portion of the covered wire. Because the covered wire is fixed to the substrate after the cover removal, the β is ±80° which is greater than the ±40° in example 19. This situation indicates that the cover-removed portion of the covered wire cannot be surely faced toward the conductor side upon connecting the conductor to the cover-removed portion and that it is difficult to connect the conductor to the wire of the covered wire. Because of this, in this comparative example, the yield in the joining step of joining the covered wire and the conductor was small as being 95.00%, which is smaller by 5.00% in comparison with that in Example 19.

Thus, it is understood that the method of connecting the covered wire with the conductor is markedly advantageous.

The constituents in this comparative example are shown in Table 1 and the evaluated results in this comparative example are shown in Table 2.

EXAMPLE 20

This example is different from Example 19 only with the point in that the fixing member comprises a mechanical fixing jig which is different from the double-coated adhesive tape used in Example 19.

Figure 13:
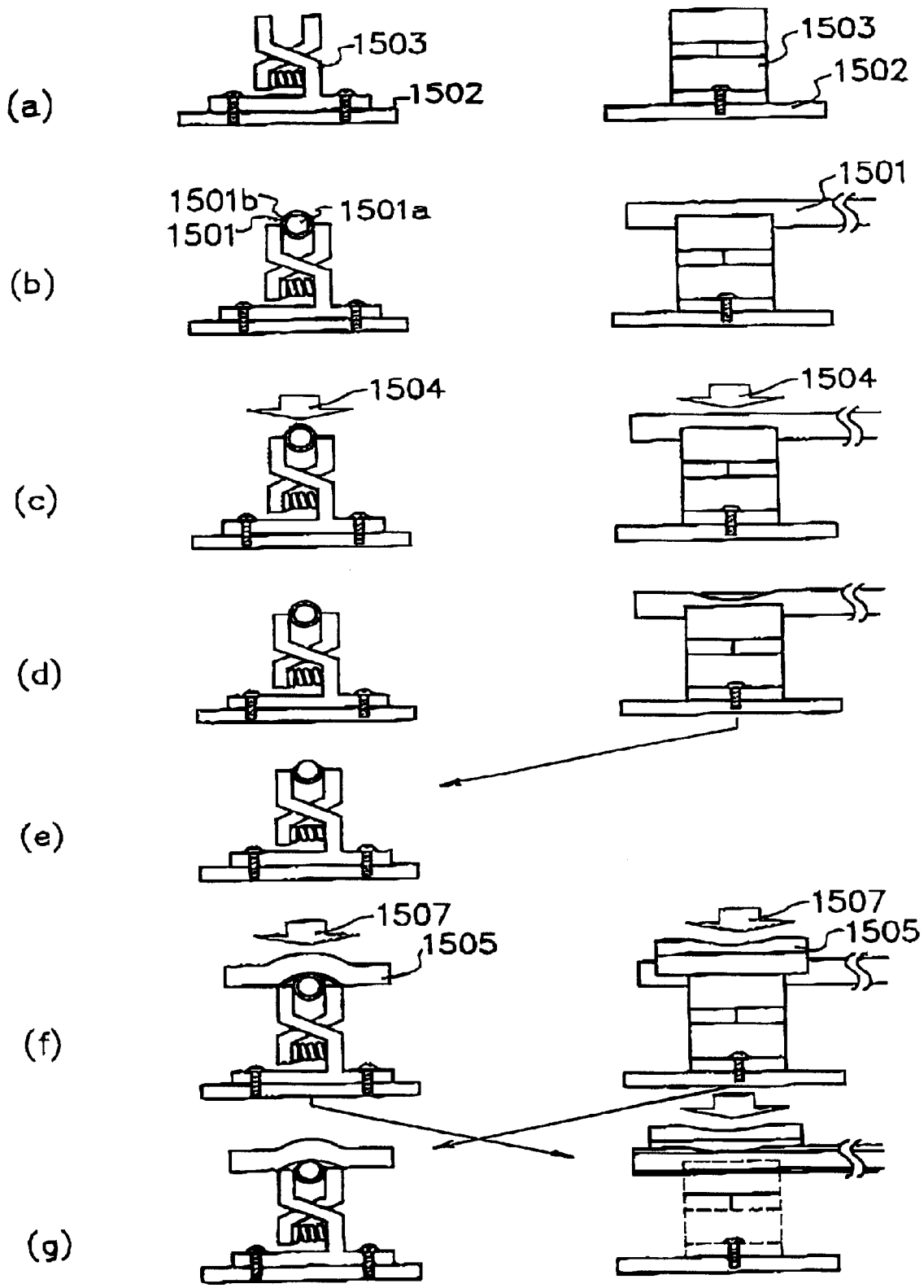
FIG. 13 is a schematic view for explaining a further method comprising a cover-removing a step of removing a cover portion of a covered wire and a step of joining said covered wire and a conductor (an electrode) in the present invention.

The steps in this example are shown in FIG. 13. In FIG. 13, reference numeral 1507 indicates the laser beam, reference numeral 1501 the covered wire, reference numeral 1501a the wire, and reference numeral 1501b the cover.

In this example, as shown in FIG. 13, a clip 1503 fixed on the substrate 1502 (the stainless steel plate) was used as the fixing member [see, FIG. 13(a)]. The pressure of the clip 1503 was 10 g/mm.

In this example, in comparison with Example 19, the fixation of the covered wire 1501 to the substrate 1502 was difficult [see, FIG. 13(b)]. In addition, during the radiation of the laser beam [see, FIG. 13(c)], there was an occasion in that the covered wire was slipped off from the fixing member. And the residual ratio of the cover material remained without being removed upon the cover removal was 0.2%, which is greater than that in Example 19. In addition, the yield in the joining step of joining the covered wire 1501 and the conductor 1505 [see, FIGS. 13(f) and 13(g)] was 98.99%, which is smaller by 1.00% in comparison with that in Example 19. However, this example is still effective.

In view of the results of this example, it is understood that the effect of using the double-coated adhesive tape as the fixing member is significant.

The constituents in this example are shown in Table 1 and the evaluated results in this example are shown in Table 2.

As detailed in the above, according to the present invention, such advantages as will be described below are provided.

It is possible to markedly improve the reliability of an electrode structure in which a covered wire is used. And for a photovoltaic element having an electrode structure of the present invention, even when a load is added thereto, it is possible to maintain the photoelectric conversion efficiency in a desirable state.

According to the cover-removing method for a covered wire in the present invention, it is possible to markedly diminish the residual cover material in comparison with the conventional cover-removing method.

According to the joining method of joining a covered wire and a conductor in the preset invention, it is possible to easily and surely attain joining with a low electric resistance. In addition, it is possible to easily and surely join a plurality of covered wires to one conductor at the same time. And it has a pronounced effect to desirably simplify the steps in the case of forming an electrode structure having a number of joining portions for the covered wires and the electrodes while improving the yield. The joining method of the present invention provides pronounces advantages particularly in the production of a solar cell having a plurality of covered wires and a plurality of bus bar electrode.

TABLE 1

|  | substrate | covered wire | core wire | cover | energy absorptivity (%) |
| --- | --- | --- | --- | --- | --- |
| Example 6 | amorphous photovoltaic element | electrically conductive cover | copper wire | carbon paste | 90 |
| Example 7 | amorphous photovoltaic element | electrically conductive cover | copper wire | carbon paste | 95 |
| Example 8 | amorphous photovoltaic element | electrically conductive cover | copper wire | carbon paste | 80 |
| Example 9 | amorphous photovoltaic element | electrically conductive cover | copper wire | carbon paste | 85 |
| Example 10 | amorphous photovoltaic element | electrically conductive cover | copper wire | carbon paste | 90 |
| Example 11 | amorphous photovoltaic element | electrically conductive cover | copper wire | carbon paste | 90 |
| Example 12 | amorphous photovoltaic element | electrically conductive cover | copper wire | Ag-paste | 50 |
| Example 13 | amorphous photovoltaic element | electrically conductive cover | copper wire | carbon paste | 90 |
| Example 14 | amorphous photovoltaic element | electrically conductive cover | copper wire | carbon paste | 90 |
| Example 15 | polycrystal photovoltaic element | electrically conductive cover | copper wire | carbon paste | 90 |
| Example 16 | amorphous photovoltaic element | electrically conductive cover | copper wire | carbon paste | 90 |
| Example 17 | amorphous photovoltaic element | electrically conductive cover | copper wire | carbon paste | 90 |
| Example 18 | amorphous photovoltaic element | electrically conductive cover | copper wire | carbon paste | 90 |
| Example 19 | mechanical fixing jig table | insulating cover | copper wire | enamel | 80 |
| Example 20 | mechanical fixing jig table | insulating cover | copper wire | enamel | 80 |
| Comparative Example 4 | amorphous photovoltaic element | electrically conductive cover | copper wire | carbon paste | 90 |
| Comparative Example 5 | mechanical fixing jig table | insulating cover | copper wire | enamel | 80 |

|  | fixing member | base member | adhesive material | energy absorptivity (%) |
| --- | --- | --- | --- | --- |
| Example 6 | adhesive tape | PET-polyimide member | acrylic adhesive | 5 |

TABLE 1-continued

| | | | | |
|---|---|---|---|---|
| Example 7 | adhensive tape | PET-polyimide member | acrylic adhensive | 10 |
| Example 8 | adhensive tape | PET-polyimide member | acrylic adhensive | 3 |
| Example 9 | adhensive tape | PET-polyimide member | acrylic adhensive | 7 |
| Example 10 | adhensive tape | PET-polyimide member | acrylic adhensive | 5 |
| Example 11 | adhensive tape | PET-polyimide member | acrylic adhensive | 5 |
| Example 12 | adhensive tape | PET-polyimide member | acrylic adhensive | 5 |
| Example 13 | adhensive tape | PET-polyimide member | acrylic adhensive | 5 |
| Example 14 | adhensive tape | PET-polyimide member | acrylic adhensive | 5 |
| Example 15 | adhensive tape | PET-polyimide member | acrylic adhensive | 5 |
| Example 16 | adhensive | none | epoxy adhensive | 5 |
| Example 17 | adhensive tape | PET-polyimide member | acrylic adhensive | 90 |
| Example 18 | adhensive tape | PET-polyimide member | acrylic adhensive | 5 |
| Example 19 | adhensive tape | PET-polyimide member | acrylic adhensive | 5 |
| Example 20 | mechanical fixing instrument | — | — | 1 |
| Comparative Example 4 | adhensive tape | PET-polyimide member | acrylic adhensive | 5 |
| Comparative Example 5 | wiring in the air | — | — | wiring in the air |

| | ratio of energy absorptivity | energy beam | conductor | fixing of conductor and substrate by means of fixing member | joining method |
|---|---|---|---|---|---|
| Example 6 | 0.0556 | YAG laser | copper foil | present | Ag-paste |
| Example 7 | 0.1053 | $CO_2$ laser | copper foil | present | Ag-paste |
| Example 8 | 0.0375 | semiconductor laser | copper foil | present | Ag-paste |
| Example 9 | 0.0824 | metalizing optical-condensation | copper foil | present | Ag-paste |
| Example 10 | 0.0556 | YAG laser | wire | present | Ag-paste |
| Example 11 | 0.0556 | YAG laser | copper foil | present | Ag-paste |
| Example 12 | 0.1 | YAG laser | copper foil | present | Ag-paste |
| Example 13 | 0.0556 | YAG laser | copper foil | present | solder |
| Example 14 | 0.0556 | YAG laser | copper foil | present | laser welding |
| Example 15 | 0.0556 | YAG laser | copper foil | present | Ag-paste |
| Example 16 | 0.0556 | YAG laser | copper foil | present | Ag-paste |
| Example 17 | 1 | YAG laser | copper foil | present | Ag-paste |
| Example 18 | 0.0556 | YAG laser | copper foil | none | Ag-paste |
| Example 19 | 0.0625 | YAG laser | terminal metal | present | laser welding |
| Example 20 | 0.0111 | YAG laser | terminal metal | present | laser welding |
| Comparative Example 4 | 0.0556 | YAG laser | copper foil | present | Ag-paste |
| Comparative Example 5 | wiring in the air | YAG laser | terminal metal | none | laser welding |

What is claimed is:

1. A photovoltaic element having a wire disposed on a surface of said photovoltaic element for outputting a power generated by said photovoltaic element and an electrode electrically joined with said wire while forming a joining portion, wherein said joining portion of said wire and said electrode has at least a first joining portion and a second joining portion which is adjacent to said first joining portion, and said second joining portion has an elasticity which is greater than that of said first joining portion, wherein said second joining portion comprises an electrically conductive resin material.

2. A photovoltaic element according to claim 1, wherein said first joining portion has a resistivity which is smaller than that of said second joining portion.

3. A photovoltaic element according to claim 1, wherein said first joining portion has a composition which is different from that of said second joining portion.

4. A photovoltaic element according to claim 1, wherein said first joining portion comprises a metallic material.

5. A photovoltaic element according to claim 4, wherein said metallic material comprises at least a material selected from the group consisting of Sn, Pb, Ag, Au, Ni, Zn, Cu, and alloys thereof.

6. A photovoltaic element according to claim 1, wherein said resin material contains at least a resin selected from the group consisting of urethane resin and butyral resin.

7. A photovoltaic element according to claim 4, wherein said resin material contains a coupling agent.

8. A photovoltaic element according to claim 1, wherein the wire is covered by a cover comprising an electrically conductive resin material, the wire is electrically connected with the surface of the photovoltaic element through said electrically conductive resin material of said cover, and a portion of said electrically conductive resin material which is situated between the wire and the electrode functions as the second joining portion.

9. A photovoltaic element according to claim 1, wherein the wire comprises a fine metal wire.

10. A photovoltaic element according to claim 1, wherein the electrode is a bus bar electrode.

11. A process for producing a photovoltaic element having a wire disposed on a surface of said photovoltaic element for outputting a power generated by said photovoltaic element, and an electrode electrically joined with said wire, characterized in that said process includes a step of forming at least two different joining portions having a different elasticity between said wire and said electrode, wherein one of said two different joining portions comprises an electrically conductive resin material.

12. A process for producing a photovoltaic element having a covered wire comprising a wire whose surface is covered by a cover which is disposed on a surface of said photovoltaic element for outputting a power generated by said photovoltaic element, and an electrode electrically joined with said covered wire, said process including the steps of:
(a) removing pat of said cover of said covered wire to form a cover-removed portion at said covered wire,
(b) fixing said covered wire on the surface of said photovoltaic element, and
(c) joining said covered wire and said electrode to form a first joining portion where said cover-removed portion of said covered wire is joined with said electrode and a second joining portion where said cover of said covered wire is joined with said electrode.

13. The process according to claim 12, wherein said step (b) is conducted before said step (a).

14. The process according to claim 12, wherein said second joining portion has an elasticity which is greater than that of said first joining portion.

15. The process according to claim 12, wherein said step (a) is conducted by radiating a laser beam to said part of said cover of said covered wire.

16. The process according to claim 15, wherein the direction for said laser beam to be radiated is adjusted by means of a rotary mirror or a rotary prism.

17. The process according to claim 15, wherein said laser beam comprises a YAG laser beam modulated by a Q-switch.

18. The process according to claim 12 which further includes a step of supplying a metallic material in said cover-removed portion.

19. The process according to claim 12, wherein said cover of said covered wire comprises an electrically conductive resin material.

20. The process according to claim 12, wherein said cover of said covered wire contains carbon black or graphite.

21. A method for removing a cover portion of a covered wire comprising a wire whose surface is covered by a cover, said method including the steps of:
(a) fixing at least part of said covered wire on a substrate through a fixing member which is arranged between said covered wire and said substrate, and
(b) radiating an energy beam to at least part of a cover portion of said covered wire which is situated on and fixed on the surface of said fixing member to remove said cover portion of said covered wire whereby forming a cover-removed portion of said covered wire.

22. The method according to claim 21, wherein said fixing member comprises an adhesive material.

23. The method according to clam 21, wherein said fixing member comprises a double-coated adhesive tape.

24. The method according to claim 21, wherein said fixing member has an energy absorptivity (i) against an energy of said energy beam, said cover of said covered wire has an energy absorptivity (ii) against said energy of said energy beam, and the ratio of said energy absorptivity (i) to said energy absorptivity (ii) is 0.0001 to 0.9999.

25. The method according to claim 21, wherein said substrate is a photovoltaic element, and said covered wire is a collecting electrode.

26. A method for joining a conductor and a covered wire comprising a wire whose surface is covered by a cover, said method including the steps of:
(a) fixing at least part of said covered wire on a substrate through a fixing member which is arranged between said covered wire and said substrate,
(b) radiating an energy beam to at least part of said covered wire to remove a portion of said cover of said covered wire to form a cover-removed portion at said covered wire, and
(c) joining said conductor with said cover-removed portion of said covered wire arid also with a portion of said cover of said covered wire which is adjacent to said cover-removed portion.

27. The method according to claim 26, wherein said fixing member comprises an adhesive material.

28. The method according to claim 26, wherein said fixing member comprises a double-coated adhesive tape.

29. The method according to claim 26, wherein said fixing member has an energy absorptivity (i) against an energy of said energy beam, said cover of said covered wire has an energy absorptivity (ii) against said energy of said energy beam, and the ratio of said energy absorptivity (i) to said energy absorptivity (ii) is 0.0001 to 0.9999.

30. The method according to claim 26, wherein said conductor is fixed to said substrate through said fixing member.

31. The method according to claim 26, wherein said covered wire comprises a plurality of covered wires comprising a wire whose surface is covered by a cover, said plurality of covered wires are fixed to said substrate through said fixing member, and said conductor is joined with said plurality of covered wires.

32. The method according to claim 26, wherein said substrate is a photovoltaic element, and said covered wire is a collecting electrode.

* * * * *

UNITED STATES PATENT AND TRADEMARK OFFICE
CERTIFICATE OF CORRECTION

PATENT NO. : 6,515,218 B1
DATED : February 4, 2003
INVENTOR(S) : Koichi Shimizu et al.

It is certified that error appears in the above-identified patent and that said Letters Patent is hereby corrected as shown below:

Column 4,
Line 20, "would" should read -- wound --.

Column 11,
Line 45, "potion" should read -- portion --.

Column 12,
Lines 26 and 53, "ad" should read -- and --.

Column 14,
Line 50, "tress" should read -- stress --.

Column 15,
Line 40, "electrioally" should read -- electrically --; and "joining" should read -- join --.

Column 16,
Line 23, "clue" should read -- due --.

Column 17,
Line 21, "off" should read -- of --; and
Line 32, "electrioally" should read -- electrically --.

Column 18,
Line 5, "ad" should read -- and --; and
Lines 39 and 41, "canning" should read -- scanning --.

Column 19,
Line 1, "cover" should read -- a --;

Column 20,
Line 47, "prior" should read -- prior art --; and
Line 58, "terns" should read -- terms --.

Column 21,
Lien 15, "wire" should read -- wire are urethane resin, acrylic resin, vinyl acetate, vinyl --;
Line 20, "hare" should read -- have --;
Line 22, "order" should read -- in order --;
Line 37, "were" should read -- wire --; and
Line 42, "al" should read -- a --.

UNITED STATES PATENT AND TRADEMARK OFFICE
CERTIFICATE OF CORRECTION

PATENT NO. : 6,515,218 B1
DATED : February 4, 2003
INVENTOR(S) : Koichi Shimizu et al.

It is certified that error appears in the above-identified patent and that said Letters Patent is hereby corrected as shown below:

Column 22,
Line 47, "crew," should read -- screws, --.

Column 23,
Line 40, "aeries" should read -- series --;
Line 47, "bit" should read -- exhibit --.

Column 24,
Line 53, "bean" should read -- beam --.

Column 25,
Line 27, "FIG. 16," should read -- In FIG. 16, --; and
Line 48, "[see, FIG. 16(g) and FIG. 16(g)]" should read -- [see, FIG. 16(f) and FIG. 16(g)] --.

Column 27,
Line 23, "A" should read -- As --; and
Line 40, "for" should read -- form --.

Column 28,
Line 4, "1022b" should read -- 1102b --; and
Line 6, "1002a" should read -- 1102a --.

Column 29,
Line 6, "which" should read -- with --; and
Line 43, "blow." should read -- below. --.

Column 30,
Line 14, "0-7" should read -- 0.7 --.

Column 35,
Line 7, "then," should read -- ¶ Then, --; and
Line 54, "of" should read -- 4 of --.

Column 39,
Line 41, "than" should read -- the --.

Column 40,
Line 3, "butral" should read -- butyral --.

UNITED STATES PATENT AND TRADEMARK OFFICE
CERTIFICATE OF CORRECTION

PATENT NO. : 6,515,218 B1
DATED : February 4, 2003
INVENTOR(S) : Koichi Shimizu et al.

It is certified that error appears in the above-identified patent and that said Letters Patent is hereby corrected as shown below:

Column 44,
Line 33, "FIG. 9(a)," should read -- FIG. 9(e), --.

Column 45,
Line 54, "introduce" should read -- introduced --.

Column 46,
Line 41, "ad" should read -- and --;
Line 53, "cured in" should read -- cured. In --.

Column 48,
Line 56, "filed" should read -- fixed --.

Column 50,
Line 2, "very." should read -- very small. --; and
Line 52, "potion" should read -- portion --.

Column 55,
Line 60, "Ag-past." should read -- Ag paste. --;
Line 61, "Ag-past," should read -- Ag paste, --.

Column 56,
Line 53, "thus" should read -- this --.

Column 57,
Line 4, "oil" should read -- on --;
Line 17, "interior" should read -- inferior --.

Column 59,
Line 19, "substrate" should read -- substrate 1302. --.

Column 62,
Line 14, "an" should read -- as --; and "12(i)," should read -- 12(f), --.

UNITED STATES PATENT AND TRADEMARK OFFICE
CERTIFICATE OF CORRECTION

PATENT NO.    : 6,515,218 B1
DATED         : February 4, 2003
INVENTOR(S)   : Koichi Shimizu et al.

It is certified that error appears in the above-identified patent and that said Letters Patent is hereby corrected as shown below:

Column 66,
Please insert TABLE 2 as follows:

Table 2

| | cover-removed angle ($\beta$) (°) | cover-removed open angle ($\alpha$) (°) | proportion of residual cover portion | photoelectric conversion efficiency | yield of joining process |
|---|---|---|---|---|---|
| Example 6 | more than −40 less than 40 | 120±30 | less than 0.1% | 10.0% | - |
| Example 7 | more than −40 less than 40 | 120±30 | less than 0.1% | 10.0% | - |
| Example 8 | more than −40 less than 40 | 120±30 | less than 0.1% | 10.0% | - |
| Example 9 | more than −40 less than 40 | 120±30 | less than 0.1% | 10.0% | - |
| Example 10 | more than −40 less than 40 | 120±30 | less than 0.1% | 10.0% | - |
| Example 11 | more than −40 less than 40 | 120±30 | less than 0.1% | 10.0% | - |
| Example 12 | more than −40 less than 40 | 120±30 | less than 0.1% | 10.0% | - |
| Example 13 | more than −40 less than 40 | 120±30 | less than 0.1% | 10.0% | - |
| Example 14 | more than −40 less than 40 | 120±30 | less than 0.1% | 10.0% | - |
| Example 15 | more than −40 less than 40 | 120±30 | less than 0.1% | 15.0% | - |
| Example 16 | more than −45 less than 45 | 120±30 | less than 0.2% | 9.8% | - |
| Example 17 | more than −45 less than 45 | 120±30 | less than 0.2% | 9.8% | - |
| Example 18 | more than −40 less than 40 | 120±30 | less than 0.1% | 9.8% | - |
| Example 19 | more than −40 less than 40 | 120±30 | less than 0.1% | - | 99.99% |
| Example 20 | more than −40 less than 40 | 120±30 | less than 0.2% | - | 99.89% |
| Comparative Example 4 | more than −90 less than 90 | 100±40 | less than 0.5% | 9.8% | - |
| Comparative Example 5 | more than −80 less than 80 | 110±40 | less than 0.5% | - | 95.00% |

UNITED STATES PATENT AND TRADEMARK OFFICE
CERTIFICATE OF CORRECTION

PATENT NO.    : 6,515,218 B1
DATED         : February 4, 2003
INVENTOR(S)   : Koichi Shimizu et al.

It is certified that error appears in the above-identified patent and that said Letters Patent is hereby corrected as shown below:

Column 67,
Line 4, "element" should read -- element, --; and
Line 56, "pat" should read -- part --.

Signed and Sealed this

Fourteenth Day of September, 2004

JON W. DUDAS
*Director of the United States Patent and Trademark Office*